US012782829B2

(12) United States Patent
Fu et al.

(10) Patent No.: US 12,782,829 B2
(45) Date of Patent: Nov. 3, 2026

(54) OVERLAY METROLOGY BASED ON TEMPLATE MATCHING WITH ADAPTIVE WEIGHTING

(71) Applicant: ASML NETHERLANDS B.V., Veldhoven (NL)

(72) Inventors: Jiyou Fu, San Jose, CA (US); Jing Su, Fremont, CA (US); Chenxi Lin, Fremont, CA (US); Jiao Liang, San Jose, CA (US); Guangqing Chen, Fremont, CA (US); Yi Zou, Foster City, CA (US)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

(21) Appl. No.: 18/714,547

(22) PCT Filed: Dec. 13, 2022

(86) PCT No.: PCT/EP2022/085673
§ 371 (c)(1),
(2) Date: May 29, 2024

(87) PCT Pub. No.: WO2023/110707
PCT Pub. Date: Jun. 22, 2023

(65) Prior Publication Data

US 2025/0044710 A1 Feb. 6, 2025

Related U.S. Application Data

(60) Provisional application No. 63/429,533, filed on Dec. 1, 2022, provisional application No. 63/338,142, filed
(Continued)

(51) Int. Cl.
*G03F 7/00* (2006.01)
*G03F 9/00* (2006.01)
(Continued)

(52) U.S. Cl.
CPC .... *G03F 7/706835* (2023.05); *G03F 7/70625* (2013.01); *G03F 7/70633* (2013.01);
(Continued)

(58) Field of Classification Search
CPC ........... G03F 7/706835; G03F 7/70625; G03F 7/70633; G03F 9/7092; G03F 7/70616;
(Continued)

(56) References Cited

U.S. PATENT DOCUMENTS 6,046,792 A 4/2000 Van Der Werf et al.
6,952,253 B2 10/2005 Lof et al.
(Continued)

FOREIGN PATENT DOCUMENTS

JP 2000216077 8/2000
JP 5173959 4/2013
(Continued)

OTHER PUBLICATIONS

International Search Report and Written Opinion issued in corresponding PCT Patent Application No. PCT/EP2022/085673, dated Mar. 28, 2023.
(Continued)

*Primary Examiner* — Hung V Nguyen
(74) *Attorney, Agent, or Firm* — Pillsbury Winthrop Shaw Pittman LLP

(57) ABSTRACT

A method of image template matching for multiple process layers of, for example, semiconductor substrate with an adaptive weight map is described. An image template is provided with a weight map, which is adaptively updated based during template matching based on the position of the image template on the image. A method of template matching a grouped pattern or artifacts in a composed template is described, wherein the pattern comprises deemphasized areas weighted less than the image templates. A method of
(Continued)

generating an image template based on a synthetic image is described. The synthetic image can be generated based on process and image modeling. A method of selecting a grouped pattern or artifacts and generating a composed template is described. A method of per layer image template matching is described.

21 Claims, 31 Drawing Sheets

Related U.S. Application Data on May 4, 2022, provisional application No. 63/291,278, filed on Dec. 17, 2021.

(51) Int. Cl.
*G06T 7/00* (2017.01)
*G06T 7/33* (2017.01)
*H10P 74/20* (2026.01)

(52) U.S. Cl.
CPC ............ *G03F 9/7092* (2013.01); *G06T 7/001* (2013.01); *G06T 7/337* (2017.01); *H10P 74/203* (2026.01); *G06T 2207/30148* (2013.01)

(58) Field of Classification Search
CPC ..................... G06T 7/001; G06T 7/337; G06T 2207/30148; G06T 2207/10061; G06T 7/30; H01L 22/12; H01J 2237/221; H01J 2237/24592
See application file for complete search history.

(56) References Cited

U.S. PATENT DOCUMENTS

| | | | | |
|---|---|---|---|---|
| 7,676,078 | B2 * | 3/2010 | Fukuhara | G03F 7/70591 430/311 |
| 8,148,682 | B2 * | 4/2012 | Hotta | G03F 7/70466 345/441 |
| 8,363,923 | B2 | 1/2013 | Toyoda et al. | |
| 8,515,155 | B2 | 8/2013 | Toyoda et al. | |
| 8,655,050 | B2 | 2/2014 | Toyoda et al. | |
| 8,953,894 | B2 | 2/2015 | Sato et al. | |
| 9,141,879 | B2 | 9/2015 | Ushiba et al. | |
| 9,244,365 | B2 | 1/2016 | Okamoto et al. | |
| 9,341,584 | B2 | 5/2016 | Nakahira et al. | |
| 9,536,170 | B2 | 1/2017 | Ohashi et al. | |
| 9,977,342 | B2 | 5/2018 | Yao | |
| 10,254,236 | B2 | 4/2019 | Shim et al. | |
| 10,276,459 | B2 | 4/2019 | Konomi et al. | |
| 10,996,569 | B2 | 5/2021 | Takagi et al. | |
| 2002/0062204 | A1 | 5/2002 | Nakajima | |
| 2004/0150824 | A1 | 8/2004 | Matsumoto | |
| 2009/0202139 | A1 | 8/2009 | Toyoda et al. | |
| 2010/0208935 | A1 * | 8/2010 | Arnz | G03F 7/70633 430/30 |
| 2012/0087568 | A1 | 4/2012 | Stellari | |
| 2014/0016854 | A1 | 1/2014 | Nagatomo et al. | |
| 2014/0285652 | A1 | 9/2014 | Okamoto et al. | |
| 2014/0375793 | A1 | 12/2014 | Harada et al. | |
| 2016/0056014 | A1 | 2/2016 | Yamamoto et al. | |
| 2016/0161863 | A1 | 6/2016 | Den Boef et al. | |
| 2016/0370717 | A1 | 12/2016 | Den Boef et al. | |
| 2017/0109607 | A1 * | 4/2017 | Nagatomo | G06T 7/74 |
| 2017/0192363 | A1 | 7/2017 | Yao | |
| 2018/0238816 | A1 | 8/2018 | Sousa et al. | |
| 2018/0269116 | A1 | 9/2018 | Konomi et al. | |
| 2020/0018944 | A1 | 1/2020 | Fang et al. | |
| 2020/0365365 | A1 | 11/2020 | Yamamoto | |
| 2021/0055098 | A1 | 2/2021 | Yamaki et al. | |
| 2021/0350507 | A1 | 11/2021 | Fang et al. | |
| 2022/0138983 | A1 | 5/2022 | Godo et al. | |

FOREIGN PATENT DOCUMENTS

| | | |
|---|---|---|
| JP | 2015099054 | 5/2015 |
| JP | 5857106 | 2/2016 |
| JP | H6151274 | 6/2017 |
| JP | R7056183 | 4/2022 |
| KR | VVF101269889 | 5/2013 |
| KR | UUR 10-2016-0044131 | 4/2016 |
| WO | WW2021/038764 | 3/2021 |
| WO | XXR2021/160436 | 8/2021 |

OTHER PUBLICATIONS

Anonymous, "Template Generation and Matching with Adaptive Weighting," Research Disclosure, vol. 696, No. 33, pp. 1-50 (Mar. 2022).
"Template Matching" at docs.opencv.org/4.5.2/d4/dc6/tutorial_py_template_matching.html, pp. 1-3 (Printed Apr. 2, 2021).
Anonymous, "Image Analysis Based on Adaptive Weighting of Template Contours," Research Disclosure, vol. 696, No. 48, pp. 1-48 (Mar. 2022).
O. Inoue et al., "Review of scanning electron microscope-based overlay measurement beyond 3-nm node device", J. Micro/Nanolith., MEMS MOEMS, vol. 18, No. 2, pp. 1-15 (2019).

* cited by examiner

OVERLAY METROLOGY BASED ON TEMPLATE MATCHING WITH ADAPTIVE WEIGHTING

CROSS-REFERENCE TO RELATED APPLICATIONS

This application is the U.S. national phase entry of PCT Patent Application No. PCT/EP2022/085673 which was filed on Dec. 13, 2022, which claims priority of U.S. Provisional Patent Application No. 63/291,278 which was filed on Dec. 17, 2021 and of U.S. Provisional Patent Application No. 63/338,142 which was filed on May 4, 2022 and of U.S. Provisional Patent Application No. 63/429,533 which was filed on Dec. 1, 2022 and are incorporated herein in their entireties by reference.

TECHNICAL FIELD

The present disclosure relates generally to image analysis using an image reference approach and more specifically to template matching with adaptive weighting.

BACKGROUND

Manufacturing semiconductor devices, such as integrated circuits, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process typically will include a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

Lithography is a central step in the manufacturing of device such as ICs, where patterns formed on substrates define functional elements of the devices, such as microprocessors, memory chips, etc. Similar lithographic techniques are also used in the formation of flat panel displays, micro-electromechanical systems (MEMS) and other devices.

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Lithographic steps are monitored, both during high volume manufacturing for process control reasons and during process certification. Lithographic steps are monitored generally by measurements of products produced by the lithographic steps. Images of devices produces by various processes are often compared to each other or "gold standard" images in order to monitor processes, detect defects, detect process changes, etc. Better control of lithographic steps generally corresponds to better and more profitable device fabrication.

As semiconductor manufacturing processes continue to advance, the dimensions of functional elements have continually been reduced. At the same time, the number of functional elements, such as transistors, per device has been steadily increasing, following a trend commonly referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e., less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, source mask optimization (SMO), or other methods generally defined as "resolution enhancement techniques" (RET). The term "projection optics" as used herein should be broadly interpreted as encompassing various types of optical systems, including refractive optics, reflective optics, apertures and catadioptric optics, for example.

SUMMARY

A method of image template matching with an adaptive weight map is described. According to embodiments of the present disclosure, matching of an image template to an image of a measurement structure can be improved by applying a weight map to the image template to selectively deemphasize or emphasize certain areas of the image template or the image of the measurement structure. Matching can further comprise updating and/or adapting the weight map as a function of the position of the image template on the weight map. As the image template is matched to various positions on the image of the measurement structure, an adapted weight map accounts for areas of the image template which are blocked or otherwise less suitable for matching. Based on selectively and adaptively weighting the image template, image template matching can be advantageously improved.

Template matching can be applied to determine size or position of features during fabrication, where feature location, shape, size, and alignment knowledge is useful for process control, quality assessment, etc. Template matching for features of multiple layers can be used to determine or measure overlay (e.g., layer-to-layer shift), and can be used with multiple overlay metrology apparatuses. Template matching can also be used to determine distances between features and contours of features, which may be in the same or different layers, and can be used to determine edge placement (EP), edge placement error (EPE), and/or critical dimension (CD) with various types of metrologies.

A method of image template matching based on a composed template is described. A "composed template" herein after refers to a template composed of constituent image templates, such as multiple (of the same or different) patterns selected using a grouping process based on certain criteria and grouped together in one template, where at least one deemphasize area fills in the field of the composite template between any two of the constituent patterns. The grouping process may be performed manually or automatically. A composed template can be composed of multiple templates that each include one or multiple patterns, or of a single template that includes multiple patterns. According to embodiments of the present disclosure, matching of a composed template to an image of a measurement structure can be improved by applying a weight map to the composed template to emphasize and deemphasize certain areas of the pattern image template. Especially for a non-repeating pattern on an image, multiple patterns and a relationship between the patterns can be selected (such as in a composed template) to improve robustness of matching. For example, the selection may be based on image analysis, pattern analysis, and/or pattern grouping based on certain metrics, e.g., metrics regarding image quality or noise. In some embodiments, deemphasized areas on the pattern can be excluded or deemphasized during matching. Matching can further comprise updating and/or adapting the weight map of the pattern as a function of the position of the composed template on the weight map. Based on selectively choosing patterns to include in the composed template, composed template matching can be advantageously improved.

A method of generating a synthetic image template based on simulated or synthetic data is described. According to embodiments of the present disclosure, information about a layer of the measurement structure can be used to generate an image template. A computational lithography model, one or more process models, such as a deposition model, etch model, CMP (chemical mechanical polishing) model, etc. can be used to generate a synthetic image template or contour based on GDS or other information about the layer of the measurement structure. A scanning electron microscopy model can be used to refine the synthetic template. Additional method of producing, refining, or updating the synthetic image template are described. The synthetic image template can include a weight map and/or pixel values, and a polarity value. The synthetic image template is then matched to a test image for the measurement structure. Matching can further comprise updating and/or adapting the weight map of the image template as a function of the position of the pattern of image template on the weight map. Based on selectively choosing features and/or synthetic generation processes to include in the synthetic image templates, synthetic image template matching can be advantageously improved.

A method of generating a composed template based on image data is described. According to embodiments of the present disclosure, information about a layer of the measurement structure can be used to generate a composed template. The composed template can be based on acquired images (i.e., acquired from imaging tools), obtained images (i.e., obtained from stored data), and/or synthetic or modeled images. A lithography model, process tool models, or metrology tool image simulation model, such as a Tachyon model, etch model, and/or scanning electron microscopy model, can be used to generate a synthetic image or contour for the composed template. Multiple obtained images or averages of images can be used to generate the composed template, such as based on contrast and stability of the obtained images. The composed templates can include a weight map and/or pixel values. The composed template is then matched to a test image for the measurement structure. Matching can further comprise matching based on the weight map and, optionally, adapting the weight map of the patterns as a function of the position of composed template on the weight map. Based on selectively choosing patterns to include in the composed template, matching can be advantageously improved for non-periodic patterns.

A method of per layer image template matching is described. According to embodiments of the present disclosure, a template can be generated based on information about a layer of a multi-layer structure. The template can be matched to an image of the multi-layer structure, including by using adaptive weight mapping. Per layer image template matching can be used to identify a region of interest in an image, perform image quality enhancement, and segment the image. A composite template can also be generated from multiple templates corresponding to one layer of the multi-layer structure.

A method of selecting a template of a particular size for template matching is described. According to the embodiments of the present disclosure, templates of varying sizes are generated for a feature (e.g., for a feature in a via layer) in an image. Template matching is performed using each template size and an optimal template size is selected based on a performance indicator associated with the template matching. The optimal template size may then be used to determine a position of the feature in the image, which may further be used in various applications, including determining a measure of overlay with other features. The performance indicator may be any attribute that is indicative of a degree of match between the feature in the image and the template. For example, the performance indicator may include a similarity indicator that is indicative of a similarity between the feature in the image and the template.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
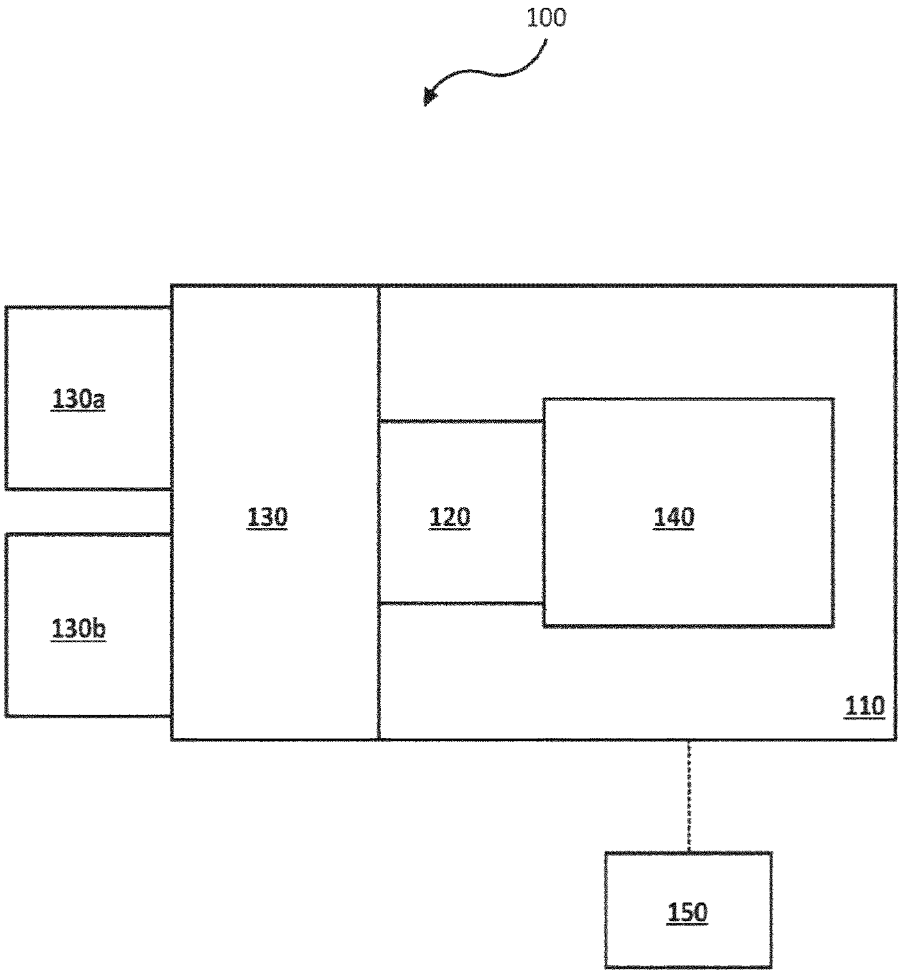
FIG. 1 is a schematic diagram illustrating an exemplary electron beam inspection (EBI) system, according to an embodiment.

Embodiments of the present disclosure are described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms “reticle”, “wafer” or “die” in this text should be considered as interchangeable with the more general terms “mask”, “substrate” and “target portion”, respectively.

In the present document, the terms “radiation” and “beam” are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range of about 5-100 nm).

A (e.g., semiconductor) patterning device can comprise, or can form, one or more patterns. The pattern can be generated utilizing CAD (computer-aided design) programs, based on a pattern or design layout, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. The design rules may include and/or specify specific parameters, limits on and/or ranges for parameters, and/or other information. One or more of the design rule limitations and/or parameters may be referred to as a "critical dimension" (CD). A critical dimension of a device can be defined as the smallest width of a line or hole or the smallest space between two lines or two holes, or other features. Thus, the CD determines the overall size and density of the designed device. One of the goals in device fabrication is to faithfully reproduce the original design intent on the substrate (via the patterning device).

The term "mask" or "patterning device" as employed in this text may be broadly interpreted as referring to a generic semiconductor patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

As used herein, the term "patterning process" generally means a process that creates an etched substrate by the application of specified patterns of light as part of a lithography process. However, "patterning process" can also include (e.g., plasma) etching, as many of the features described herein can provide benefits to forming printed patterns using etch (e.g., plasma) processing.

As used herein, the term "pattern" means an idealized pattern that is to be etched on a substrate (e.g., wafer)—e.g., based on the design layout described above. A pattern may comprise, for example, various shape(s), arrangement(s) of features, contour(s), etc.

As used herein, a "printed pattern" means the physical pattern on a substrate that was etched based on a target pattern. The printed pattern can include, for example, troughs, channels, depressions, edges, or other two- and three-dimensional features resulting from a lithography process.

As used herein, the term "prediction model", "process model", "electronic model", and/or "simulation model" (which may be used interchangeably) means a model that includes one or more models that simulate a patterning process. For example, a model can include an optical model (e.g., that models a lens system/projection system used to deliver light in a lithography process and may include modelling the final optical image of light that goes onto a photoresist), a resist model (e.g., that models physical effects of the resist, such as chemical effects due to the light), an OPC model (e.g., that can be used to make target patterns and may include sub-resolution resist features (SRAFs), etc.), an etch (or etch bias) model (e.g., that simulates the physical effects of an etching process on a printed wafer pattern), a source mask optimization (SMO) model, and/or other models.

As used herein, the term "calibrating" means to modify (e.g., improve or tune) and/or validate a model, an algorithm, and/or other components of a present system and/or method.

A patterning system may be a system comprising any or all of the components described above, plus other components configured to performing any or all of the operations associated with these components. A patterning system may include a lithographic projection apparatus, a scanner, systems configured to apply and/or remove resist, etching systems, and/or other systems, for example.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 110, a load-lock chamber 120, an electron beam tool 140, and an equipment front end module (EFEM) 130. Electron beam tool 140 is located within main chamber 110. While the description and drawings are directed to an electron beam, it is appreciated that the embodiments are not used to limit the present disclosure to specific charged particles.

EFEM 130 includes a first loading port 130*a* and a second loading port 130*b*. EFEM 130 may include additional loading port(s). First loading port 130*a* and second loading port 130*b* receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 130 transport the wafers to load-lock chamber 120.

Load-lock chamber 120 is connected to a load/lock vacuum pump system (not shown), which removes gas molecules in load-lock chamber 120 to reach a first pressure below the atmospheric pressure. After reaching the first pressure, one or more robot arms (not shown) transport the wafer from load-lock chamber 120 to main chamber 110. Main chamber 110 is connected to a main chamber vacuum pump system (not shown), which removes gas molecules in main chamber 110 to reach a second pressure below the first pressure. After reaching the second pressure, the wafer is subject to inspection by electron beam tool 140. In some embodiments, electron beam tool 140 may comprise a single-beam inspection tool.

Controller 150 may be electronically connected to electron beam tool 140 and may be electronically connected to other components as well. Controller 150 may be a computer configured to execute various controls of charged particle beam inspection system 100. Controller 150 may also include processing circuitry configured to execute various signal and image processing functions. While controller 150 is shown in FIG. 1 as being outside of the structure that includes main chamber 110, load-lock chamber 120, and EFEM 130, it is appreciated that controller 150 can be part of the structure.

While the present disclosure provides examples of main chamber 110 housing an electron beam inspection system, it should be noted that aspects of the disclosure in their broadest sense, are not limited to a chamber housing an electron beam inspection system. Rather, it is appreciated that the foregoing principles may be applied to other chambers as well, such as a chamber of a deep ultraviolet (DUV) lithography or an extreme ultraviolet (EUV) lithography system.

Figure 2:
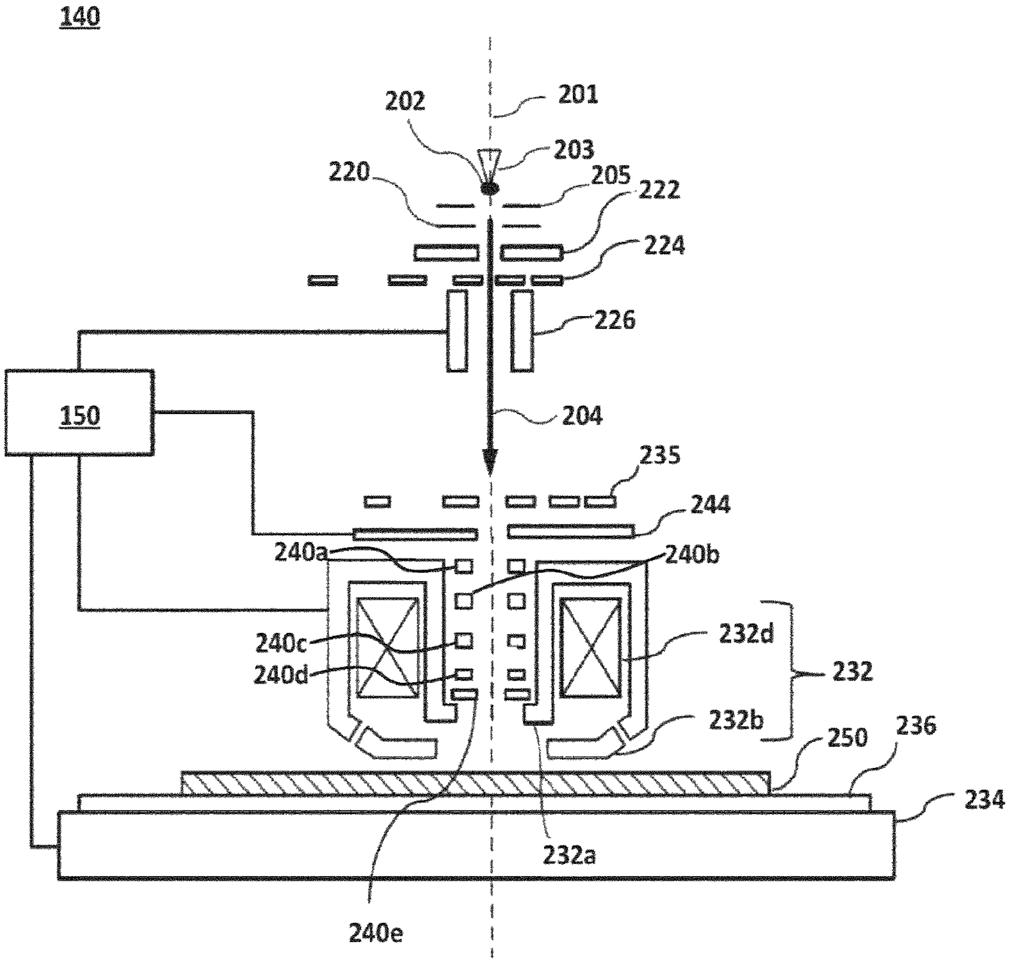
FIG. 2 is a schematic diagram illustrating an exemplary electron beam tool that can be a part of the exemplary electron beam inspection system of FIG. 1, according to an embodiment.

Reference is now made to FIG. 2, which illustrates a schematic diagram illustrating an exemplary configuration of electron beam tool 140 that can be a part of the exemplary charged particle beam inspection system 100 of FIG. 1, consistent with embodiments of the present disclosure. Electron beam tool 140 (also referred to herein as apparatus 140) may comprise an electron emitter, which may comprise a cathode 203, an extractor electrode 205, a gun aperture 220, and an anode 222. Electron beam tool 140 may further include a Coulomb aperture array 224, a condenser lens 226, a beam-limiting aperture array 235, an objective lens assembly 232, and an electron detector 244. Electron beam tool 140 may further include a sample holder 236 supported by motorized stage 234 to hold a sample 250 to be inspected. It is to be appreciated that other relevant components may be added or omitted, as needed.

In some embodiments, an electron emitter may include cathode 203 and anode 222, wherein primary electrons can be emitted from the cathode and extracted or accelerated to form a primary electron beam 204 that forms a primary beam crossover 202. Primary electron beam 204 can be visualized as being emitted from primary beam crossover 202.

In some embodiments, the electron emitter, condenser lens 226, objective lens assembly 232, beam-limiting aperture array 235, and electron detector 244 may be aligned with a primary optical axis 201 of apparatus 40. In some embodiments, electron detector 244 may be placed off primary optical axis 201, along a secondary optical axis (not shown).

Objective lens assembly 232, in some embodiments, may comprise a modified swing objective retarding immersion lens (SORIL), which includes a pole piece 232*a*, a control electrode 232*b*, a beam manipulator assembly comprising deflectors 240*a*, 240*b*, 240*d*, and 240*e*, and an exciting coil 232*d*. In a general imaging process, primary electron beam 204 emanating from the tip of cathode 203 is accelerated by an accelerating voltage applied to anode 222. A portion of primary electron beam 204 passes through gun aperture 220, and an aperture of Coulomb aperture array 224, and is focused by condenser lens 226 so as to fully or partially pass through an aperture of beam-limiting aperture array 235. The electrons passing through the aperture of beam-limiting aperture array 235 may be focused to form a probe spot on the surface of sample 250 by the modified SORIL lens and deflected to scan the surface of sample 250 by one or more deflectors of the beam manipulator assembly. Secondary electrons emanated from the sample surface may be collected by electron detector 244 to form an image of the scanned area of interest.

In objective lens assembly 232, exciting coil 232*d* and pole piece 232*a* may generate a magnetic field. A part of sample 250 being scanned by primary electron beam 204 can be immersed in the magnetic field and can be electrically charged, which, in turn, creates an electric field. The electric field may reduce the energy of impinging primary electron beam 204 near and on the surface of sample 250. Control electrode 232*b*, being electrically isolated from pole piece 232*a*, may control, for example, an electric field above and on sample 250 to reduce aberrations of objective lens assembly 232, to adjust the focusing of signal electron beams for high detection efficiency, or to avoid arcing to protect the sample. One or more deflectors of the beam manipulator assembly may deflect primary electron beam 204 to facilitate beam scanning on sample 250. For example, in a scanning process, deflectors 240*a*, 240*b*, 240*d*, and 240*e* can be controlled to deflect primary electron beam 204, onto different locations of top surface of sample 250 at different time points, to provide data for image reconstruction for different parts of sample 250. It is noted that the order of 240*a-e* may be different in different embodiments.

Backscattered electrons (BSEs) and secondary electrons (SEs) can be emitted from the part of sample 250 upon receiving primary electron beam 204. A beam separator 240*c* can direct the secondary or scattered electron beam(s), comprising backscattered and secondary electrons, to a sensor surface of electron detector 244. The detected secondary electron beams can form corresponding beam spots on the sensor surface of electron detector 244. Electron detector 244 can generate signals (e.g., voltages, currents) that represent the intensities of the received secondary electron beam spots, and provide the signals to a processing system, such as controller 150. The intensity of secondary or backscattered electron beams, and the resultant secondary electron beam spots, can vary according to the external or internal structure of sample 250. Moreover, as discussed above, primary electron beam 204 can be deflected onto different locations of the top surface of sample 250 to generate secondary or scattered electron beams (and the resultant beam spots) of different intensities. Therefore, by mapping the intensities of the secondary electron beam spots with the locations of sample 250, the processing system can reconstruct an image that reflects the internal or external structures of sample 250, which can comprise a wafer sample.

In some embodiments, controller 150 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detector 244 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detector 244 and may construct an image. The image acquirer may thus acquire images of regions of sample 250. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, controller 150 may include measurement circuitries (e.g., analog-to-digital converters) to obtain a distribution of the detected secondary electrons and backscattered electrons. The electron distribution data collected during a detection time window, in combination with corresponding scan path data of a primary electron beam 204 incident on the sample (e.g., a wafer) surface, can be used to reconstruct images of the wafer structures under inspection. The reconstructed images can be used to reveal various features of the internal or external structures of sample 250, and thereby can be used to reveal any defects that may exist in the wafer.

In some embodiments, controller 150 may control motorized stage 234 to move sample 250 during inspection. In some embodiments, controller 150 may enable motorized stage 234 to move sample 250 in a direction continuously at a constant speed. In other embodiments, controller 150 may enable motorized stage 234 to change the speed of the movement of sample 250 over time depending on the steps of scanning process.

As is commonly known in the art, interaction of charged particles, such as electrons of a primary electron beam with a sample (e.g., sample 315 of FIG. 3, discussed later), may generate signal electrons containing compositional and topographical information about the probed regions of the sample. Secondary electrons (SEs) may be identified as signal electrons with low emission energies, and backscattered electrons (BSEs) may be identified as signal electrons with high emission energies. Because of their low emission energy, an objective lens assembly may direct the SEs along electron paths and focus the SEs on a detection surface of in-lens electron detector placed inside the SEM column. BSEs traveling along electron paths may be detected by the in-lens electron detector as well. In some cases, BSEs with large emission angles, however, may be detected using additional electron detectors, such as a backscattered electron detector, or remain undetected, resulting in loss of sample information needed to inspect a sample or measure critical dimensions.

Detection and inspection of some defects in semiconductor fabrication processes, such as buried particles during photolithography, metal deposition, dry etching, or wet etching, among others, may benefit from inspection of surface features as well as compositional analysis of the defect particle. In such scenarios, information obtained from secondary electron detectors and backscattered electron detectors to identify the defect(s), analyze the composition of the defect(s), and adjust process parameters based on the obtained information, among others, may be desirable for a user.

The emission of SEs and BSEs obeys Lambert's law and has a large energy spread. SEs and BSEs are generated upon interaction of primary electron beam with the sample, from different depths of the sample and have different emission energies. For example, secondary electrons originate from the surface and may have an emission energy ≤50 eV, depending on the sample material, or volume of interaction, among others. SEs are useful in providing information about surface features or surface geometries. BSEs, on the other hand, are generated by predominantly elastic scattering events of the incident electrons of the primary electron beam and typically have higher emission energies in comparison to SEs, in a range from 50 eV to approximately the landing energy of the incident electrons, and provide compositional and contrast information of the material being inspected. The number of BSEs generated may depend on factors including, but are not limited to, atomic number of the material in the sample, acceleration voltage of primary electron beam, among others.

Based on the difference in emission energy, or emission angle, among others, SEs and BSEs may be separately detected using separate electron detectors, segmented electron detectors, energy filters, and the like. For example, an in-lens electron detector may be configured as a segmented detector comprising multiple segments arranged in a two-dimensional or a three-dimensional arrangement. In some cases, the segments of in-lens electron detector may be arranged radially, circumferentially, or azimuthally around a primary optical axis (e.g., primary optical axis 300-1 of FIG. 3).

Figure 3:
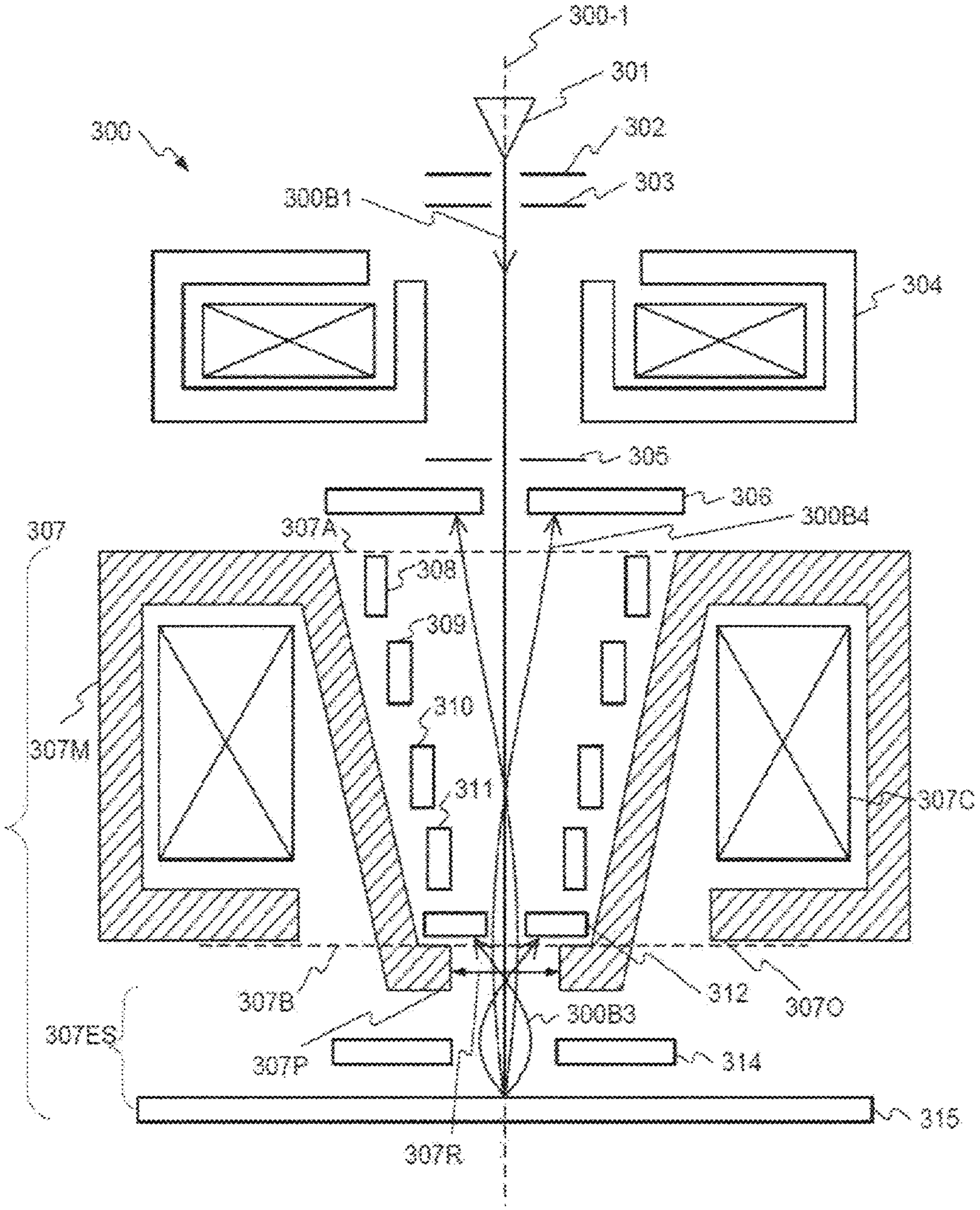
FIG. 3 is a schematic diagram of an exemplary charged-particle beam apparatus comprising a charged-particle detector, according to an embodiment.

Reference is now made to FIG. 3, which illustrates a schematic diagram of an exemplary charged-particle beam apparatus 300 (also referred to as apparatus 300), consistent with embodiments of the present disclosure. Apparatus 300 can be a part of the exemplary electron beam tool of FIG. 2 and/or a part of the exemplary charge particle beam inspection system 100 of FIG. 1. Apparatus 300 may comprise a charged-particle source such as, an electron source configured to emit primary electrons from a cathode 301 and extracted using an extractor electrode 302 to form a primary electron beam 300B1 along a primary optical axis 300-1. Apparatus 300 may further comprise an anode 303, a condenser lens 304, a beam-limiting aperture array 305, signal electron detectors 306 and 312, a compound objective lens 307, a scanning deflection unit comprising primary electron beam deflectors 308, 309, 310, and 311, and a control electrode 314. In the context of this disclosure, one or both of signal electron detectors 306 and 312 may be in-lens electron detectors located inside the electron-optical column of a SEM and may be arranged rotationally symmetric around primary optical axis 300-1. In some embodiments, signal electron detector 312 may be referred to as a first electron detector, and signal electron detector 306 may be referred to as through-the-lens detector, immersion lens detector, upper detector, or second electron detector. It is to be appreciated that relevant components may be added, omitted, or reordered, as appropriate.

An electron source (not shown) may include a thermionic source configured to emit electrons upon being supplied thermal energy to overcome the work function of the source, a field emission source configured to emit electrons upon being exposed to a large electrostatic field, etc. In the case of a field emission source, the electron source may be electrically connected to a controller, such as controller 150 of FIG. 1, configured to apply and adjust a voltage signal based on a desired landing energy, sample analysis, source characteristics, among others. Extractor electrode 302 may be configured to extract or accelerate electrons emitted from a field emission gun, for example, to form primary electron beam 300B1 that forms a virtual or a real primary beam crossover (not illustrated) along primary optical axis 300-1. Primary electron beam 300B1 may be visualized as being emitted from the primary beam crossover. In some embodiments, the controller may be configured to apply and adjust a voltage signal to extractor electrode 302 to extract or accelerate electrons generated from electron source. An amplitude of the voltage signal applied to extractor electrode 302 may be different from the amplitude of the voltage signal applied to cathode 301. In some embodiments, the difference between the amplitudes of the voltage signal applied to extractor electrode 302 and to cathode 301 may be configured to accelerate the electrons downstream along primary optical axis 300-1 while maintaining the stability of the electron source. As used in the context of this disclosure, "downstream" refers to a direction along the path of primary electron beam 300B1 starting from the electron source towards sample 315. With reference to positioning of an element of a charged-particle beam apparatus (e.g., apparatus 300 of FIG. 3), "downstream" may refer to a position of an element located below or after another element, along the path of primary electron beam starting from the electron source, and "immediately downstream" refers to a position of a second element below or after a first element along the path of primary electron beam 300B1 such that there are no other active elements between the first and the second element. For example, as illustrated in FIG. 3, signal electron detector 306 may be positioned immediately downstream of beam-limiting aperture array 305 such that there are no other optical or electron-optical elements placed between beam-limiting aperture array 305 and electron detector 306. As used in the context of this disclosure, "upstream" may refer to a position of an element located above or before another element, along the path of primary electron beam starting from the electron source, and "immediately upstream" refers to a position of a second element above or before a first element along the path of primary electron beam 300B1 such that there are no other active elements between the first and the second element. As used herein, "active element" may refer to any element or component, the presence of which may modify the electromagnetic field between the first and the second element, either by generating an electric field, a magnetic field, or an electromagnetic field.

Apparatus 300 may comprise condenser lens 304 configured to receive a portion of or a substantial portion of primary electron beam 300B1 and to focus primary electron beam 300B1 on beam-limiting aperture array 305. Condenser lens 304 may be substantially similar to condenser lens 226 of FIG. 2 and may perform substantially similar functions. Although shown as a magnetic lens in FIG. 3, condenser lens 304 may be an electrostatic, a magnetic, an electromagnetic, or a compound electromagnetic lens, among others. Condenser lens 304 may be electrically coupled with a controller, such as controller 150 of FIG. 2. The controller may apply an electrical excitation signal to condenser lens 304 to adjust the focusing power of condenser lens 304 based on factors including operation mode, application, desired analysis, sample material being inspected, among others.

Apparatus 300 may further comprise beam-limiting aperture array 305 configured to limit beam current of primary electron beam 300B1 passing through one of a plurality of beam-limiting apertures of beam-limiting aperture array 305. Although only one beam-limiting aperture is illustrated in FIG. 3, beam-limiting aperture array 305 may include any number of apertures having uniform or non-uniform aperture size, cross-section, or pitch. In some embodiments, beam-limiting aperture array 305 may be disposed downstream of condenser lens 304 or immediately downstream of condenser lens 304 (as illustrated in FIG. 3) and substantially perpendicular to primary optical axis 300-1. In some embodiments, beam-limiting aperture array 305 may be configured as an electrically conducting structure comprising a plurality of beam-limiting apertures. Beam-limiting aperture array 305 may be electrically connected via a connector (not illustrated) with controller 150, which may be configured to instruct that a voltage be supplied to beam-limiting aperture array 305. The supplied voltage may be a reference voltage such as, for example, ground potential. The controller may also be configured to maintain or adjust the supplied voltage. Controller 150 may be configured to adjust the position of beam-limiting aperture array 305.

Apparatus 300 may comprise one or more signal electron detectors 306 and 312. Signal electron detectors 306 and 312 may be configured to detect substantially all secondary electrons and a portion of backscattered electrons based on the emission energy, emission polar angle, emission azimuthal angle of the backscattered electrons, among others. In some embodiments, signal electron detectors 306 and 312 may be configured to detect secondary electrons, backscattered electrons, or auger electrons. Signal electron detector 312 may be disposed downstream of signal electron detector 306. In some embodiments, signal electron detector 312 may be disposed downstream or immediately downstream of primary electron beam deflector 311. Signal electrons having low emission energy (typically ≤50 eV) or small emission polar angles, emitted from sample 315 may comprise secondary electron beam(s) 300B4, and signal electrons having high emission energy (typically >50 eV) and medium emission polar angles may comprise backscattered electron beam(s) 300B3. In some embodiments, 300B4 may comprise secondary electrons, low-energy backscattered electrons, or high-energy backscattered electrons with small emission polar angles. It is appreciated that although not illustrated, a portion of backscattered electrons may be detected by signal electron detector 306, and a portion of secondary electrons may be detected by signal electron detector 312. In overlay metrology and inspection applications, signal electron detector 306 may be useful to detect secondary electrons generated from a surface layer and backscattered electrons generated from the underlying deeper layers, such as deep trenches or high aspect-ratio holes.

Apparatus 300 may further include compound objective lens 307 configured to focus primary electron beam 300B1 on a surface of sample 315. The controller may apply an electrical excitation signal to the coils 307C of compound objective lens 307 to adjust the focusing power of compound objective lens 307 based on factors including primary beam energy, application need, desired analysis, sample material being inspected, among others. Compound objective lens 307 may be further configured to focus signal electrons, such as secondary electrons having low emission energies, or backscattered electrons having high emission energies, on a detection surface of a signal electron detector (e.g., in-lens signal electron detector 306 or detector 312). Compound objective lens 307 may be substantially similar to or perform substantially similar functions as objective lens assembly 232 of FIG. 2. In some embodiments, compound objective lens 307 may comprise an electromagnetic lens including a magnetic lens 307M, and an electrostatic lens 307ES formed by control electrode 314, polepiece 307P, and sample 315.

As used herein, a compound objective lens is an objective lens producing overlapping magnetic and electrostatic fields, both in the vicinity of the sample for focusing the primary electron beam. In this disclosure, though condenser lens 304 may also be a magnetic lens, a reference to a magnetic lens, such as 307M, refers to an objective magnetic lens, and a reference to an electrostatic lens, such as 307ES, refers to an objective electrostatic lens. As illustrated in FIG. 3, magnetic lens 307M and electrostatic lens 307ES, working in unison, for example, to focus primary electron beam 300B1 on sample 315, may form compound objective lens 307. The lens body of magnetic lens 307M and coil 307C may produce the magnetic field, while the electrostatic field may be produced by creating a potential difference, for example, between sample 315, and polepiece 307P. In some embodiments, control electrode 314 or other electrodes located between polepiece 307P and sample 315, may also be a part of electrostatic lens 307ES.

In some embodiments, magnetic lens 307M may comprise a cavity defined by the space between imaginary planes 307A and 307B. It is to be appreciated that imaginary planes 307A and 307B, marked as broken lines in FIG. 3, are visual aids for illustrative purposes only. Imaginary plane 307A, located closer to condenser lens 304, may define the upper boundary of the cavity, and imaginary plane 307B, located closer to sample 315, may define the lower boundary of the cavity of magnetic lens 307M. As used herein, the "cavity" of the magnetic lens refers to space defined by the element of the magnetic lens configured to allow passage of the primary electron beam, wherein the space is rotationally symmetric around the primary optical axis. The term "within the cavity of magnetic lens" or "inside the cavity of the magnetic lens" refers to the space bound within the imaginary planes 307A and 307B and the internal surface of the magnetic lens 307M directly exposed to the primary electron beam. Planes 307A and 307B may be substantially perpendicular to primary optical axis 300-1. Although FIG. 3 illustrates a conical cavity, the cross-section of the cavity may be cylindrical, conical, staggered cylindrical, staggered conical, or any suitable cross-section.

Apparatus 300 may further include a scanning deflection unit comprising primary electron beam deflectors 308, 309, 310, and 311, configured to dynamically deflect primary electron beam 300B1 on a surface of sample 315. In some embodiments, scanning deflection unit comprising primary electron beam deflectors 308, 309, 310, and 311 may be referred to as a beam manipulator or a beam manipulator assembly. The dynamic deflection of primary electron beam 300B1 may cause a desired area or a desired region of interest of sample 315 to be scanned, for example in a raster scan pattern, to generate SEs and BSEs for sample inspection. One or more primary electron beam deflectors 308, 309, 310, and 311 may be configured to deflect primary electron beam 300B1 in X-axis or Y-axis, or a combination of X- and Y-axes. As used herein, X-axis and Y-axis form Cartesian coordinates, and primary electron beam 300B1 propagates along Z-axis or primary optical axis 300-1.

Electrons are negatively charged particles and travel through the electron-optical column, and may do so at high energy and high speeds. One way to deflect the electrons is to pass them through an electric field or a magnetic field generated, for example, by a pair of plates held at two different potentials, or passing current through deflection coils, among other techniques. Varying the electric field or the magnetic field across a deflector (e.g., primary electron beam deflectors 308, 309, 310, and 311 of FIG. 3) may vary the deflection angle of electrons in primary electron beam 300B1 based on factors including, but are not limited to, electron energy, magnitude of the electric field applied, dimensions of deflectors, among others.

In some embodiments, one or more primary electron beam deflectors 308, 309, 310, and 311 may be located within the cavity of magnetic lens 307M. As illustrated in FIG. 3, all primary electron beam deflectors 308, 309, 310, and 311, in their entirety, may be located within the cavity of magnetic lens 307M. In some embodiments, at least one primary electron beam deflector, in its entirety, may be located within the cavity of magnetic lens 307M. In some embodiments, a substantial portion of the magnetic field generated by passing electrical current through coil 307C may be present in magnetic lens 307M such that each deflector is located inside the magnetic field lines of magnetic lens 307M or is influenced by the magnetic field of magnetic lens 307M. In such a scenario, sample 315 may be considered to be outside the magnetic field lines and may not be influenced by the magnetic field of magnetic lens 307M. A beam deflector (e.g., primary electron beam deflector 308 of FIG. 3) may be disposed circumferentially along the inner surface of magnetic lens 307M. One or more primary electron beam deflectors may be placed between signal electron detectors 306 and 312. In some embodiments, all primary electron beam deflectors may be placed between signal electron detectors 306 and 312.

As disclosed herein, a polepiece of a magnetic lens (e.g., magnetic lens 307M) is a piece of magnetic material near the magnetic poles of a magnetic lens, while a magnetic pole is the end of the magnetic material where the external magnetic field is the strongest. As illustrated in FIG. 3, apparatus 300 comprises polepieces 307P and 3070. As an example, polepiece 307P may be the piece of magnetic material near the north pole of magnetic lens 307M, and polepiece 3070 may be the piece of magnetic material near the south pole of magnetic lens 307M. When the current in magnetic lens coil 307C changes directions, then the polarity of the magnetic poles may also change. In the context of this disclosure, the positioning of electron detectors (e.g., signal electron detector 312 of FIG. 3), beam deflectors (e.g., beam deflectors 308-311 of FIG. 3), electrodes (e.g., control electrode 314 of FIG. 3) may be described with reference to the position of polepiece 307P located closest to the point where primary optical axis 300-1 intersects sample 315. Polepiece 307P of magnetic lens 307M may comprise a magnetic pole made of a soft magnetic material, such as electromagnetic iron, which concentrates the magnetic field substantially within the cavity of magnetic lens 307M. Polepieces 307P and 3070 may be high-resolution polepieces, multiuse polepieces, or high-contrast polepieces, for example.

As illustrated in FIG. 3, polepiece 307P may comprise an opening 307R configured to allow primary electron beam 300B1 to pass through and allow signal electrons to reach signal detectors 306 and 312. Opening 307R of polepiece 307P may be circular, substantially circular, or non-circular in cross-section. In some embodiments, the geometric center of opening 307R of polepiece 307P may be aligned with primary optical axis 300-1. In some embodiments, as illustrated in FIG. 3, polepiece 307P may be the furthest downstream horizontal section of magnetic lens 307M, and may be substantially parallel to a plane of sample 315. Polepieces (e.g., 307P and 307O) are one of several distinguishing features of magnetic lens over electrostatic lens. Because polepieces are magnetic components adjacent to the magnetic poles of a magnetic lens, and because electrostatic lenses do not produce a magnetic field, electrostatic lenses do not have polepieces.

One of several ways to separately detect signal electrons such as SEs and BSEs based on their emission energy includes passing the signal electrons generated from probe spots on sample 315 through an energy filtering device. In some embodiments, control electrode 314 may be configured to function as an energy filtering device and may be disposed between sample 315 and signal electron detector 312. In some embodiments, control electrode 314 may be disposed between sample 315 and magnetic lens 307M along the primary optical axis 300-1. Control electrode 314 may be biased with reference to sample 315 to form a potential barrier for the signal electrons having a threshold emission energy. For example, control electrode 314 may be biased negatively with reference to sample 315 such that a portion of the negatively charged signal electrons having energies below the threshold emission energy may be deflected back to sample 315. As a result, only signal electrons that have emission energies higher than the energy barrier formed by control electrode 314 propagate towards signal electron detector 312. It is appreciated that control electrode 314 may perform other functions as well, for example, affecting the angular distribution of detected signal electrons on signal electron detectors 306 and 312 based on a voltage applied to control electrode. In some embodiments, control electrode 314 may be electrically connected via a connector (not illustrated) with the controller (not illustrated), which may be configured to apply a voltage to control electrode 314. The controller may also be configured to apply, maintain, or adjust the applied voltage. In some embodiments, control electrode 314 may comprise one or more pairs of electrodes configured to provide more flexibility of signal control to, for example, adjust the trajectories of signal electrons emitted from sample 315.

In some embodiments, sample 315 may be disposed on a plane substantially perpendicular to primary optical axis 300-1. The position of the plane of sample 315 may be adjusted along primary optical axis 300-1 such that a distance between sample 315 and signal electron detector 312 may be adjusted. In some embodiments, sample 315 may be electrically connected via a connector with controller (not illustrated), which may be configured to supply a voltage to sample 315. The controller may also be configured to maintain or adjust the supplied voltage.

In currently existing SEMs, signals generated by detection of secondary electrons and backscattered electrons are used in combination for imaging surfaces, detecting and analyzing defects, obtaining topographical information, morphological and compositional analysis, among others. By detecting the secondary electrons and backscattered electrons, the top few layers and the layers underneath may be imaged simultaneously, thus potentially capturing underlying defects, such as buried particles, overlay errors, among others. However, overall image quality may be affected by the efficiency of detection of secondary electrons as well as backscattered electrons. While high-efficiency secondary electron detection may provide high-quality images of the surface, the overall image quality may be inadequate because of inferior backscattered electron detection efficiency. Therefore, it may be beneficial to improve backscattered electron detection efficiency to obtain high-quality imaging, while maintaining high throughput.

As illustrated in FIG. 3, apparatus 300 may comprise signal electron detector 312 located immediately upstream of polepiece 307P and within the cavity of magnetic lens 307M. Signal electron detector 312 may be placed between primary electron beam deflector 311 and polepiece 307P. In some embodiments, signal electron detector 312 may be placed within the cavity of magnetic lens 307M such that there are no primary electron beam deflectors between signal electron detector 312 and sample 315.

In some embodiments, polepiece 307P may be electrically grounded or maintained at ground potential to minimize the influence of the retarding electrostatic field associated with sample 315 on signal electron detector 312, therefore minimizing the electrical damage, such as arcing, that may be caused to signal electron detector 312. In a configuration such as shown in FIG. 3, the distance between signal electron detector 312 and sample 315 may be reduced so that the BSE detection efficiency and the image quality may be enhanced while minimizing the occurrence of electrical failure or damage to signal electron detector 312.

In some embodiments, signal electron detectors 306 and 312 may be configured to detect signal electrons having a wide range of emission polar angles and emission energies. For example, because of the proximity of signal electron detector 312 to sample 315, it may be configured to collect backscattered electrons having a wide range of emission polar angles, and signal electron detector 306 may be configured to collect or detect secondary electrons having low emission energies.

Signal electron detector 312 may comprise an opening configured to allow passage of primary electron beam 300B1 and signal electron beam 300B4. In some embodiments, the opening of signal electron detector 312 may be aligned such that a central axis of the opening may substantially coincide with primary optical axis 300-1. The opening of signal electron detector 312 may be circular, rectangular, elliptical, or any other suitable shape. In some embodiments, the size of the opening of signal electron detector 312 may be chosen, as appropriate. For example, in some embodiments, the size of the opening of signal electron detector 312 may be smaller than the opening of polepiece 307P close to sample 315. In some embodiments, where the signal electron detector 306 is a single-channel detector, the opening of signal electron detector 312 and the opening of signal electron detector 306 may be aligned with each other and with primary optical axis 300-1. In some embodiments, signal electron detector 306 may comprise a plurality of electron detectors, or one or more electron detectors having a plurality of detection channels. In embodiments where the signal electron detector 306 comprises a plurality of electron detectors, one or more detectors may be located off-axis with respect to primary optical axis 300-1. In the context of this disclosure, "off-axis" may refer to the location of an element such as a detector, for example, such that the primary axis of the element forms a non-zero angle with the primary optical axis of the primary electron beam. In some embodiments, the signal electron detector 306 may further comprise an energy filter configured to allow a portion of incoming signal electrons having a threshold energy to pass through and be detected by the electron detector.

The location of signal electron detector 312 within the cavity of magnetic lens 307M as shown in FIG. 3 may further enable easier assembly and alignment of signal electron detector 312 with other electron-optical components of apparatus 300. Electrically grounded polepiece 307P may substantially shield signal electron detector 312 from the influence of the retarding electrostatic field of electrostatic lens 307ES formed by polepiece 307P, control electrode 314, and sample 315.

One of several ways to enhance image quality and signal-to-noise ratio may include detecting more backscattered electrons emitted from the sample. The angular distribution of emission of backscattered electrons may be represented by a cosine dependence of the emission polar angle (cos θ), where θ is the emission polar angle between the backscattered electron beam and the primary optical axis). While a signal electron detector may efficiently detect backscattered electrons of medium emission polar angles, the large emission polar angle backscattered electrons may remain undetected or inadequately detected to contribute towards the overall imaging quality. Therefore, it may be desirable to add another signal electron detector to capture large angle backscattered electrons.

Figure 4:
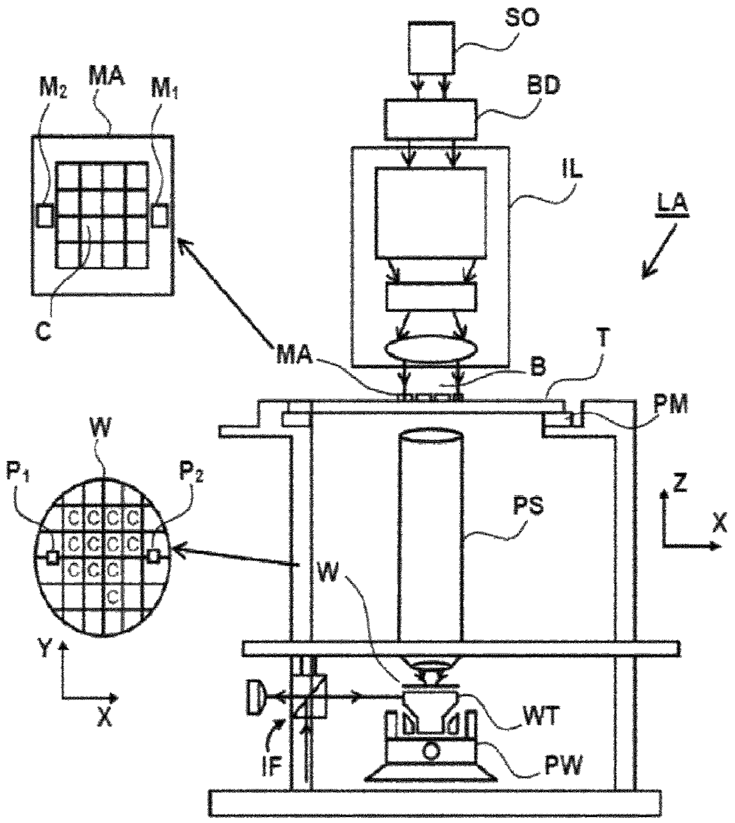
FIG. 4 depicts a schematic overview of a lithographic apparatus, according to an embodiment.

As a further brief introduction, FIG. 4 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT configured to hold a substrate (e.g., a resist coated wafer) W and coupled to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g., via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g., mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 5:
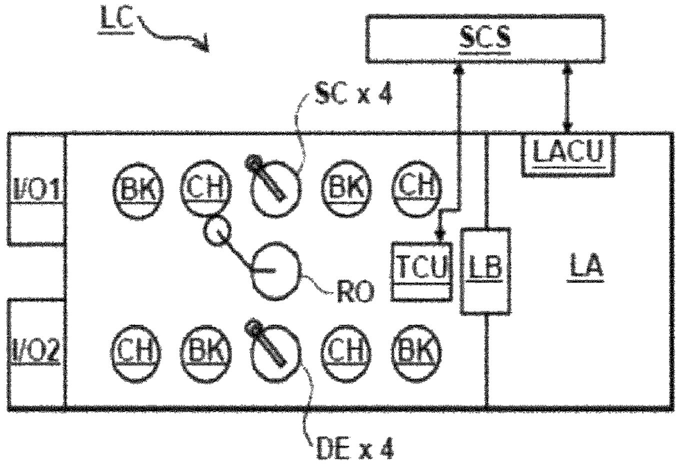
FIG. 5 depicts a schematic overview of a lithographic cell, according to an embodiment.

FIG. 5 depicts a schematic overview of a lithographic cell LC. As shown in FIG. 5, the lithographic apparatus LA may form part of lithographic cell LC, also sometimes referred to as a lithocell or (litho)cluster, which often also includes apparatus to perform pre- and post-exposure processes on a substrate W. Conventionally, these include spin coaters SC configured to deposit resist layers, developers DE to develop exposed resist, chill plates CH and bake plates BK, e.g. for conditioning the temperature of substrates, W e.g., for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g., via lithography control unit LACU.

In order for the substrates W (FIG. 4) exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W (FIG. 4), and, in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 6:
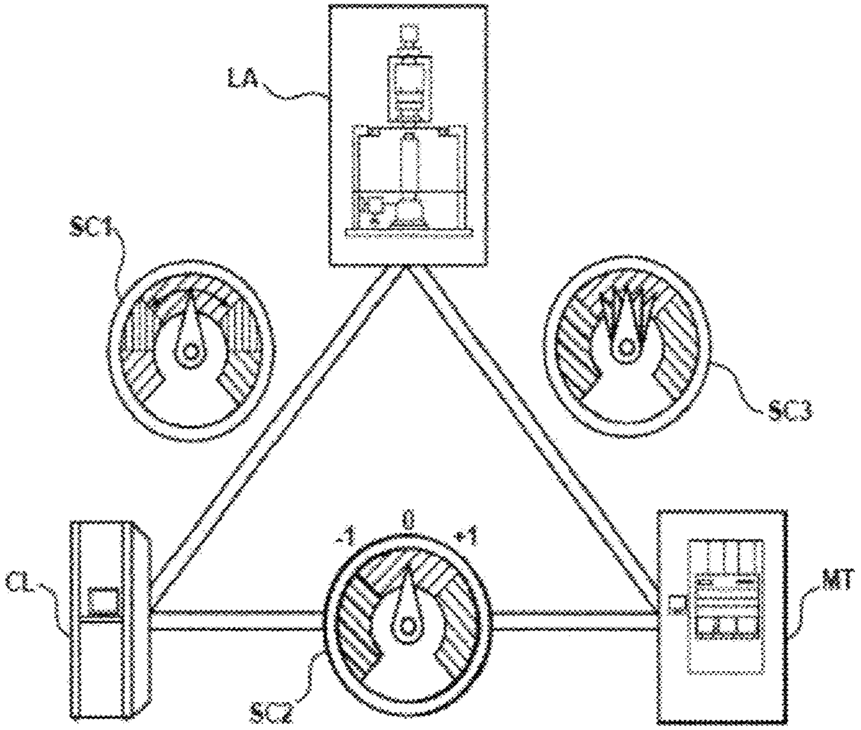
FIG. 6 depicts a schematic representation of holistic lithography, representing a cooperation between three technologies to optimize semiconductor manufacturing, according to an embodiment.

FIG. 6 depicts a schematic representation of holistic lithography, representing a cooperation between three technologies to optimize semiconductor manufacturing. Typically, the patterning process in a lithographic apparatus LA is one of the most critical steps in the processing which requires high accuracy of dimensioning and placement of structures on the substrate W (FIG. 1). To ensure this high accuracy, three systems (in this example) may be combined in a so called "holistic" control environment as schematically depicted in FIG. 6. One of these systems is the lithographic apparatus LA which is (virtually) connected to a metrology apparatus (e.g., a metrology tool) MT (a second system), and to a computer system CL (a third system). A "holistic" environment may be configured to optimize the cooperation between these three systems to enhance the overall process window and provide tight control loops to ensure that the patterning performed by the lithographic apparatus LA stays within a process window. The process window defines a range of process parameters (e.g., dose, focus, overlay) within which a specific manufacturing process yields a defined result (e.g., a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g., using input from the metrology tool MT) to predict whether defects may be present due to, for example, sub-optimal processing (depicted in FIG. 3 by the arrow pointing "0" in the second scale SC2).

The metrology apparatus (tool) MT may provide input to the computer system CL to enable accurate simulations and predictions, and may provide feedback to the lithographic apparatus LA to identify possible drifts, e.g., in a calibration status of the lithographic apparatus LA (depicted in FIG. 6 by the multiple arrows in the third scale SC3).

In lithographic processes, it is desirable to make frequent measurements of the structures created, e.g., for process control and verification. Different types of metrology tools MT for making such measurements are known, including scanning electron microscopes or various forms of optical metrology tool, image based or scatterometery-based metrology tools. Image analysis on images obtained from optical metrology tools and scanning electron microscopes can be used to measure various dimensions (e.g., CD, overlay, edge placement error (EPE) etc.) and detect defects for the structures. In some cases, a feature of one layer of the structure can obscure a feature of another or the same layer of the structure in an image. This can be the case what one layer is physically on top of another layer, or when one layer is electronically rich and therefore brighter than another layer in a scanning electron microscopy (SEM) image, for example. In cases where a feature is partially obscured in an image, the location of the image can be determined based on template matching.

Template matching is an image or pattern recognition method or algorithm in which an image which comprises a set of pixels with pixel values is compared to an image template. The image template can comprise a set of pixels with pixel values, or can comprise a function (such as a smoothed function) of pixel values over an area. In template matching, the image template is compared to various positions on the image in order to determine the area of the image which best matches the image template. The image template can be stepped across the image in increments across a first and a second dimension (i.e., across both the x and the y axis of the image) and a similarity indicator determined at each position. The similarity indicator compares the pixel values of the image to the pixel values of the image template for each position of the image template and measures how well the values match. An example similarity indicator, a normalized coefficient, is described by Equation 1, below:

$$R(x, y) = \frac{\Sigma_{x'y'}(T(x', y') - I(x + x', y + y'))^2}{\sqrt{\Sigma_{x'y'}T(x', y')^2 \cdot \Sigma_{x'y'}I(x + x', y + y')^2}} \quad (1)$$

where R is the result, or similarity indicator, for the image template T located at position (x, y) on the image I. The location of the image template can then be determined based on the similarity indication. For example, the image template can be matched to the position with the highest similarity indicator, or multiple occurrences of the image template can be matched to multiple positions for which the similarity indicator is larger than a threshold. Template matching can be used to locate features which correspond to image templates once the image templates are matched to positions on an image. Based on the locations of the matched image templates, dimensions, locations, and distances between features can be identified, and lithographic information, analysis, and control provided.

SEM images often provide the highest resolution and most sensitive image for multiple layer structures. Top-down SEM images can therefore be used to determine relative offset between features of the same or different layers, though template matching can also be used on optical or other electromagnetic images.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US 2016/0161863 and published US patent application US 2016/0370717A1 incorporated herein by reference in its entirety.

Figure 7:
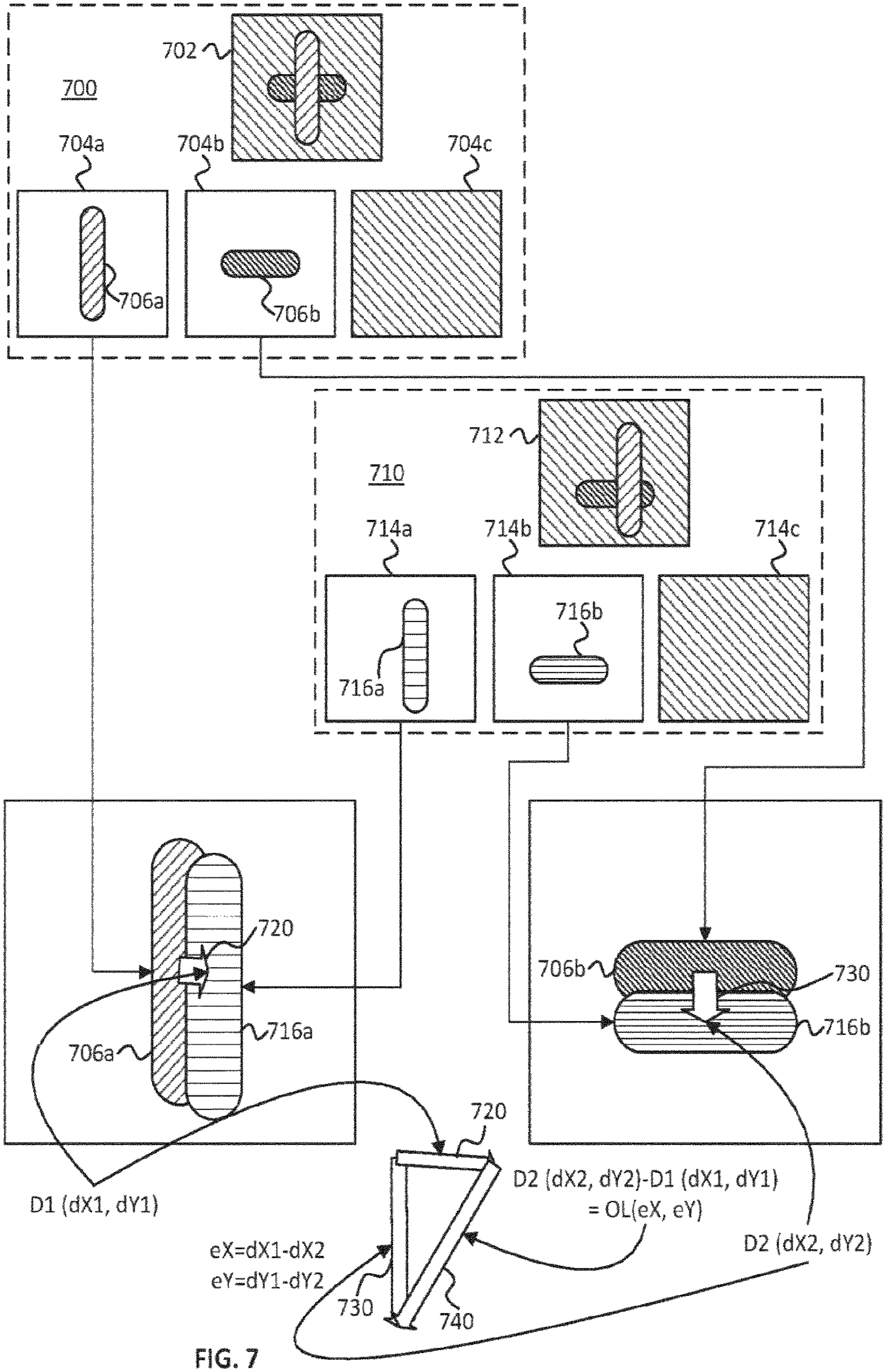
FIG. 7 illustrates a method of overlay determination based on template matching, according to an embodiment.

FIG. 7 illustrates a method of overlay determination based on template matching, according to an embodiment. A reference image 702 is obtained for a reference measurement structure 700. For example, the reference structure can be an "ideal" or "gold" version (e.g., with no layer-to-layer shift or other distortion) of the first measurement structure. The reference image 702 can be generated based on a model of the fabrication process, based on a design structure of GDS of the feature, or can be an image of a well or "best" aligned device, as described in further detail below. The reference measurement structure 700 can be any feature of the structure of the IC—the measurement structure need not be an alignment structure or an optical target structure—for which an image can be obtained, and the example shown here is not to be considered limiting. The reference measurement structure 700 is comprised of three layers: a top layer 704*a* with a feature 706*a*, a middle layer 704*b* with a feature 706*b*, and a bottom layer 704*c* shown with no features.

A test image 712 is obtained for a test measurement structure 710, wherein the test measurement structure 710 is an as-fabricated version of the reference measurement structure 700. The test image 712 shows that the test measurement structure 710 is not aligned in the same way that the reference measurement structure 700 is aligned. The test measurement structure 710 is comprised of three layers: a top layer 714*a* with a feature 716*a*, a middle layer 714*b* with a feature 716*b*, and a bottom layer 714*c* shown with no features.

Each feature (i.e., the features 706*a*, 706*b*, 716*a*, and 716*b*) can be individually located by template matching. An image template for a feature of the top layer can be matched to both the feature 706*a* and the feature 706*b*. Once the image template is matched, an offset 720 between the reference location of the feature 706*a* and the test location of the feature 716*a* is determined. The offset 720 corresponds to a vector the feature 716*a* is "offset" from a reference or planned position. An image template for a feature of the middle layer can also be matched to both the feature 716*b* and the feature 716*b*. After the image template is matched, an offset 730 between the reference location of the feature 706*b* and the test location of the feature 716*b* is determined. In some embodiments, the features 706*a* and 706*b* of the reference measurement structure 700 can have known locations and offset can be determined based on the known locations and template matching for the test locations.

If features of both layers of the test image are located (e.g., by template matching), then a measure of overlay can be determined. A measure of "overlay" is determined relative to features of two layers of the same measurement structure and measures the layer-to-layer shift between layers which are designed to align or have a certain or known relationship. Because the offset 720 is the offset for the feature 716*a* from the reference and the offset 730 is the offset for the feature 716*b*, the measure of overlay 740 can be determined based on the sum of the offset vectors. An example calculation of an offset vector is shown in Equation 2, below:

$$\overrightarrow{OL}(x,\ y) = \overrightarrow{D2}(x1,\ y1) - \overrightarrow{D1}(x1,\ y1) \tag{2}$$

where OL represents the measure of overlay as a vector with x, y, and D1 represents a first layer offset as a vector with x, y, and D2 represents a second layer offset as a vector with x, y. Overlay can also be a one-dimensional value (e.g., for semi-infinite line features), or a two-dimensional value (e.g., in the x and y directions, in the r and theta directions). Further, it is not required that offset be determined in order to determine overlay—instead overlay can be determined based on a relative position of features of two layers and a reference or planned relative position of those features.

Because of design tolerances and structure building requirements, some layers of a structure can obscure other layers—either physically or electronically—when viewed in a two-dimensional plane such as captured in an SEM image or an optical image. For example, metal connections can obscure images of contact holes during multi-layer via construction. When a feature is blocked or obscured by another feature of the IC, template matching for the blocked feature is more difficult. A blocked feature has a reduced surface area—and reduced contour length—when viewed in an image, which reduces the agreement between a template and the blocked feature and therefore complicates template matching. It should be understood that the method of the present disclosure, while sometimes described in reference to an SEM image, can be applied to or on any suitable image, such as an SEM image, an X-ray image, an ultrasound image, optical image from image-based overlay metrology, optical microscopy image, etc. Additionally, template matching can be applied in multiple metrology apparatuses, steps, or determinations. For example, template matching can be applied in EPE, overlay (OVL), and CD metrology.

Figure 8A:
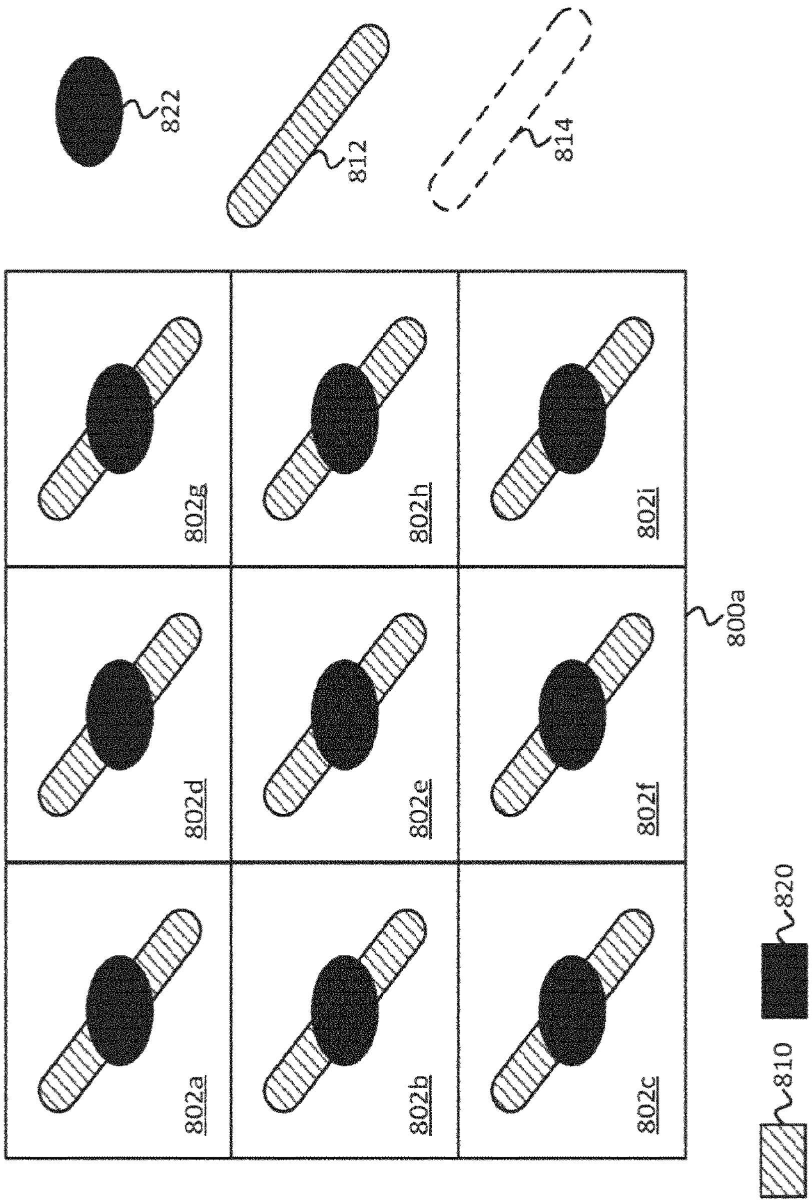
FIG. 8A depicts a schematic representation of template matching for a blocked layer, according to an embodiment.

FIG. 8A depicts a schematic representation of template matching for a blocked layer with minimal offset, according to an embodiment. FIG. 8A includes an example image 800*a* which corresponds to an SEM image, for example obtained near the wafer center. The example image 800*a* is comprises of measurement structures 802*a*-802*i*. Each of the measurement structures 802*a*-802*i* corresponds to features in a blocked layer 810 and a blocking layer 820. The blocked layer 810 can be above or below the blocking layer 820 in the measurement structures. The blocked layer 810 comprises example features with a shape 812. The blocking layer comprises example features with a shape 822. An example template 814 corresponding to the shape 812 of the example features of the blocked layer 810 is also depicted. The example template 814 can be used to locate the shape 812 of the blocked layer 810 via template matching. However, as the example template 814 corresponds to the feature which can be blocked (such as by the features with the shape 822 of the blocking layer 820), the example template 814 may not fully match to the example image 800*a*. That is, the example template 814 may not correspond fully to the shape 812 of the feature in the image 800*a*.

The measurement structures 802*a*-802*i* are periodic, and their overlay values are substantially equal within in a small area, such as within SEM image size. The size of a small area for which overlay values are substantially equal can be affected by fabrication parameters-such as optical lens uniformity, feature size, dose uniformity, focal length uniformity, etc. However, the overlay values can be quite different at different wafer locations or over relatively larger areas, such as between wafer center and wafer edge locations. The overlay values can be different among different wafers and different lots of wafers due to the semiconductor process variations.

Figure 8B:
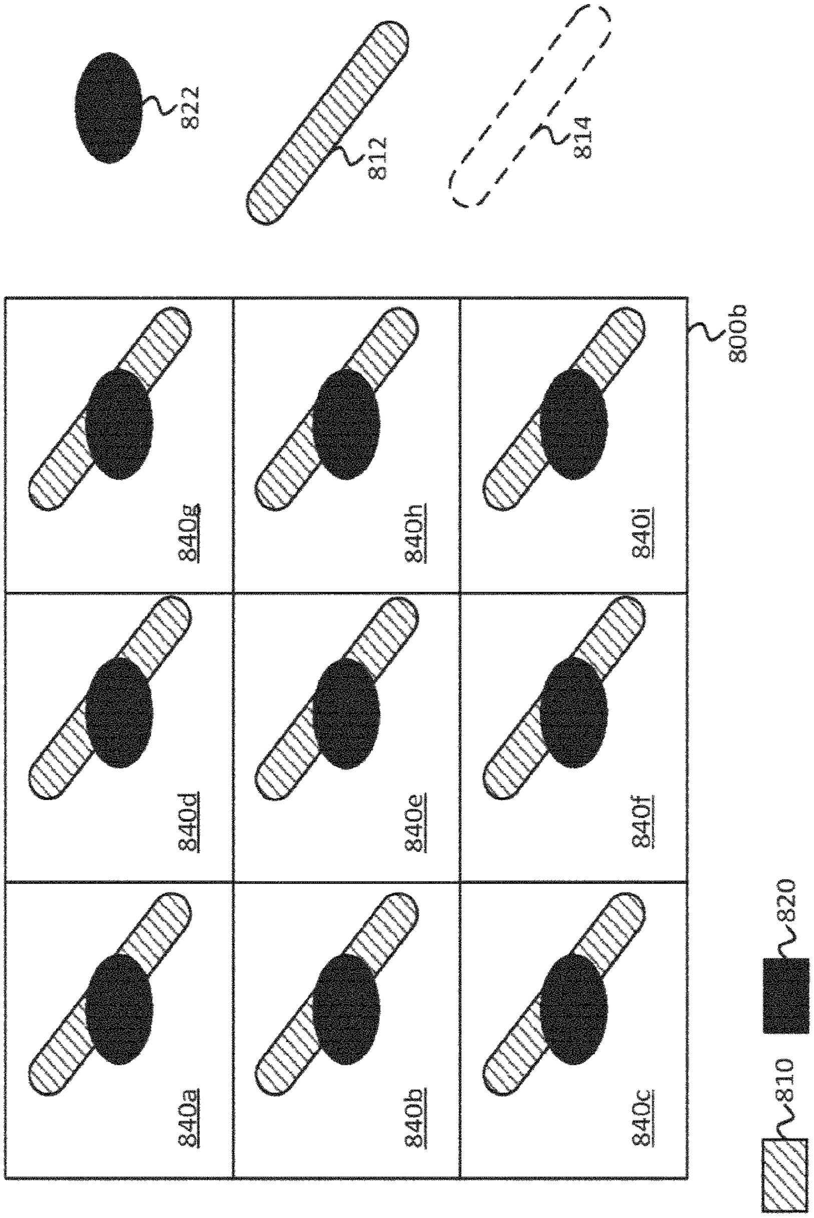
FIG. 8B depicts a schematic representation of template matching for a blocked layer with offset, according to an embodiment.

To illustrate, FIG. 8B depicts a schematic representation of template matching for a blocked layer with offset, according to an embodiment. FIG. 8B includes an example image 800*b* which corresponds to an SEM image, for example obtained near the wafer edge. The example image 800*b* is comprises of measurement structures 840*a*-840*i*. In FIG. 8B (as in FIG. 8A), each of the measurement structures 840*a*-840*i* corresponds to features in the blocked layer 810 and the blocking layer 820. The blocked layer comprises example features with the shape 812 (as in FIG. 8A) and the blocking layer comprises exampled features with the shape 822 (as in FIG. 8A). The example template 814 is shown which corresponds to the shape 812 of the feature of the blocked layer 810. The portion of the shape 812 which is visible in the image 800*b* of FIG. 8B is different than the portion of the shape of 812 which is visible in the image 800*a* of FIG. 8A. This can occur because of alignment, focusing, material property, etc. differences between portions of the wafer (in this example, between the center of the wafer and a location closer to an edge) or between wafers themselves. The example template 814 may also not correspond fully to the shape 812 of the feature in the image 800*b*, due to the portions of the shape 812 which are blocked by the shape 822. Further, changing the shape of the example template 814 to correspond to only the visible portion of the shape 812 of the blocked layer 810 (i.e., a portion of the rounded bar of the shape 812 of the blocked layer 810 minus an overlapping portion of an ellipse of the shape 822 the blocking layer 820) would also hinder template matching, because the visible portion of the shape 812 of the feature of the blocked layer 810 changes based on differences in position, size, orientation, etc. of the features of the blocked layer 810 and the blocking layer 820 and differences in relative position between the blocked layer 810 and the blocking layer 820. This is depicted in FIGS. 8A and 8B, where the visible portion of the shape 812 of the blocking layer is not consistent between the test image 800*a* and 800*b*. The shape of a visible portion of a feature can vary even within a test image if process variation is high enough.

According to embodiments of the present disclosure, to improve template matching accuracy for a blocked layer, a weight map can be used. The weight map generates another weighting value with can be adjusted to account for areas of the image template which correspond to blocked areas or other areas which cannot be matched well. In some embodiments, the weight map can also be adjusted, updated, or adapted based on the location of the image template on the image or other properties of the image. For example, a weight map for the example template 814 of the blocked layer 810 can be weighted highly in areas where the example template 814 does not overlap the feature of the blocking layer 820 and weighted less in areas where the example template 814 does overlap with the feature of the blocking layer 820. The weight map can be updated for each position of the image template (e.g., as the image template slides across the image or is otherwise compared to multiple positions on the image) to generate an adaptive weighting and to enable the image template to be matched to one or more best positions-even when the image template is blocked or obscured.

Figure 9:
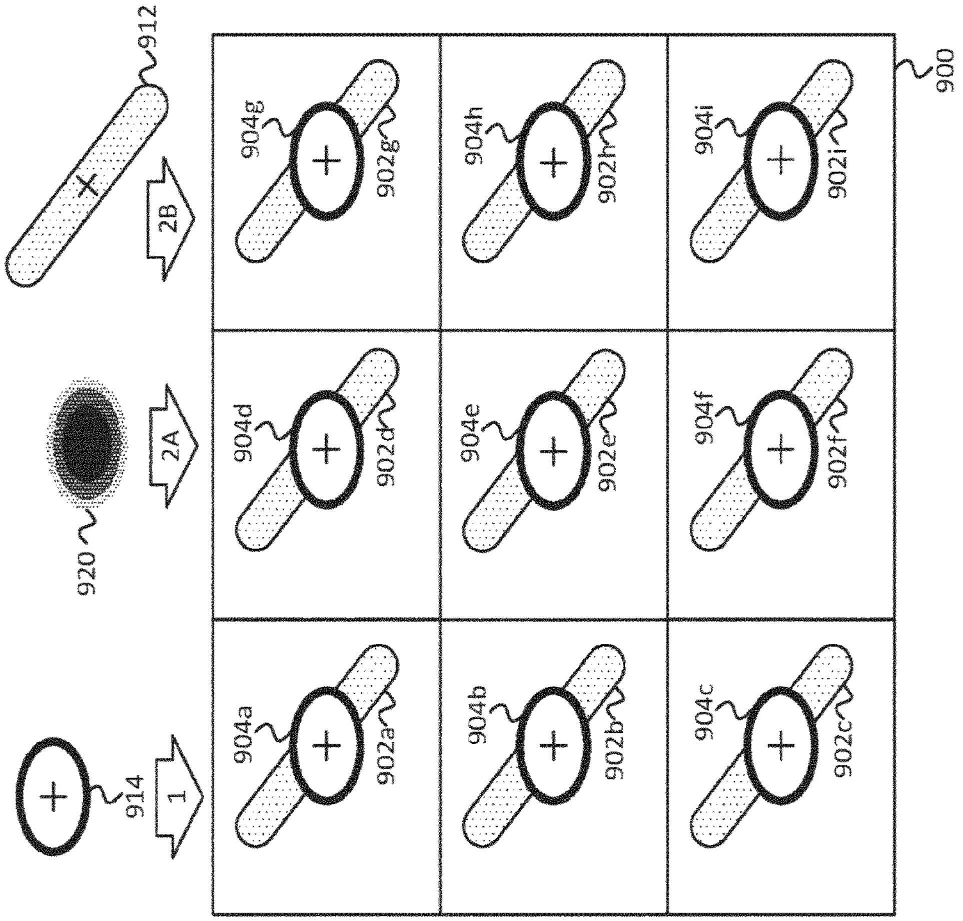
FIG. 9 depicts a schematic representation of two-layer template matching for a set of periodic images, according to an embodiment.

FIG. 9 depicts a schematic representation of two-layer template matching for a set of periodic images, according to an embodiment. An example image 900 corresponds to nine semi-identical cells (e.g., substantially identical in design but may be less than identical as-fabricated) in a three by three grid. Each of the semi-identical cells contains a buried or blocked feature 902*a*-902*i*, which corresponds to a blocked image template 912, and an unburied, top, or blocking feature 904*a*-904*i* which corresponds to a blocking image template 914. A first step for determining overlay comprises matching the blocking image template 914 to locations on the example image 900. Matching the blocking image template 914 to the blocking feature 904*a*-904*i* can be accomplished with an appropriate template matching or other image recognition algorithm according to an embodiment of the present disclosure.

In a second step, matching the blocked image template 912 to the blocked feature 902*a*-902*i* is accomplished with a weight map. In some embodiments, the weight map can be applied to the image, determined for the image, or otherwise a feature of the image. For example, a weight map for the image can be determined, and the weight map of the image template can be the weight map of the image which corresponds to the image template location. In such a case, the image template essentially cuts out and selects a portion of the weight map of the image to become the image template. For example, a weight map can be generated for all or part of the image 900 based on the identified or matched locations of the blocking feature 904*a*-904*i*.

An example weight map 920 corresponding to the blocking image template 914 is depicted. In some embodiments, the weight map can be a weight map corresponding to the blocked image template 912 and can be adaptively updated. For example, the weight map corresponding to the blocked image template 912 can be updated at each sliding position where it is compared to the example image 900 during template matching. The weight map for the image template can be updated based on a pixel value (e.g., brightness) of the example image 900 at the location being tested for matching, based on a distance from the blocked image template 912 which was previously matched to the example image 900, etc.

In some embodiments, a weight map can be applied to an image and an additional weight map can be applied to an image template. In such a case, during template matching, a total adaptive weight map can be determined at a position based on both the weight map applied to the image and the additional weight map applied to the image template. For example, a total adaptive weight map can be determined at each position tested for matching by summing or multiplying the image weight map and the template weight map. Thus, template matching can account for both a weighting of the image (where certain portions are deemphasized relative to other portions) and to a weighting of the image template (where certain portions may be more reliable, for example).

The blocked image template 912 is then matched to the example image 900, at one or more occurrence, based on the weight map, where the three elements of the matching are the (1) image, (2) image template, and (3) weight map. In some embodiment, for each position compared during template matching, a weight map dependent similarity indicator is determined. The similarity indicator can be determined in multiple ways (including being user defined during operation). One example similarity indicator is explained in Equation 3, below:

$$R(x, y) = \frac{\Sigma_{x'y'}\left((T(x', y') - I(x+x', y+y'))M(x', y'\right)^2}{\sqrt{\Sigma_{x'y'}(T(x', y')\cdot M(x', y'))^2\cdot\Sigma_{x'y'}(I(x+x', y+y')\cdot M(x', y'))^2}} \quad (3)$$

where M is the weight map for the position (x, y).

The previously described steps are ordinally labeled for explication purposes only and the labeled order of the steps should not be considered limiting, as in some embodiments one or more steps can be omitted, performed in a different order, or combined. For example, the blocking features can be found by segmentation method, not by template matching method.

Figure 10B:
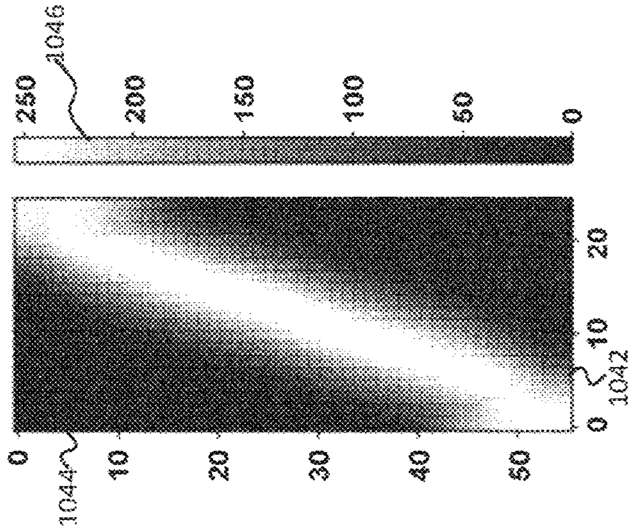
FIG. 10B illustrates an example image template weight map, according to an embodiment.
Figure 10A:
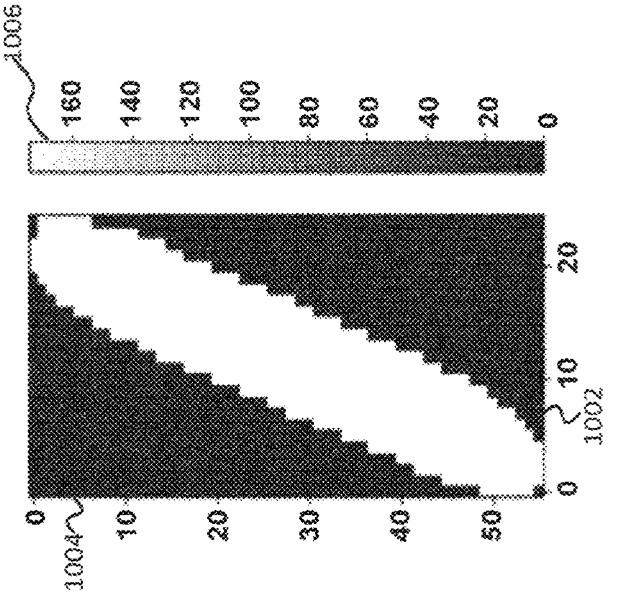
FIG. 10A illustrates an example image template, according to an embodiment.

FIG. 10A illustrates an example image template, according to an embodiment. FIG. 10A depicts an example image template. The example image template comprises pixels in an x-direction 1002 and a y-direction 1004. Each pixel has a pixel value, as defined in the scale 1006. An image template need not comprise pixels—it can instead be represented as function which relates pixel values to a location or distance (i.e., f(x, y)=pixel value). The function can be smooth, but can also be discrete, piece-wise, or even discontinuous or not well-defined. The image template can correspond to a measure image of a feature, a composite image comprised of multiple measured images of a feature, a synthetic image of a feature, etc. The image template can include portions of the feature which are expected to be blocked by other features in a measurement structure. The image template can comprise a contour template or a template which is hollow or otherwise discontinuous.

FIG. 10B illustrates an example image template weight map, according to an embodiment. FIG. 10B depicts an example weight map corresponding to the example image template of FIG. 10A. The example weight map comprises pixels in an x-direction 1042 and a y-direction 1044. Each pixel has a weight value, as defined in the scale 1046. As depicted, the example weight map has a different pixel size that then example image template of FIG. 10A. The example weight map and the example image template can instead have the same pixel size (or resolution). The example weight map and the example image template have the same outer dimensions. In some cases, the example weight map and the example image template can have different dimensions. A weight map need not comprise pixels and can instead be described as a function—for example, a sigmoid function as a function of distance from an image template edge—and can have similar mathematical properties to the image template. The weight map can be adjusted based on relative position of the image template versus the image, so the example weight map may be a starting or null state weight map, which is then adjusted as the image template is matched to various portions of the image. In some cases, the weight map can be adjusted based on the image template, such as adjusted in size, scale, angle or rotation, etc.

Figure 11:
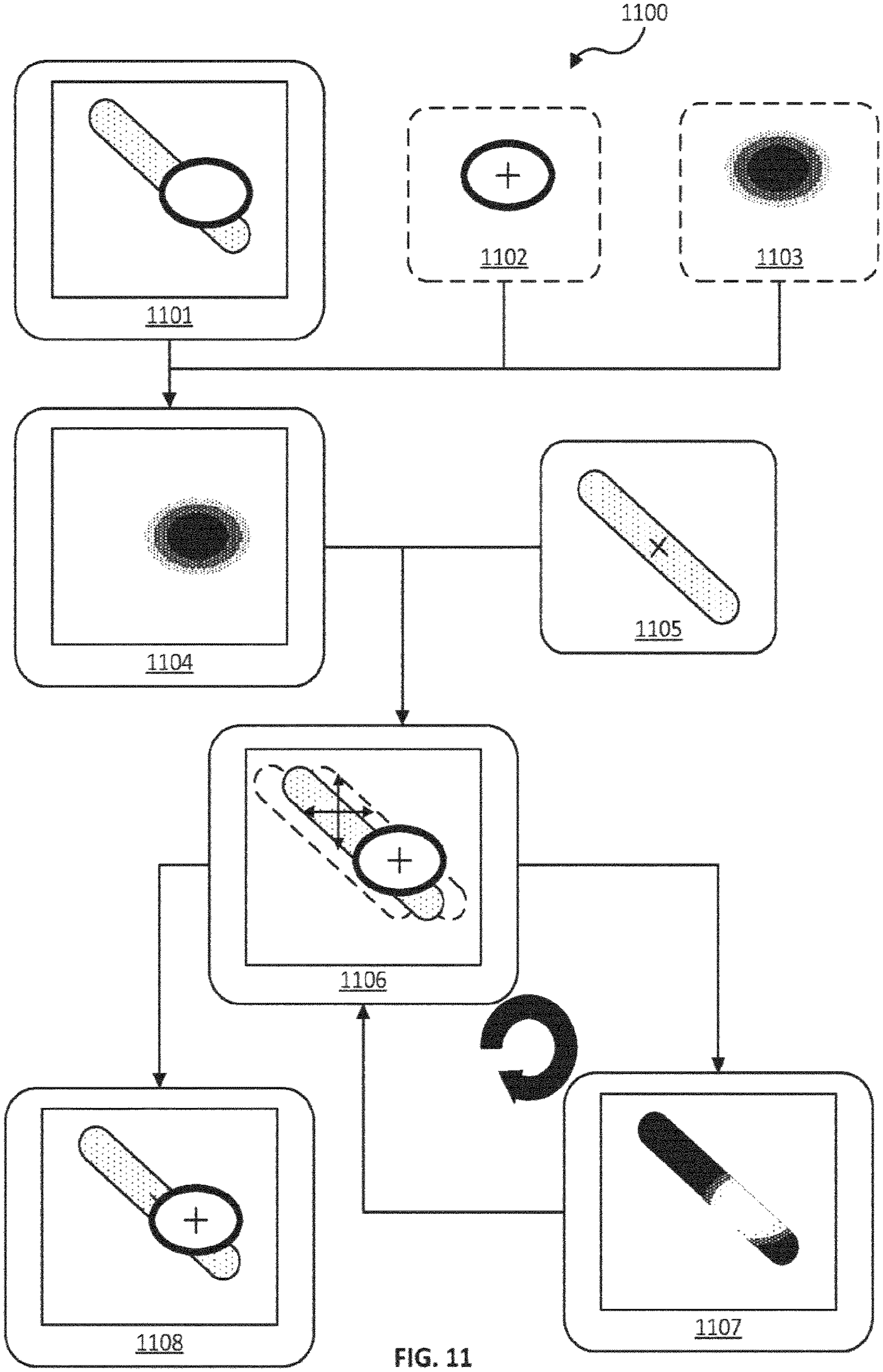
FIG. 11 illustrates an exemplary method for matching an image template to an image based on an adapted weight map, according to an embodiment.

FIG. 11 illustrates an exemplary method 1100 for matching an image template to an image based on an adapted weight map, according to an embodiment. Each of these operations is described in detail below. The operations of method 1100 presented below are intended to be illustrative. In some embodiments, method 1100 may be accomplished with one or more additional operations not described, and/or without one or more of the operations discussed. Additionally, the order in which the operations of method 1100 are illustrated in FIG. 11 and described below is not intended to be limiting. In some embodiments, one or more portions of method 1100 may be implemented (e.g., by simulation, modeling, etc.) in one or more processing devices (e.g., one or more processors). The one or more processing devices may include one or more devices executing some or all of the operations of method 1100 in response to instructions stored electronically on an electronic storage medium. The one or more processing devices may include one or more devices configured through hardware, firmware, and/or software to be specifically designed for execution of one or more of the operations of method 1100, for example.

At an operation 1101, an image of a measurement structure is obtained. The image can be a test image and can be acquired via optical or other electromagnetic imaging or though scanning electron microscopy. The image can be obtained from other software or data storage. At an operation 1102, a blocking image template is optionally obtained (such as from an imaging system like an SEM or optical image and/or from a template library or other data storage repository) or synthetically generated. The blocking image template can correspond to a blocking layer of the measurement structure. At an operation 1103, a weight map for the blocking image template is optionally accessed. The weight map can contain weighting values based on the blocking image template (as depicted, the pixel values are based on a distance from an edge of the image template) and/or the weighting values can be determined or updated based on a position of the blocking image template on or with respect to the image. At an operation 1104, a blocking image template is matched to a first position on the image of the measurement structure. The blocking image template can be matched based on template matching and, optionally, based on the weight map for the blocking image template.

At an operation 1105, a buried or blocked image template is acquired, obtained, accessed, or synthetically generated, as previously described. The blocked image template is associated with a weight map. At an operation 1106, the blocked image template is placed at a location on the image of the measurement structure and compared with the image of the measurement structure using the weight map as the attenuation factor. The similarity indicator is calculated for this matching position. The similarity indicator can include a normalized cross-correlation, a cross-correlation, a normalized correlation coefficient, a correlation coefficient, a normalized difference, a difference, a normalized sum of a difference, a sum of a difference, a correlation, a normalized correlation, a normalized square of a difference, a square of a difference, and/or a combination thereof. The similarity indicator can also be user defined. In some embodiments, multiple similarity indicators can be used or different similarity indicators can be used for different areas of either the image template or the image itself.

At an operation 1107, the blocking image template is moved or slid to a new location on the image of the measurement structure. At the new sliding position, the overlap (or intersection) area between the blocked feature and the blocked image template varies. In an embodiment, a total weighting C can be used to calculate the similarity score (i.e., a similarity indicator or another measure of matching between the blocked image template and the image of the measurement structure). The total weight C is calculated by multiplying the weight map A of the image and the weight map B of the blocked image template. During sliding, the intersection area changes, and so A times B changes, resulting in a change of weight C. The weight map B of the blocked image template can be an initial weight map B', which remains constant for the blocked image template, but where an adaptive weight map is generated by a multiplication or other convolution of the weight map A of the image and the initial weight map B' which can be calculated for each sliding position. In either case (i.e., if the weight map B varies or if the weight map B is a constant initial weight map B'), this generates an adaptive weight map per sliding position and means that an adaptive weight map is used to calculate the similarity per sliding position. In other embodiments, at the new position, the weight map can be updated based on the image of the measurement structure (or a property such as pixel value, contrast, sharpness, etc. of the image of the measurement structure), the weight map can be updated based on blocking image template (such as updated based on an overlap or convolution score), or the weight map can be updated based on the blocked image template (such as updated based on distance of the blocked image template from an image or focus center). From the operation 1107, the method 1100 continues back to the operation 1106 where the blocking image template is compared to another position on the image of the measurement structure based on the update weight map. The iteration between the operation 1106 and 1107 continues until the blocked image template is match to a position on the image of the measurement structure or sliding through all test image locations. Matching can be determined based on a threshold or maximum similarity indicator. Matching can comprise matching multiple occurrences based on a threshold similarity score. At an operation 1108, the blocked image template is matched to a position on the image of the measurement structure. After the blocked image template is matched, a measure of offset or process stability can be determined—such as an overlay, an edge placement error, a measure of offset-based on the matched position. As described above, method 1100 (and/or the other methods and systems described herein) is configured to provide a generic framework to match an image template to a position on an image of a measurement structure based on a weight map.

Figure 12:
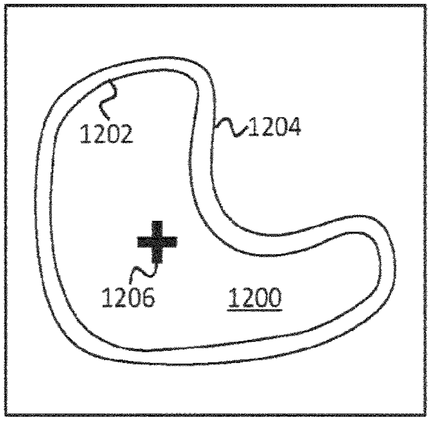
FIG. 12 illustrates an example synthetic contour template, according to an embodiment.

FIG. 12 illustrates an example contour image template, according to an embodiment. A contour image template 1200 comprises an inner contour line 1202 and an outer contour line 1204. The inner contour line 1202 and the outer contour line 1204 are shown as continuous, but can instead be discontinuous. The contour image template 1200 can be filled with or associated with pixel values, including grayscale values, and used as an image template for template matching. For example, inside the inner contour line 1202, the contour image template 1200 can have a grayscale value corresponding to a black value. Outside the outer contour line 1204, the contour image template 1200 can have a grayscale value corresponding to a white value. In between the inner contour line 1202 and the outer contour line 1204, a pixel values can correspond to grayscale values of gray. The pixel values of the contour image template 1200 can be adjusted based on user input. Alternatively, the pixel values of the contour image template 1200 can be defined by a function, such as a sigmoid function, as a function of position (where example position functions include distance from a template edge, distance from a template center, distance to a contour line, etc.) The contour image template 1200 can also comprises a "hot spot" or reference point 1206, which is used to determine a measure of offset relative to other templates, patterns, or features of the image of the structure.

Figure 13A:
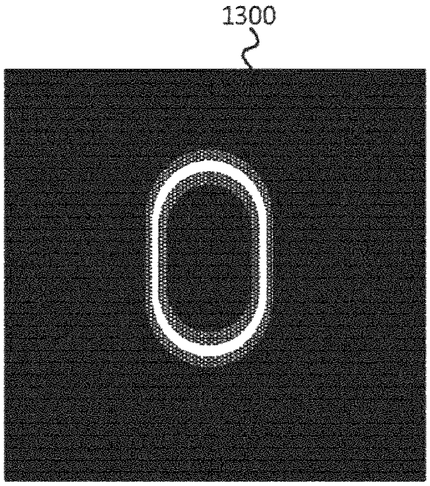
FIGS. 13A and 13B illustrate an example synthetic image template for template matching with polarity matching, according to an embodiment.
Figure 13B:
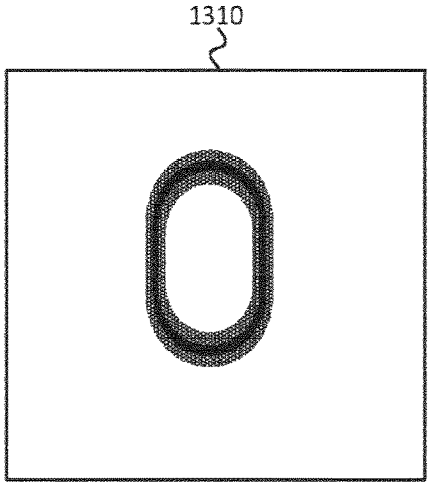

FIGS. 13A and 13B illustrate an example synthetic image template for template matching with polarity matching, according to an embodiment. FIG. 13A depicts a synthetic image template 1300 which has with pixel values (or colors on a grayscale). FIG. 13B depicts a synthetic image template 1310, which corresponds to a reversed image polarity version of the synthetic image template 1300 of FIG. 13A. Because images are acquired at different time and/or different locations, image polarity can vary from image to image even for the same structure. In optical images, polarity may be a function of direction of illumination and location of focal plane. In SEM images, polarity can be a function of electron energy and layer thicknesses. In some cases, image template polarity can be full reversed. In some cases, an image polarity may not be fully reversed but can instead be scaled or the dynamic range reduced or enlarged. For scaled polarity, contrast between features can be reduced and black and white features can appear in grayscale. An image template can have a single polarity value (for example ranging between −1 and 1) which adjusts pixel values (where pixel values are generally between 0 and 255) of the image template linearly. The image template can also comprise a polarity map, where a portion of the image can have one polarity and another portion of the image has an opposite polarity. This can be helpful in matching images where an underlying layer varies in thickness as substrate thickness can affect polarity. Polarity can be a feature of synthetic image templates, and image templates generated from one or more obtained image.

Figure 14:
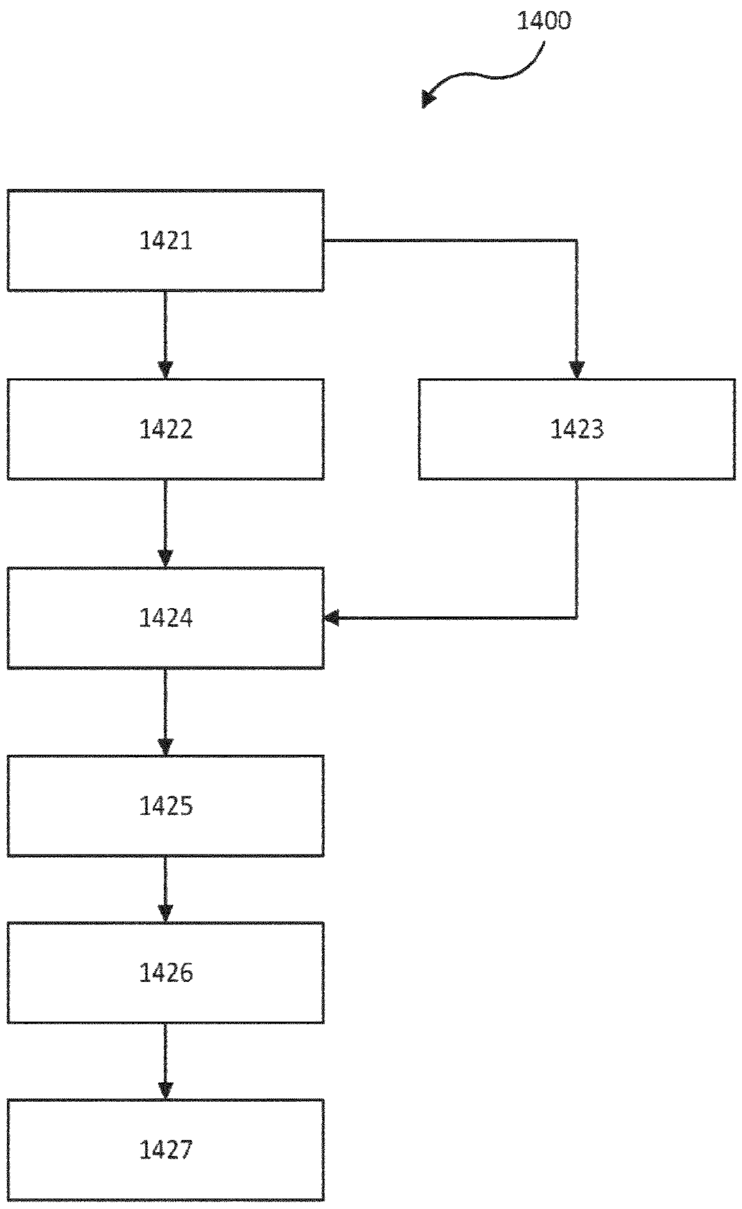
FIG. 14 illustrates an exemplary method for generating an image template based on a synthetic image, according to an embodiment.

FIG. 14 illustrates an exemplary method 1400 for generating an image template based on a synthetic image, according to an embodiment. Each of these operations is described in detail below. The operations of method 1400 presented below are intended to be illustrative. In some embodiments, method 1400 may be accomplished with one or more additional operations not described, and/or without one or more of the operations discussed. Additionally, the order in which the operations of method 1400 are illustrated in FIG. 14 and described below is not intended to be limiting. In some embodiments, one or more portions of method 1400 may be implemented (e.g., by simulation, modeling, etc.) in one or more processing devices (e.g., one or more processors). The one or more processing devices may include one or more devices executing some or all of the operations of method 1400 in response to instructions stored electronically on an electronic storage medium. The one or more processing devices may include one or more devices configured through hardware, firmware, and/or software to be specifically designed for execution of one or more of the operations of method 1400, for example.

At an operation 1421, an artifact is selected from a layer of a measurement structure. The artifact or feature can be a physical feature, such as a contact hole, a metal line, an implantation area, etc. The artifact can also be an image artifact, such as edge blooming, or a buried or blocked artifact. A shape for the artifact is determined. The shape can be defined by GDS format, a lithograph model simulated shape, a detected shape, etc. At an operation 1422, one or more process model is used to generate a top-down view of the artifact. The process model can include a deposition model, an etch model, an implantation model, a stress and strain model, etc. The one or more process model can generate a simulated shape for an as-fabricated artifact. At a parallel operation 1423, one or more graphical input is selected for the artifact. The graphical input can be an image of the as-fabricated artifact. The graphical input can also be user input or based on user knowledge, where a user updates the as-fabricated shape based in part experience of similar as-fabricated elements. For example, the graphical input can be corner rounding or smoothing.

At an operation 1424, the top-down view of the artifact is updated based on the graphical input or user input. At an operation 1425, a scanning electron microscopy model is used to generate a synthetic SEM image of the artifact. An image template is then generated based on the synthetic SEM image. At an operation 1426, the image template is updated based on an acquired SEM image for the artifact as-fabricated. At an operation 1427, the image template is matched to an image of the artifact as-fabricated. The image template can further comprise a weight map, and can be matched to the artifact as-fabricated even when that artifact is partially blocked. As described above, method 1400 (and/or the other methods and systems described herein) is configured to provide a generic framework to generate an image template based on a synthetic image.

Figure 15A:
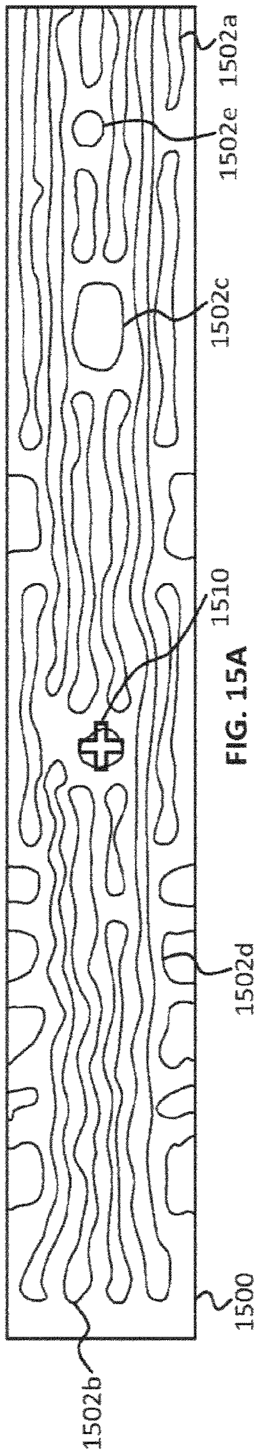
FIGS. 15A-15E illustrate an example composed template generated based on an image, according to an embodiment.

FIGS. 15A-15E illustrate an example composed template generated based on an image, according to an embodiment. FIG. 15A depicts an example image 1500 for a non-repeating device structure on an IC. However, it will be appreciated that the present disclosure is not limited thereto. Non-repeating device structures, such as can be found in random logic layers, do not have regular or periodic artifacts for which template matching or offset measurement can be performed. For an image template having multiple features on the same layer, template matching can involve matching multiple of the feature of the image template with the test image. Multiple feature mapping can increase matching robustness.

In order to create multiple matching points, a composed template is selected. Various artifacts of the example image 1500 are selected for matching. The artifacts are selected based on their suitability for matching. Suitability includes elements such as artifact stability and robustness, where artifacts which are not reproducible or with high natural variability (e.g., metal lines) are less useful for matching.

Suitability includes image property elements, where artifacts should be visible in images in order to be used for template matching. Artifacts can be selected based on size, average brightness, contrast with neighboring elements, edge thicknesses, intensity log slope (IIS), etc. A reference image, such as the example image 1500, can be analyzed to identify artifacts for a composed template. For a layer which contains multiple elements, the most suitable elements can be selected.

A group of patterns or artifacts for a processes layer can be selected based on pattern size, contrast, ILS, stability, etc. The selection can be based on (1) pattern grouping according to pattern sizes, including from GDS data, (2) on one or more of predicted ILS, cross-sectional area, edge properties, process stability, etc. determined via a process model, and/or (3) estimate SEM image contrast via a SEM simulator or model, such as eScatter or CASINO.

The composed template can further comprise a weight map and a deemphasized area. For a composed template including the group of patterns, a weight map can be assigned which indicates variation of priority or emphasis, variations in ILS, variations in contrast, distinctions between edge regions or contours and center or filled portions of the image template, blocked portion in the template area, etc. By deemphasizing an area of the composed template, e.g., by weighting it relatively less than other areas, various "do-not-care" or deemphasized areas are created. These deemphasized areas can correspond to artifacts on the image which are not matched-because they are not stable enough to match, or because they are not regular and can vary from location to location, for example. The example image 1500 contains line drawings corresponding to various features 1502*a*-1502*e* for the non-repeating device. As depicted, the features 1502*a*-1502*e* display different levels of variability, with long narrow features displaying rippling and other variability (such as the features 1502*a*, 1502*b*), while rounder figures are more regular (such as the features 1502*b*, 1502*d*, 1502*e*). A level of feature stability can be determined based on multiple images acquired for different fabricated versions of the example image (e.g., for multiple locations of the same pattern on a wafer or for multiple wafers containing instances of the same pattern). A "hot spot" or reference point 1510 is also shown, where the reference point 1510 can be selected based on the image (e.g., at the center of the image) or added to the image and may not be a part of the structure or image itself.

Figure 15B:
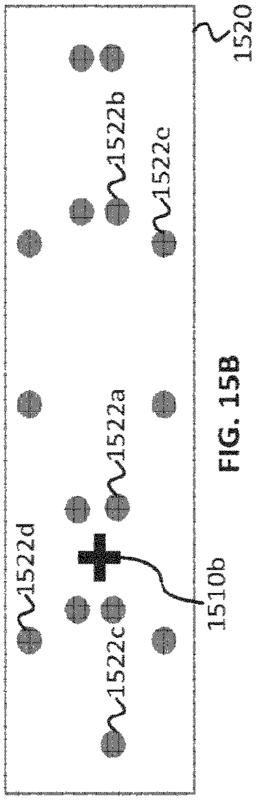

FIG. 15B depicts an example of composed template 1520 corresponding to a first layer of the structure of the example image 1500. The composed template 1520 contains various example patterns 1522*a*-1522*e* with defined spatial relationships between the patterns. Each of the example patterns 1522*a*-1522*e* in the composed template 1520 is circular, but any appropriate shape can be selected or otherwise used. Further, each of the patterns 1522*a*-1522*e* in the composed template 134 can have a pixel value, contour, weight map, polarity, etc. as described in reference to image templates generally. The patterns in the composed template 1520 can further comprise a weight map, which can be in addition to weight map(s) of the composed template 1520 (e.g., the example patterns 1522*a*-1522*e* can each have the same or a different weight maps and the composed template 1520 can have an additional weight map corresponding to the composed template 1520 in full). The weight map of the composed template 1520 is weighted highly for the (selected) patterns (or identified artifacts) and is deemphasize or weighted lightly for the areas outside of the patterns. The weighting therefore creates a "do-not-care" region or deemphasized region, which is substantially excluded from template matching, and focusses the template matching on matching of the constituent patterns. The deemphasized regions or areas can be weighted as zero, substantially equal to zero, or otherwise lower or more lightly than selected artifacts or patterns. A "hot spot" or reference point 1510*b* is also shown, where the reference point 1510*b* can be selected based on the image (i.e., the total image including multiple layers) or added to the image and may not be part of the structure itself. For example, for the composed template 1520, the reference point 1510*b* does not correspond to a feature of the template.

Figure 15C:
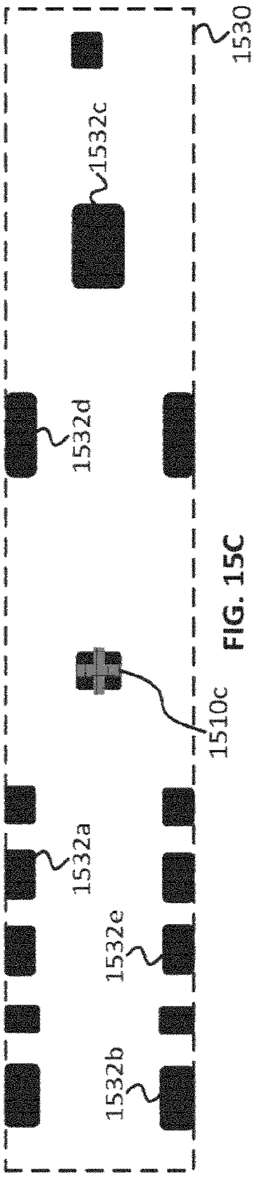

FIG. 15C depicts an example composed template 1530 corresponding to a second layer of the structure of the example image 132. The first layer and the second layer can have any spatial or blocking relationship—in some cases the first layer and the second layer can be the same layer of the measurement structure. The composed template 1530 contains various example patterns 1532*a*-1532*e* with defined spatial relationships between the patterns. Each of the example patterns 1532*a*-1532*e* is shown as a rounded rectangle, but any appropriate shape can be selected and multiple shapes can be selected even within a single composed template. Each of the patterns can have a pixel value, contour, weight map, polarity, etc. as described in reference to image templates generally. The composed template 1530 further comprise a weight map as previously described in reference to composed template 1520. The "do-not-care" region or deemphasized regions of more than one composed template can overlap and artifacts which are selected for one composed template can correspond to a deemphasized region in another composed template. A "hot spot" or reference point 1510*c* is also shown, where the reference point 1510*c* again can be selected based on the image or added to the image and may not be part of the structure itself.

Figure 15D:
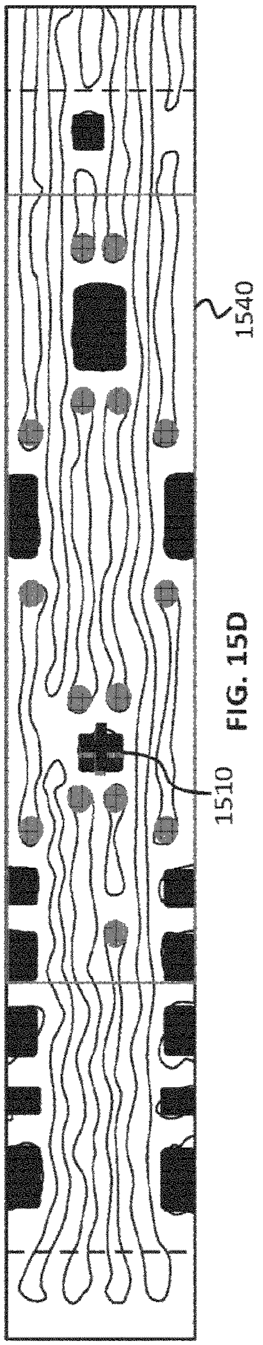

FIG. 15D depicts the example composed template 1520 of FIG. 15B and the example composed template 1530 of FIG. 15C matched to positions on the example image 1500 of FIG. 15A, in an overlaid image 1540. A measure of offset, which can be a measure of alignment, a measure of overlay, a measure of EPE, etc., can be determined based on a relative position of the reference points 1510*b*, 1510*c* from each of the composed templates 1520, 1530. Each of the composed templates (i.e., 1520 and 1530) contain a reference point or "hot spot" 1510*b*, 1510*c*, where the reference points overlap in the x-y plane for a reference or "gold" image of the structure. A measure of overlay, or offset in some embodiments, can be determined by matching each of the composed templates 1520 and 1530 to the example image 1500. The independent matching of the composed templates (i.e., 1520 and 1530) to the example image 1500 identifies a location for the reference point of the composed template on the example image 1500. Based on a comparison of the two (or more) reference points 1510*b*, 1510*c* as-matched, a measure of offset or overlay can be determined. The reference points 1510*b*, 1510*c* need not correspond to a feature or artifact selected for matching in the composed template (i.e., a pattern of the composed template)—the reference point 1510*b*, 1510*c* can instead occur in the deemphasized or "do-not-care" region. The reference point 1510 may not correspond to a physical element of the image of the reference structure. As the reference points 1510*b*, 1510*c* are co-located for a "golden" image, the distance or vector between the reference points of relative layers is a measure of layer-to-layer shift.

Figure 15E:
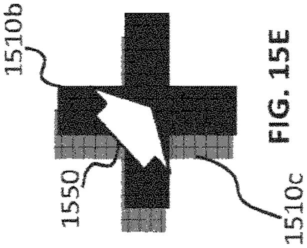

FIG. 15E depicts the reference point 1510*b* of the composed template 1520 and the reference point 1510*c* of the composed template 1530. The reference points 1510*b* and 1510*c* are enlarged relative to the overlaid image 1540 of FIG. 15D but maintain the same relationship. An offset vector 1550 is shown, which corresponds to the layer-to-layer shift between the composed templates 1520 and 1530 matched to the example image 1500. The reference point 1510*b* of the composed template 1520 of FIG. 15B occurs in a deemphasized or "do-not-care" region of that template. The reference point 1510*c* of the composed template 1530 of FIG. 15C corresponds to a feature of that template. By using a composed template, matching can be performed between layer which do not have overlapping features, but instead where features of multiple layers are interspersed. A measure of overlay for features which do overlap can also be determined based on the measure of offset or other measure of layer-to-layer shift.

Figure 16:
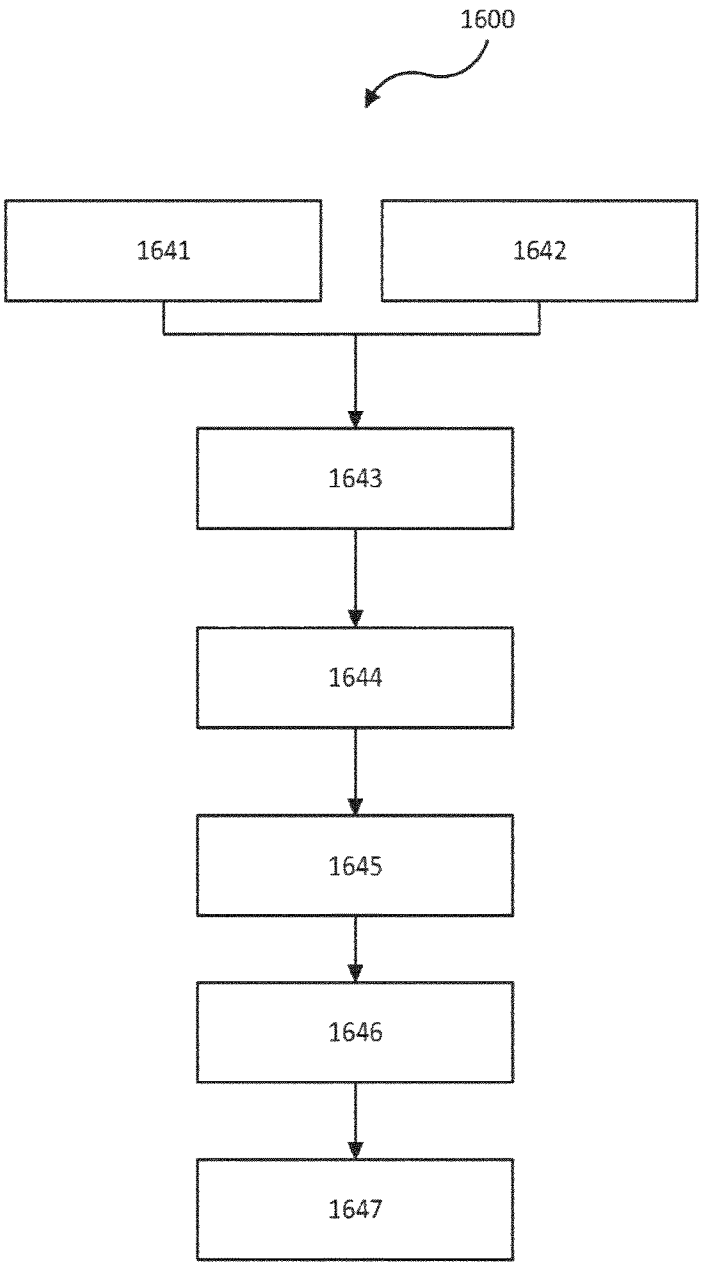
FIG. 16 illustrates an exemplary method for generating a composed template, according to an embodiment.

FIG. 16 illustrates an exemplary method 1600 for generating a composed template, according to an embodiment. Each of these operations is described in detail below. The operations of method 1600 presented below are intended to be illustrative. In some embodiments, method 1600 may be accomplished with one or more additional operations not described, and/or without one or more of the operations discussed. Additionally, the order in which the operations of method 1600 are illustrated in FIG. 16 and described below is not intended to be limiting. In some embodiments, one or more portions of method 1600 may be implemented (e.g., by simulation, modeling, etc.) in one or more processing devices (e.g., one or more processors). The one or more processing devices may include one or more devices executing some or all of the operations of method 1600 in response to instructions stored electronically on an electronic storage medium. The one or more processing devices may include one or more devices configured through hardware, firmware, and/or software to be specifically designed for execution of one or more of the operations of method 1600, for example.

At an operation 1641, an image of a measurement structure is acquired or obtained. The image can be an optical image, a scanning electron microscopy image, another electromagnetic image, etc. The image can comprise multiple images, such as an averaged image. The image can contain information about contrast, intensity, stability, and size. At an operation 1642, a synthetic image of the measurement structure is obtained. The synthetic image can be obtained from one or more models, refined based on an acquired image, or generated based on any previously discussed method. At an operation 1643, at least two artifacts of the image are obtained or selected. The image can be either the obtained image or an as-measured image or the synthetic image, including any combination thereof. The at least two artifacts can comprise physical elements of the measurement structure, or image artifacts which are not physical elements of the measurement structure or which correspond to an interaction between two or more physical elements but are not a physical element themselves. The artifacts can be selected based on at least one of artifact size, artifact contrast, artifact process stability, artifact intensity log slope, or a combination of these factors. At an operation 1644, a spatial relationship between the at least two artifacts is determined. The spatial relationship can be a distance, a direction, a vector, etc. The spatial relationship can be fixed or can also be adjustable and matchable to the image. A fixed spatial relationship can still be scaled or rotated during template matching (i.e., where the spatial relationships between the patterns of the composed template are linearly adjusted together).

At an operation 1645, a composed template is generated, based on the at least two artifacts and the spatial relationship. At an operation 1646, a weight map is generated for the composed template. The composed template comprises a weight map, and a deemphasized area. The deemphasized area is weighted less than the at least two artifacts. Additional artifacts can also be selected for the deemphasized area, such as based on small artifact size, large artifact size, insufficient artifact contrast, artifact process instability, insufficient artifact intensity log slope, or a combination thereof. The composed template can comprise an image template for each of the at least two artifacts, which may further comprise a weight map for the individual element of the pattern or the elements of the pattern as a whole. At an operation 1647, the composed template is matched to a position on the image of the measurement structure. The matching can comprise any matching method as previously described. As described above, method 1600 (and/or the other methods and systems described herein) is configured to provide a generic framework to generate an image template based on a synthetic image.

Figure 17:
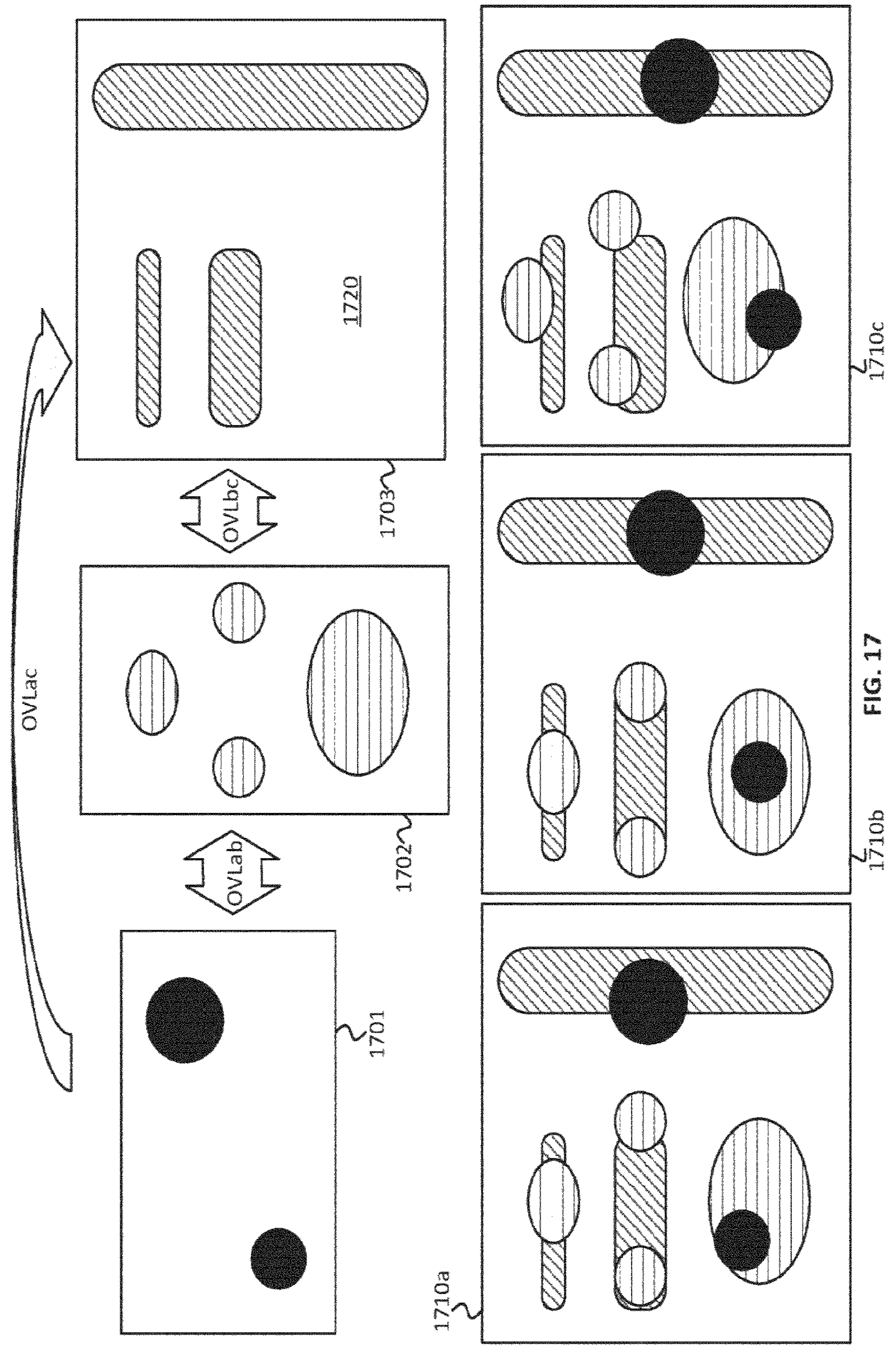
FIG. 17 illustrates a schematic representation of determining measures of offset based on multiple image templates, where each template itself comprises a group of patterns, according to an embodiment.

FIG. 17 illustrates a schematic representation of determining measures of offset based on multiple image templates, where each template itself is comprises of a group of patterns, according to an embodiment. A first composed template 1701, a second composed template 1702, and a third composed template 1703 are depicted. A set of images of the measurement structure (e.g., images 1710*a*, 1710*b*, and 1710*c*) is also depicted. A measure of offset, which can be a measure of overlay, is determined for the layer-to-layer shift between each of the layers. For example, measure of offset or overlay is determined between the first and second composed templates, the first and third composed templates, and the second and third composed templates.

The composed template can further comprise partially blocked elements, where features of the third composed template 1703 are partially blocked by both features of the first composed template 1701 and features of the second composed template 1702, and the features of the second composed template 1702 are blocked by the features of the first composed template 1701. A weight map comprising the deemnphasized regions can be complemented by a weight map for the pattern or individual elements of the pattern. In some embodiments, the weight maps of the image templates can be adaptively updated during template matching. For example, the weight map of the third composed template 1703 can deemphasize the area depicted as white space (i.e., an area 1720), but can also adaptively deemphasize or weight lightly blocked portions of the image templates during template matching.

Figure 18C:
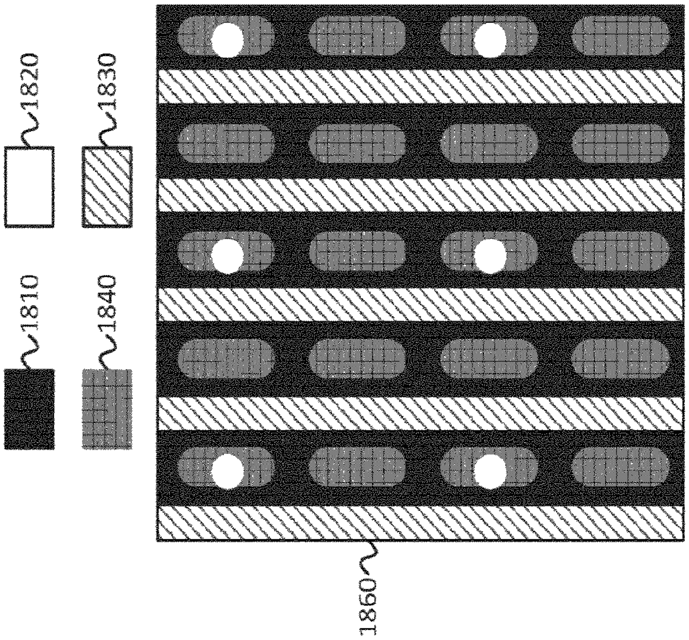
FIGS. 18A-18G depict a schematic representation of per layer template matching, according to an embodiment.
Figure 18A:
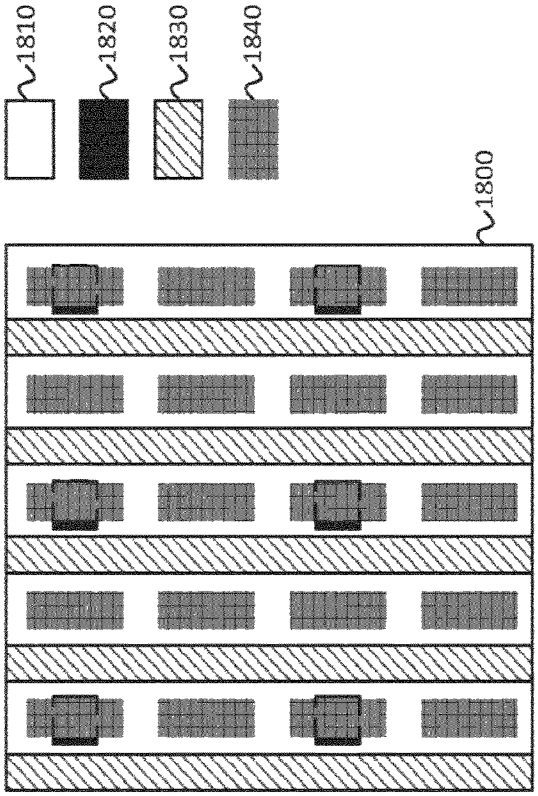

FIGS. 18A-18G depict a schematic representation of per layer template matching. FIG. 18A depicts an example schematic 1800 for a measurement structure. The example schematic 1800 can be a GDS (or "GDSII") or plan for a fabricated structure. The example schematic 1800 contains various layers, including an un-patterned layer 1810, a metal layer 1820, a first feature layer 1830, and a second feature layer 1840. The example schematic 1800 an example geometry provided for ease of explanation of per layer template matching and as such the structure is exemplary only. The un-patterned layer 1810 can be a layer for which no fabrication step is performed on a substrate (e.g., a bare silicon or silicon dioxide layer) or can be a layer for which one or more uniform fabrication step is performed on a substrate (uniform dielectric deposition, for example). The metal layer 1820 can be a via layer, where the metal of the metal layer 1820 electrically connects one or more layers of the structure described by the example schematic 1800 or even electrically connects one of more layers of the structure of the example schematic 1800 to a layer in another wafer or measurement structure. The first feature layer 1830 and the second feature layer 1840 can be comprised of the same or different materials. In the example schematic 1800, the first feature layer 1830 and the second feature layer 1840 can be comprised of a metal and may have similar chemical, optical, or electronic properties. The metal layer 1820, the first feature layer 1830 and the second feature layer 1840 can correspond to different fabrication steps—e.g., different lithography, etch, deposition, planarization, etc. steps. The layers of the example schematic 1800 can include more or fewer layers, including more or fewer features, and can include multi-layer features. In the example schematic, features of the metal layer 1820 and the second feature layer 1840 overlap, which can lead to features of one layer being blocked by features of another layer in images (optical images, electron microscopy images, etc.).

Figure 18B:
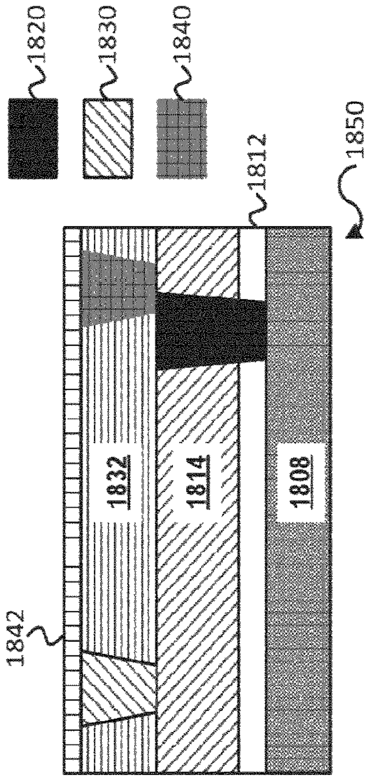

FIG. 18B depicts a cross-section 1850 of the example schematic 1800 of FIG. 18A. The cross-section 1850 depicts a substrate 1808, a first un-patterned layer 1812, the metal layer 1820 (as in FIG. 18A), a second un-patterned layer 1814, the first feature layer 1830 (as in FIG. 18A), a third un-patterned layer 1832, the second feature layer 1840 (as in FIG. 18A), and an un-patterned cap layer 1842. The layers of the cross-section 1850 are example layers only, provided for ease of description, and the cross-section (or the measurement structure) can comprise more or fewer layers. The metal layer 1820 can be a via which is buried within or through the first un-patterned layer 1812 and the second un-patterned layer 1814. The metal layer 1820 can connect the substrate 1808 and the second feature layer 1840. The first feature layer 1830 and the second feature layer 1840 can both contain features which are buried within or through the third un-patterned layer 1832, but the first feature layer 1830 and the second feature layer 1840 can be patterned using different lithography masks or different lithography steps. Thus, the features of the first feature layer 1830 and the second feature layer 1840 can experience offset from each other as a result of alignment, exposure, development, etch, deposition, etc. variations.

FIG. 18C depicts a synthetic image 1860 corresponding to the example schematic 1800 of FIG. 18A. The synthetic image 1860 includes modeling of fabricated feature shape based on the GDS information contained in the schematic 1800. The synthetic image 1860 depicts, for example, angle rounding which occurs on the square and rectangular features of the example schematic 1800. The synthetic image comprises an image area corresponding to the un-patterned layer 1810 of the example schematic 1800, features corresponding to the metal layer 1820 of the schematic 1800, features corresponding to the first feature layer 1830 of the schematic 1800, and features corresponding to the second feature layer 1840 of the schematic 1800. In the synthetic image 1860, features of the metal layer 1820 are depicted as white while areas corresponding to the un-patterned layer 1810 are depicted as black. The white of the features of the metal layer 1820 can correspond to an expected image intensity in the synthetic image 1860, such as can correspond to scattered electrons reflected from a metal in contact with a ground source of electrons in an SEM image. The black of the areas of the un-patterned layer 1810 can correspond to an expected image intensity in the synthetic image 1860, such as can correspond to a dearth of scattered electrons emitted from an insulating layer. The colors of the synthetic image 1860 are examples colors only. The features of the first feature layer 1830 are depicted in hatched sections, while the features of the second feature layer 1840 are depicted as grey rounded rectangles. The differences between the shapes of the synthetic image 1860 and example schematic 1800 of the FIG. 18A can be due to optical effects, fabrication effects, etc. The difference between the example schematic 1800 and the synthetic image 1860 can be determined based on optical modeling, process modeling, microscopy modeling, etc.

Figure 18G:
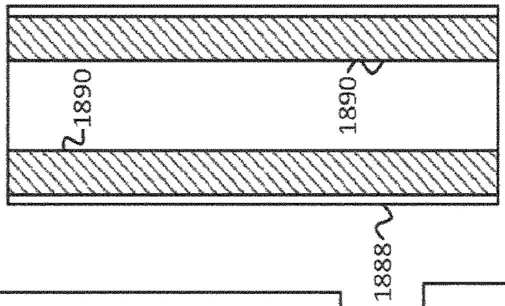
Figure 18E:
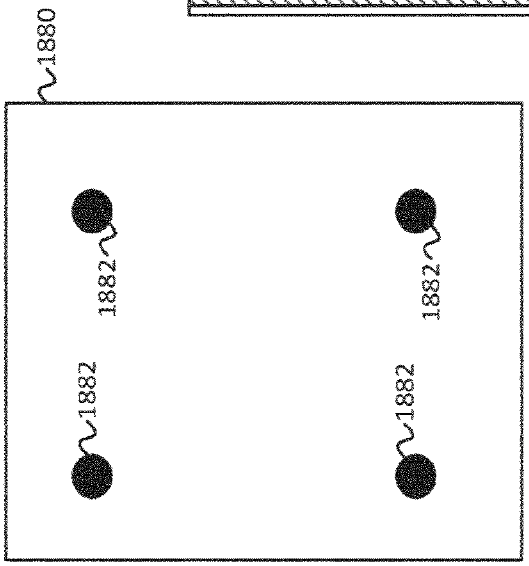
Figure 18F:
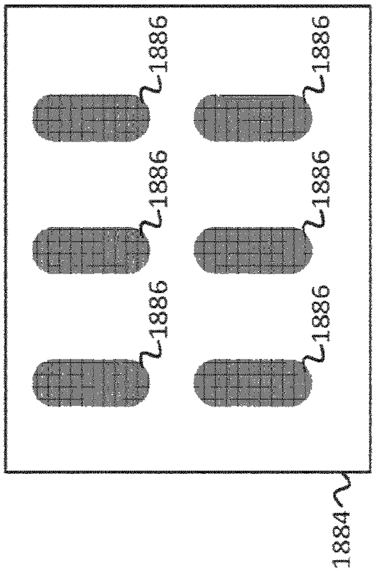
Figure 18D:
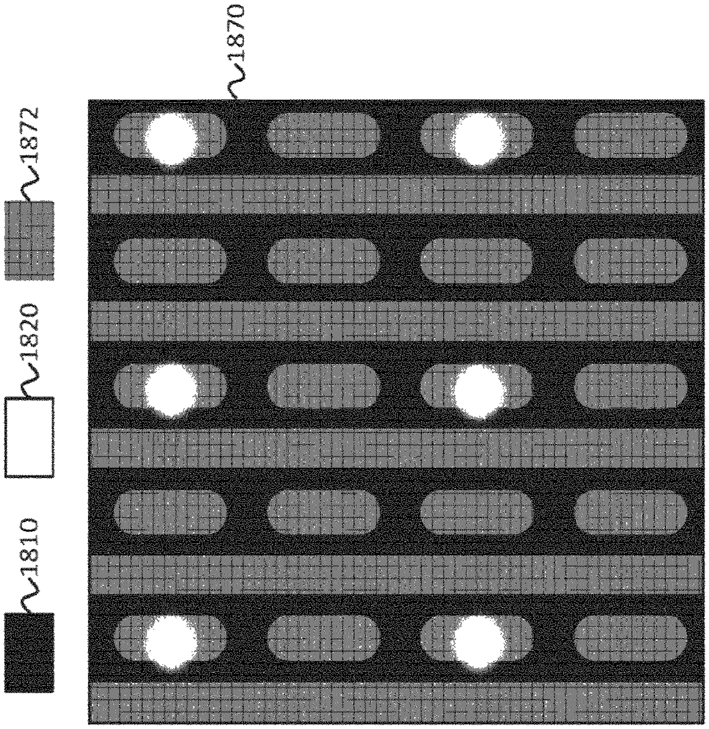

FIG. 18D depicts an example obtained image 1870 corresponding to the example schematic 1800 of FIG. 18A. The obtained image 1870 can be an SEM image, an optical image, etc. The obtained image 1870 comprises features which can be correlated to areas of the un-patterned layer 1810, features of the metal layer 1820, and features 1872 of the first feature layer and the second feature layer (e.g., the first feature layer 1830 and the second feature layer 1840 of the example schematic 1800 of FIG. 18A). The un-patterned layer 1810, as represented by black fill, can correspond to areas of low electron or photon scattering. The features of the metal layer 1820, as represented by the white fill, can correspond to areas of high electron or photon scattering. The features of the metal layer 1820 can be so bright or produce so much photon or electron scattering that the features have soft edges (as depicted). The features 1872 of the first feature layer and the second feature layer can comprise different material properties (i.e., different thicknesses of the same material, different roughness of the same material, etc.) or different materials altogether. However, even if the features 1872 of the first feature layer and the second feature layer are different, they may have the same or different image qualities—e.g., brightness, sharpness, etc. The features 1872 of the first feature layer and the second feature layer, as represented by gray fill, can correspond to areas of medium electron or photon scattering. The features of the metal layer 1820 can be so bright (e.g., reflective or scattering) that buried features of the metal layer 1820 can obscure or otherwise block features 1872 of the first feature layer and the second feature layer, even if the features of the metal layer 1820 are buried beneath the features 1872 of the first feature layer and the second feature layer.

FIG. 18E depicts an example template 1880 for the features of the metal layer 1820 of the obtained image 1870. The example template 1880 contains multiple individual templates 1882 or sub-templates, each corresponding to a feature of the metal layer 1820 of the obtained image 1870, spatially arranged into a composite template. The spatial relationship between the individual templates 1882 can comprise information stored in the example template 1880. The example template 1880 can further comprise one or more weight maps—e.g., a weight map for each of the individual templates 1882, a total weight map, etc. The example template 1880 can be matched to the obtained image 1870 based on template matching, including using methods previously described. The example template 1880, which corresponds to unblocked features, can be matched to the obtained image 1870 before templates which correspond to blocked features.

FIG. 18F depict an example template 1884 for features of the second feature layer 1840 of the synthetic image 1860 (e.g., some of the features 1872 of the first feature layer and the second feature layer of the obtained image 1870). The example template 1884 contains multiple individual templates 1886 or sub-templates, each corresponding to a feature of the second feature layer 1840 of the synthetic image 1860—which are some of the features 1872 of the first feature layer and the second feature layer of the obtained image 1870—spatially arranged into a composite template. The spatial relationship between the individual templates 1886 can comprise information stored in the example template 1884. The example template 1884 can further comprise one or more weight maps—e.g., a weight map for each of the individual templates 1886, a total weight map, etc. The example template 1884 can be matched to the obtained image 1870 based on template matching, including using methods previously described. The example template 1884, which corresponds to both blocked and unblocked features, can be matched to the obtained image 1870 after the example template 1880 for the features of the metal layer 1820—which block some but not all of the features of the second feature layer of the synthetic image 1860. Even though the features 1872 of the first feature layer and the second feature layer of the obtained image 1870 have similar image properties, these features are matched to templates separated. The features of a template correspond to features of a single lithography step (or a subset of features of a single lithography step) for which a spatial relationship is known and set by lithography (optical lithography, DUV lithography, electron beam assisted lithography, etc.).

FIG. 18G depict an example template 1888 for features of the first feature layer 1830 of the synthetic image 1860 (e.g., some of the features 1872 of the first feature layer and the second feature layer of the obtained image 1870). The example template 1888 contains multiple individual templates 1890 or sub-templates, each corresponding to a feature of the first feature layer 1830 of the synthetic image 1860—which are some of the features 1872 of the first feature layer and the second feature layer of the obtained image 1870—spatially arranged into a composite template. In the example case, the individual templates can be approximately one dimensional. The spatial relationship between the individual templates 1890 can comprise information stored in the example template 1888. The example template 1888 can further comprise one or more weight maps—e.g., a weight map for each of the individual templates 1890, a total weight map, etc. The example template 1888 can be matched to the obtained image 1870 based on template matching, including using methods previously described. The example template 1888, which corresponds to unblocked features, can be matched to the obtained image 1870 before or after the example template 1880 for the features of the metal layer 1820 and before or after the example template 1884 for features of second feature layer 1840 of the synthetic image 1860. Even though the features 1872 of the first feature layer and the second feature layer of the obtained image 1870 have similar image properties, these features are matched to templates separated as previously described.

Figure 19A:
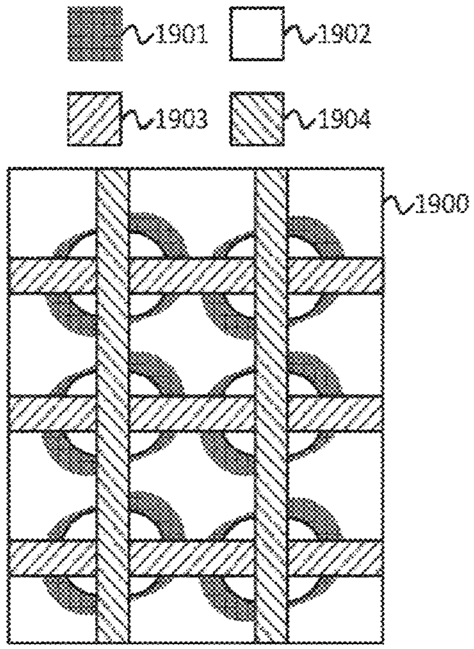
FIGS. 19A-19F depict a schematic representation of using template matching to select a region of interest, according to an embodiment.

FIGS. 19A-19F depict a schematic representation of using template matching to select a region of interest. FIG. 19A depicts an example schematic 1900 for a multi-layer structure. The example schematic 1900 is a schematic provided for ease of explanation and is not a limiting structure orientation. The multi-layer structure comprises a first layer 1901, a second layer 1902, a third layer 1903, and a fourth layer 1904. The features of the first layer 1901 are depicted as multiple repeating gray ellipses which are angled with respect to the long and short axis of the example schematic 1900. The features of the second layer 1902 are depicted as multiple repeating ellipses with white fill and a black border, which are approximately centered on the features of the first layer 1901. The features of the third layer 1903 are depicted as multiple repeating bars filled with upward diagonal hatching oriented parallel to the short axis of the example schematic 1900. The features of the fourth layer 1904 are depicted as multiple repeating bars filled with downward diagonal hating oriented parallel to the long axis of the example schematic 1900. The multiple bars of the third layer 1903 and the multiple bars of the fourth layer 1904 intersect at approximately the center of the features of the first layer 1901 and the second layer 1902. As depicted, the features of the fourth layer 1904 block the features of the first layer 1901, the second layer 1902, and the third layer 1903. The features of the third layer 1903 block the features of the first layer 1901 and the second layer 1902. The features of the second layer 1902 block the features of the first layer 1901. Blocking of one layer by another can be a physical blocking (i.e., where the first layer 1901 is a buried layer and the fourth layer 1904 is a top layer) but can also or instead be an electronic blocking, optical blocking, or other image induced blocking (e.g., where the first layer 1901 is not an electron scattering material and where the material of the fourth layer 1904 is a good electron scattering material).

Figure 19B:
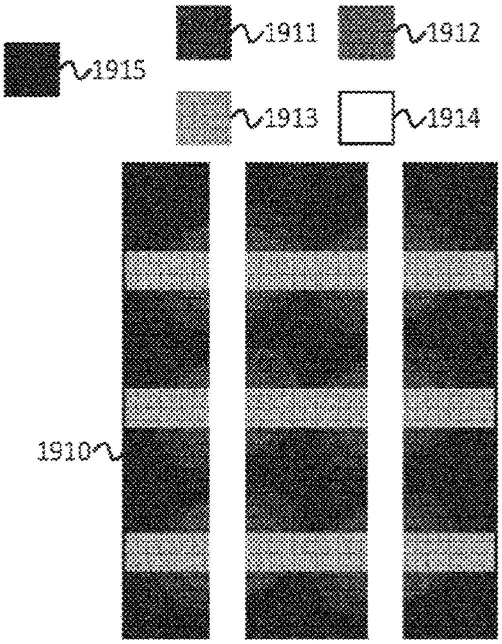

FIG. 19B depicts an example image 1910 obtained for the multi-layer structure described by the example schematic 1900 of FIG. 19A. The example image 1910 is a gray scale image, but can alternatively be a color image or other multi-wavelength image. The example image contains information about the features of the first layer 1901, the second layer 1902, the third layer 1903, and the fourth layer 1904 of the example schematic 1900. The unblocked portions of the first layer 1901 correspond to dark gray areas 1911 of the example image 1910. The unblocked portions of the second layer 1902 correspond to medium gray areas 1912 of the example image 1910. The unblocked portions of the third layer 1903 correspond to light gray areas 1913 of the example image 1910. The unblocked portions of the fourth layer 1904 (that is, all of the areas of the fourth layer 1904) correspond to white areas 1914 of the example image 1910. Un-patterned areas of the example schematic 1900 of FIG. 19A appear as black areas 1915 in the example image 1910. The example image 1910 is provided for ease of description only and is not limiting. The example image 1910 is provided as an example image for which a region of interest can be identified based on template matching—as further as an example image for which image quality enhancement can be performed. The example image 1910 is a gray scale image for which some features are hard to distinguish (e.g., are close in color or pixel value). Further, the example image 1910 contains some areas which are very dark (e.g., the black areas 1915 and the dark gray areas 1911) and some areas which are very bright (e.g., the white areas 1914). Because the pixel values of the example image 1910 may have a wide range, simply expanding the range of the pixel values (e.g., brightening or darkening the example image 1910) may not make features clearer or more distinguishable. Although in this example color saturation is used as the image quality factor for enhancement, analogous explanations could be made for image sharpening, image softening, and other image enhancement techniques. In order to select a region of interest—for image quality enhancement or for other reasons such as segmentation, template matching, etc.—areas of the image corresponding to specific layers can be selected.

Figure 19C:
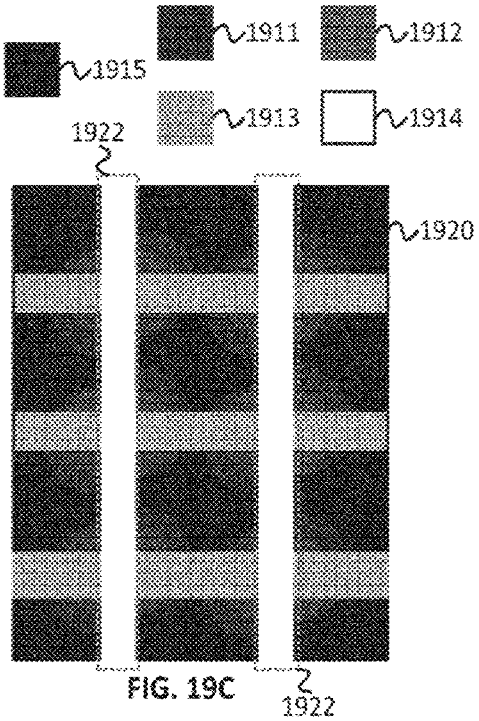

FIG. 19C depicts an example template matching 1920. The example template matching 1920 comprises a first image template, which is depicted as dotted rectangles 1922, corresponding to the fourth layer 1904 of the example schematic 1900 of FIG. 19A matched to the example image 1910 of FIG. 19B. The fourth layer 1904 of the example schematic 1900 corresponds to the white areas 1914 of the example image 1910. By matching the template corresponding to the fourth layer 1904 (e.g., to features of the fourth layer 1904) to the example image 1910, the white areas 1914 of the example image 1910 can be selected or deselected. The example template matching 1920 can be used to select the regions within the dotted rectangles 1922, to exclude the regions within the dotted rectangles 1922, to locate an area or region based on the location of the regions within the dotted rectangles 1922 (e.g., proximity location), to segment the image, etc. One or more region of interest can be identified based on the areas within the dotted rectangles 1922. In a following example, the areas within the dotted rectangles 1922 will be excluded from a region of interest.

Figure 19D:
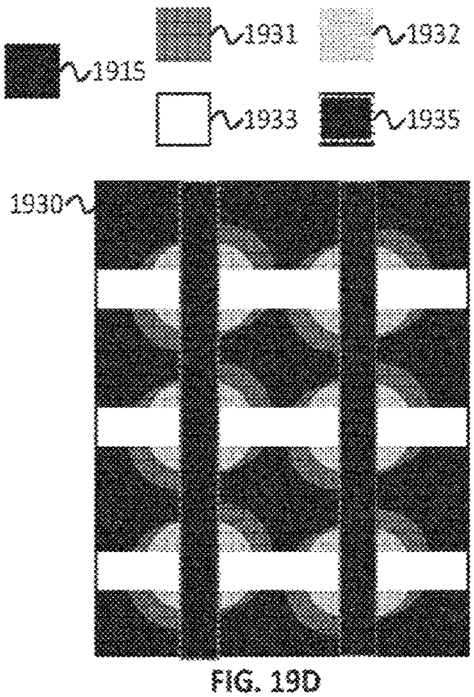

FIG. 19D depicts an example region of interest 1930 determined based on the template matching 1920 of FIG. 19C. In this example, the areas of the dotted rectangles 1922, which correspond to the white areas 1914 of the example image 1910 and to the fourth layer 1904 of the example schematic 1900, are excluded from the region of interest 1930. The region of interest 1930 in this example comprises the areas of the example image 1910 which do not correspond to the dotted rectangles 1922 of FIG. 19C, although this is for ease of description only and a region of interest can instead be smaller or a subset of the area of the image corresponding or not corresponding to features of a layer identified by template matching. The regions which are excluded from the region of interest are identified by dotted gray rectangles with black fill 1935. The exclusion of one or more areas from a region of interest can be accomplished by blocking images of the portions to be excluded, such as by masking pixel values in excluded regions. The areas not included in the region of interest may not be masked or blocked, but can instead be identified by boundaries or other image artifacts. The region of interest 1930 can correspond to areas identified by template matching to correspond to features of a single layer, a subset of features of a single layer, features of multiple layers, etc. The region of interest 1930 can be used to increase accuracy or speed of template matching for subsequent layers. For example, the region of interest 1930 can be used to generate a probability map for locations of the features of the first layer 1901, the second layer 1902, and the third layer 1903, as features of each of these layers are likely to intersection with the areas excluded from the region of interest 1930. Therefore, template matching for the features of the first layer 1901, the second layer 1902, and the third layer 1903 can be concentrated around the boundaries of the region of interest 1930.

Further, the region of interest 1930 can be used to perform image quality enhancement (as depicted). The exclusion of the regions identified by the dotted gray rectangles with black fill 1935 can allow the region of interest 1930 to be brightened (as depicted) or otherwise enhanced or adjusted. The exclusion of the regions identified by the dotted gray rectangles with black fill 1935 is depicted as if those regions are blocked or otherwise masked from the image. The remaining areas (e.g., the areas of the regions of interest 1930) can then be color adjusted such that the colors are further apart or more distinguishable. As an example, the unblocked portions of the first layer 1901, which corresponded to dark gray areas 1911 of the example image 1910, can be brightened to correspond medium gray areas 1931. The unblocked portions of the second layer 1902, which correspond to medium gray areas 1912 of the example image 1910, can be brightened to correspond to light gray areas 1932. The unblocked portions of the third layer 1903, which corresponded to light gray areas 1913 of the example image 1910, can be brightened to correspond to white areas 1933. Un-patterned areas of the example schematic 1900 of FIG. 18A, which appeared as black areas 1915 in the example image 1910, can remain as the black areas 1915. The region of interest 1930 can have image quality enhancement applied as described above or using other standard algorithms. More than one region of interest can be identified in an image by template matching. Overlapping regions of interest can also be identified, based on matching of multiple templates. In some cases, the union, intersection, complement, etc. of multiple regions of interest can provide even greater specificity or further identify another region of interest for an image.

Figure 19F:
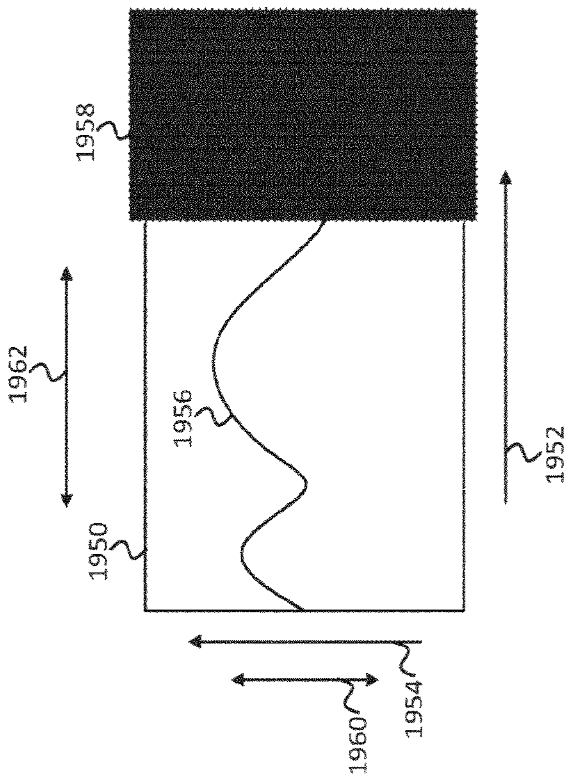
Figure 19E:
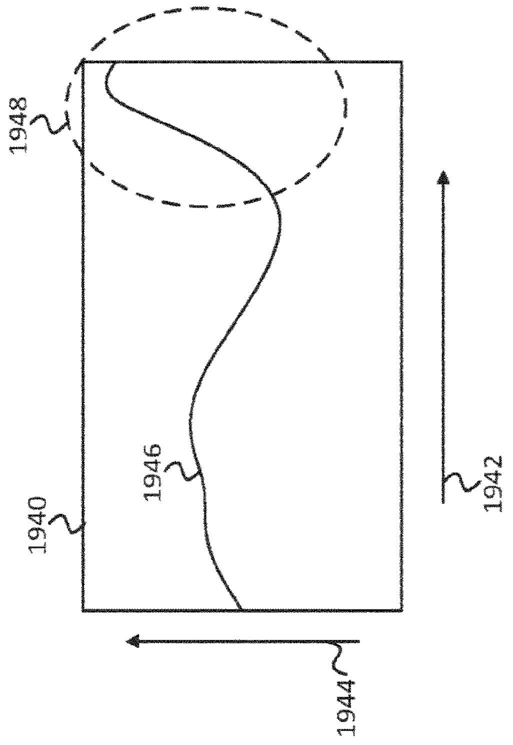

FIG. 19E depicts an example histogram 1940 depicting the number of pixels along a y-axis 1944 versus pixel value along an x-axis 1942 for the example image 1910 of FIG. 19A. A curve 1946 represents the number of pixels versus pixel value for the example image 1910. A peak identified by a dotted oval 1948 represents the white areas 1914 of the example image. The curve 1946, as it has both very low and very high pixel values representing black and white pixels, can be difficult to adjust for image quality enhancement such as image brightening.

FIG. 19F depicts an example histogram 1950 depicting the number of pixels along a y-axis 1954 versus pixel value along an x-axis 1952 for the region of interest 1930 of FIG. 19D. A curve 1956 represents the number of pixels versus pixel value for the region of interest 1930. A black box 1958 represents the pixel values which are excluded from the region of interest 1930 which were previously present in the example histogram 1940 of FIG. 19E. The black box 1958 obscured the pixel values of the pixels of the white areas 1914 of the image 1910. When those values are excluded from the histogram, the values of the remaining pixels can be adjusted such as by expansion of the range of pixel values along the direction of an arrow 1960 or along the direction of an arrow 1962. Other image quality enhancement techniques can also be applied.

Figure 20:
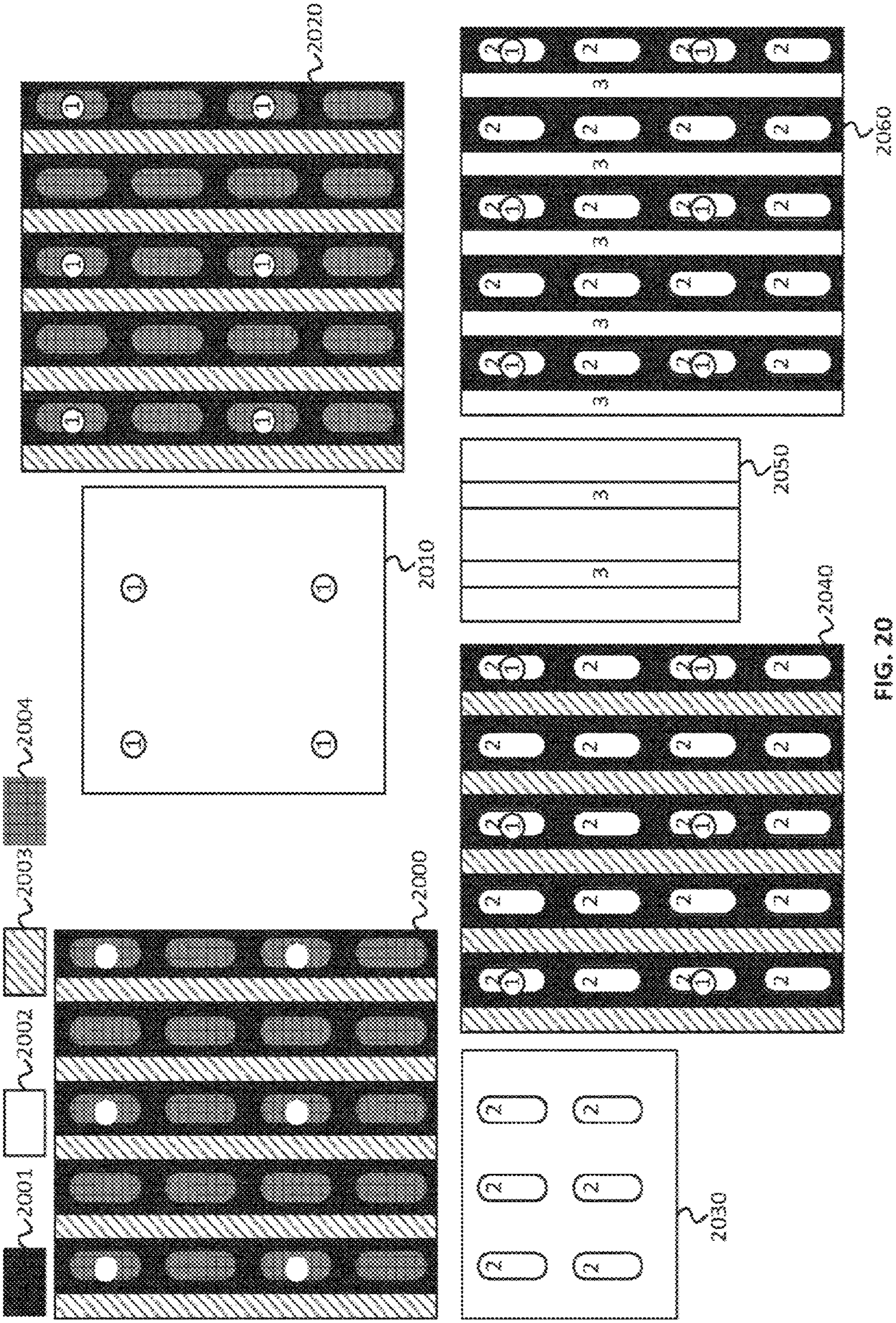
FIG. 20 depict a schematic representation of image segmentation, according to an embodiment.

FIG. 20 depict a schematic representation of image segmentation. FIG. 20 depicts an example image 2000 with false colorization, which is substantially similar to the synthetic image 1860 of FIG. 18C. The example image 2000 is presented for ease of description, where the described method of image segmentation can be applied to other images and structures. The example image 2000 also corresponds to a structure based on the example schematic 1800 of FIG. 18A. The example image 2000 contains black areas 2001 that correspond to un-patterned areas on a multi-layer structure, white areas 2002 that correspond to metal vias for the multi-layer structure, hatched areas 2003 that correspond to features of a first feature layer of the multi-layer structure, and gray areas 2004 that correspond to features of a second feature layer of the multi-layer structure. In the example image, hatched areas 2003 of the features of the first feature layer and gray areas 2004 of the features of the second feature layer are depicted with different fill for ease of description. In an obtained image, such as depicted in the obtained image 1870 of FIG. 18D, the features of the first feature layer and the features of the second feature layer could comprise substantially the same pixel value or intensity.

A first image template 2010, which corresponds to the metal vias of the white areas 2002, is matched to the example image 2000 as is shown in a first example template matching 2020. The first image template 2010 can comprise multiple templates corresponding to the features of the metal vias. The first image template 2010 can be matched to one location on the example image 2000, to multiple locations on the example image 2000, or even partially matched to a location or portion of a location on the example image 2000. The first image template 2010 can be matched to the example image 2000 by using one or more adaptive weight map. The first image template 2010, which contains regions corresponding to the first layer which are labelled with "1", can be used to segment the example image 2000. The first example template matching 2020 shows regions or segments which are identified as corresponding the first image template 2010, also labelled with "1".

A second image template 2030, which corresponds to the gray areas 2004 of the features of the second feature layer, is matched to the example image 2000 as shown in a second example template matching 2040. The second image template can comprise multiple templates corresponding to the features of the second feature layer. The second image template 2030 can be matched to one location on the example image 2000, to multiple locations on the example image 2000, or even partially matched to a location or portion of a location on the example image 2000. The second image template 2030 can instead or additionally be matched to one or more locations on the first example template matching 2020 (e.g., the second image template 2030 can be matched to the example image 2000 to which the first image template 2010 has already been matched). The second image template 2030 can be matched to the example image 2000 by using one or more adaptive weight map. The second image template 2030, which contains regions corresponding to the second layer which are labelled with "2", can be used to segment the example image 2000. The second example template matching 2040 shows regions or segments which are identified as corresponding the second image template 2030, also labelled with "2".

A third image template 2050, which corresponds to the hatched areas 2003 of the features of the first feature layer, is matched to the example image 2000 as shown in a second example template matching 2060. The third image template can comprise multiple templates corresponding to the features of the first feature layer. The third image template 2050 can be matched to one location on the example image 2000, to multiple locations on the example image 2000, or even partially matched to a location or portion of a location on the example image 2000. The third image template 2050 can instead or additionally be matched to one or more locations on the second example template matching 2040 (e.g., the third image template 2050 can be matched to the example image 2000 to which the first image template 2010 and the second image template 2030 has already been matched). The third image template 2050 can be matched to the example image 2000 by using one or more adaptive weight map. The third image template 2050, which contains regions corresponding to the third layer which are labelled with "3", can be used to segment the example image 2000. The third example template matching 2060 shows regions or segments which are identified as corresponding the third image template 2050, also labelled with "3".

The image can be segmented based on the matched image templates. In some cases, the segmentation can substantially correspond to the configuration of the features of the templates. In other cases, the segmentation can include regions outside of the individual elements of the one or more templates, or exclude regions inside of the individual elements of the one or more templates. For example, the second example template matching 2040 can exclude from the second segmentation regions which are inside of the features of the second image template 2030 and also inside of the features of the first image template 2010. In another example, the segmentation corresponding to the third image template 2050 can include a border region outside of the features of the third image template 2050.

Figure 21A:
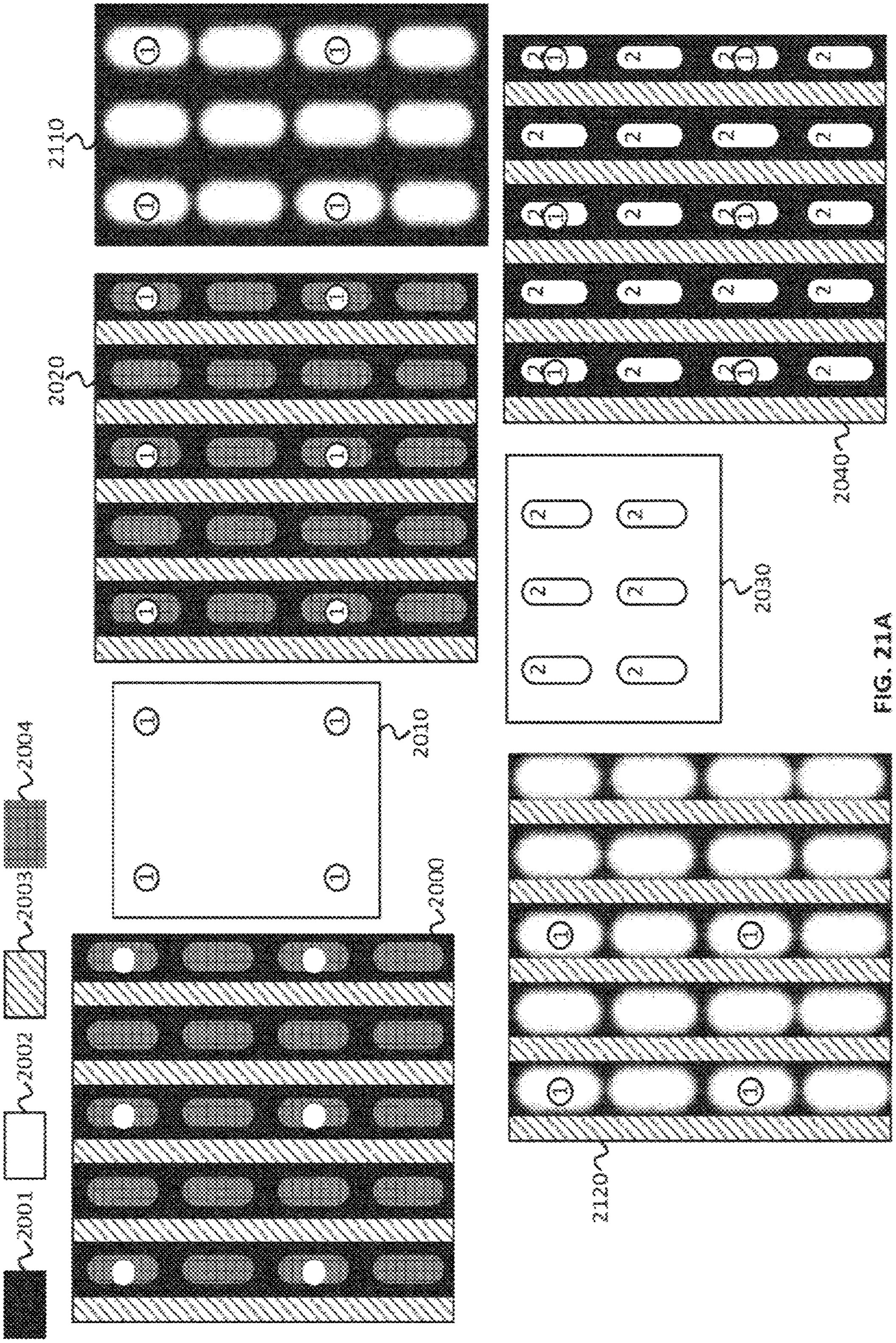
FIGS. 21A-21B depict a schematic representation of template alignment based on previous template alignment, according to an embodiment.
Figure 21B:
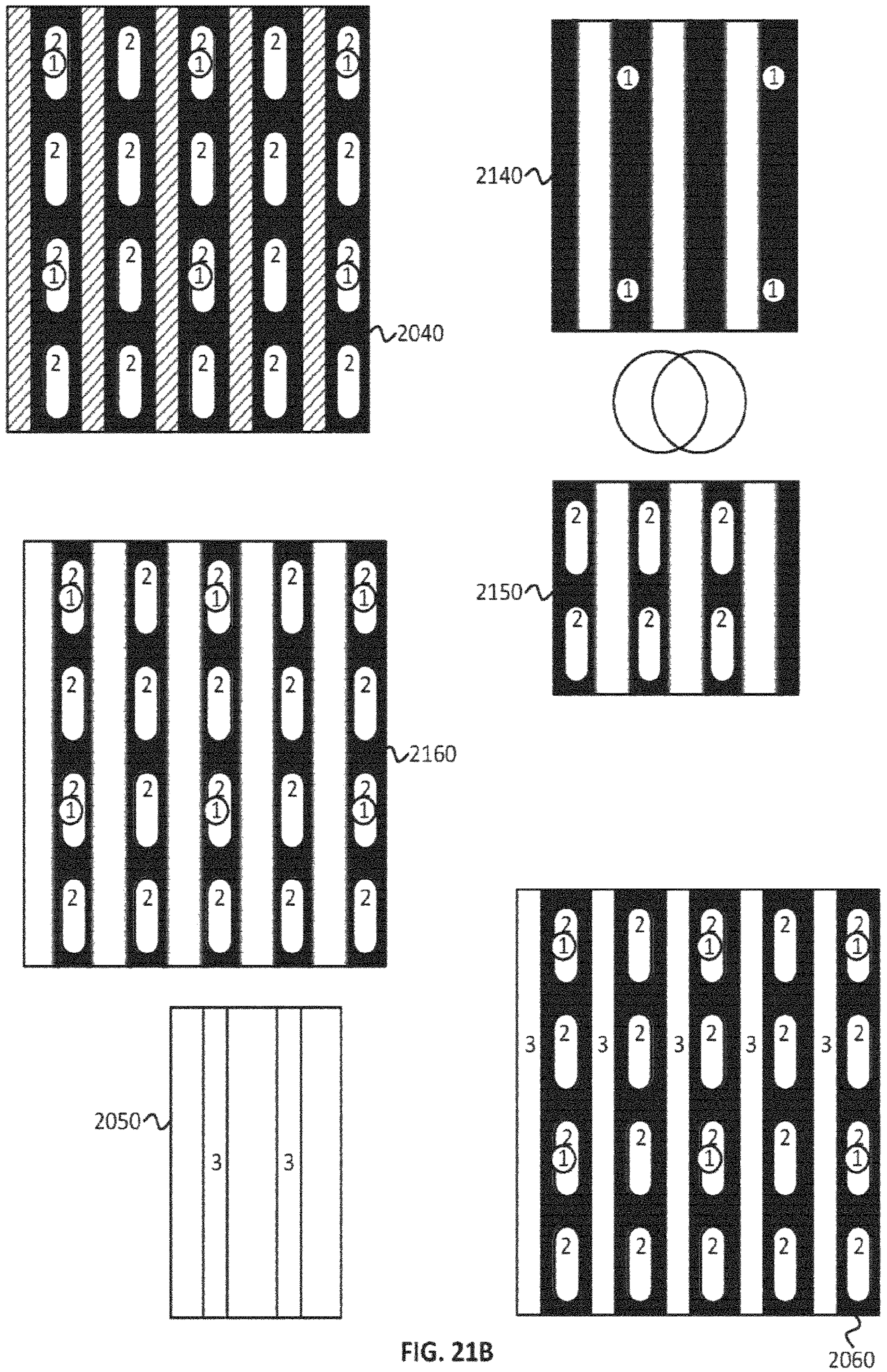

FIGS. 21A-21B depict a schematic representation of template alignment based on previous template alignment. FIG. 21A depicts the example image 2000 with false colorization of FIG. 20. The example image 2000 is used again for ease of description, but the described method can be applied to images of any multi-layer structure. The example image 2000 contains black areas 2001 that correspond to un-patterned areas on a multi-layer structure, white areas 2002 that correspond to metal vias for the multi-layer structure, hatched areas 2003 that correspond to features of a first feature layer of the multi-layer structure, and gray areas 2004 that correspond to features of a second feature layer of the multi-layer structure. In the example image, hatched areas 2003 of the features of the first feature layer and gray areas 2004 of the features of the second feature layer are depicted with different fill for ease of description. In an obtained image, such as depicted in the obtained image 1870 of FIG. 18D, the features of the first feature layer and the features of the second feature layer could comprise substantially the same pixel value or intensity.

A first image template 2010, which corresponds to the metal vias of the white areas 2002, is matched to the example image 2000 as is shown in a first example template matching 2020 using any appropriate method, including those described in reference to FIG. 20. The first example template matching 2020 shows regions or segments which are identified as corresponding the first image template 2010, also labelled with "1".

Based on the alignment of the first image template 2010 to the example image 2000, potential regions for features of the second image template 2030 (which correspond to features of the second feature layer) are located. A potential weight map 2110 is shown, which depicts areas of probability for locations of the features of the second feature layer with respect to the features of the first image template. The potential weight map 2110 is black for regions with low probability of a feature of the second feature layer being located and white for regions with high probability of a feature of the second feature layer being located. The potential weight map 2110 is applied to the example image 2000 based on the location of the first image template 2010 to generate a second layer probability map 2120. The second layer probability map 2120, which contains information about where the features of the second layer are likely to be located, can be used to select a first position for the second image template 2030 to be matched to the example image 2000 or can be used to exclude potential positions of the second image template 2030 with respect to the example image 2000 from template matching or searching. In some embodiments, the second layer probability map 2120 can be used to guide the matching of the second image template 2030 to the example image 2000. The second layer probability map 2120 can further be used with a weight map in template matching.

The second image template 2030, which corresponds to the gray areas 2004 of the features of the second feature layer, is then matched to the example image 2000 as shown in a second example template matching 2040. The template matching can occur using any appropriate method, including those described in reference to FIG. 20. The second example template matching 2040 shows regions or segments which are identified as corresponding the second image template 2030, also labelled with "2".

Depiction of the schematic representation of template alignment based on previous template alignment continues in FIG. 21B. Based on the alignment of the first image template 2010 to the example image 2000, potential regions for features of the third image template 2050 (which correspond to features of the first feature layer) can be located. A potential weight map 2140 is shown, which depicts areas of probability of locations of the features of the first feature layer based on locations of the features of the metal layer. Additionally or instead, based on the alignment of the second image template 2030 to the example image 2000, potential regions for features of the third image template 2050 (which correspond to features of the first feature layer) are located. A potential weight map 2150 is shown, which depicts areas of probability for locations of the features of the first feature layer with respect to the features of the second image template. The potential weight maps 2140, 2150 are black for regions with low probability of a feature of the first feature layer being located and white for regions with high probability of a feature of the first feature layer being located. The either of the potential weight maps 2140, 2150 or both can be applied to the example image 2000 to generate a third layer probability map 2160. An intersection, union, etc. of the potential weight maps 2140, 2150 can also be used. The third layer probability map 2160, which contains information about where the features of the first feature layer are likely to be located, can be used to select a first position for the third image template 2050 to be matched to the example image 2000 or can be used to exclude potential positions of the third image template 2050 with respect to the example image 2000 from template matching or searching. In some embodiments, the third layer probability map 2160 can be used to guide the matching of the third image template 2050 to the example image 2000. The third layer probability map 2160 can further be used with a weight map in template matching.

A third image template 2050, which corresponds to the hatched areas 2003 of the features of the first feature layer, is matched to the example image 2000 as shown in a second example template matching 2060, using any appropriate method including those previously described in reference to FIG. 20. The third image template can comprise multiple templates corresponding to the features of the first feature layer. The third example template matching 2060 shows regions or segments which are identified as corresponding the third image template 2050, also labelled with "3".

Figure 22:
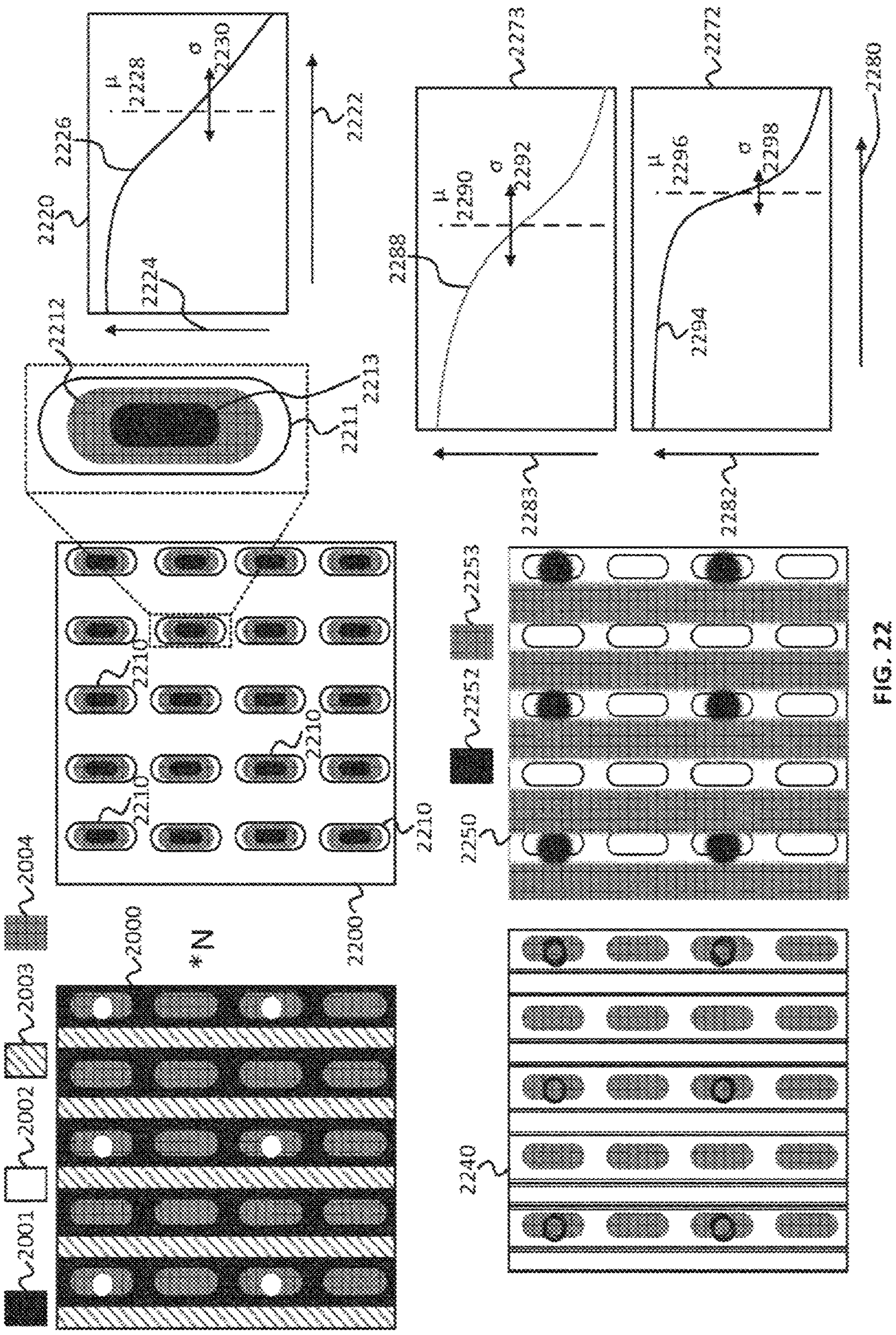
FIG. 22 depicts a schematic representation of image-to-image comparison, according to an embodiment.

FIG. 22 depicts a schematic representation of image-to-image comparison using per layer template matching. FIG. 22 depicts the example image 2000 with false colorization of FIG. 20. The example image 2000 is used again for ease of description, but the described method can be applied to images of any multi-layer structure. The example image 2000 contains black areas 2001 that correspond to unpatterned areas on a multi-layer structure, white areas 2002 that correspond to metal vias for the multi-layer structure, hatched areas 2003 that correspond to features of a first feature layer of the multi-layer structure, and gray areas 2004 that correspond to features of a second feature layer of the multi-layer structure. In the example image, hatched areas 2003 of the features of the first feature layer and gray areas 2004 of the features of the second feature layer are depicted with different fill for ease of description. In an obtained image, such as depicted in the obtained image 1870 of FIG. 18D, the features of the first feature layer and the features of the second feature layer could comprise substantially the same pixel value or intensity.

An image-to-image comparison can be formed from multiple images. Image-to-image comparisons can be used to evaluate process control, lithography masks, process stochasticity, etc. A number of images, such as example image 2000, can be aligned based on template matching to produce an image-to-image alignment which is aligned by layer. For example, N images of the multi-layer structure of the example image 2000 can be overlayed based on template matching. A layer of the multi-layer structure can be selected. A template which corresponds to the selected layer can then be matched to each of the images. The multiple images can then be overlayed based on the position of the matched templates, which are matched to information corresponding to a single layer. Image alignment based on a single layer can inherently remove alignment errors caused by nonuniformities in non-selected layers, including overlay error among any two layers. The use of adaptive weight maps, which can improve matching of a template to an image, can also improve image-to-image alignment by accounting for blocking and blocked structures and down weighting portions of the image which do not correspond to the selected layer.

An image-to-image alignment 2200 for the selected layer can be created based on the multiple images matched to the template of the selected layer. As an example, a template of the second feature layer is used to generate the image-to-image alignment 2200. For simplicity, the image-to-image alignment shows only features 2210 of the selected layers. The image-to-image alignment 2200 can further comprise information about the probability of occurrence, mean, dispersion, stochasticity, etc. of the features 2210 of the selected layer. In the example, an average intensity or occurrence probability of the features 2210 is shown, where a white area 2211 represents a low probability for the feature 2210 to be present, a gray area 2212 represents a medium probability for the feature 2210 to be present, and a black area 2213 represents a high probability of the feature to be present. After a template (for a layer or feature) is matched to an image, pixels of that image can be marked as corresponding to features of the template or marked as not corresponding to features of the template. For example, a pixel within an area of the features of the template can be marked as an occurrence (e.g., marked as a value of "1" on an occurrence scale or layer) while a pixel not within the area of the features of the template can be marked as not an occurrence (e.g., marked as a value of "0" on the occurrence scale or layer). By summing the occurrence values of multiple images after image-to-image alignment, a probability map of occurrence can be generated. Occurrence probability can be used where for multiple images even if the images or areas imaged are unstable (e.g., in brightness, thickness, etc.) or experience process variation. For stable images with well controlled image and process parameters, average intensity can be used instead of or in addition to occurrence probability. In some cases, occurrence probability can be compared to average intensity or used with average intensity, including in order to determine image and process stability.

The average intensity or occurrence probability can be used to measure the stochasticity of the feature and to control lithographic and other processes. The intensity or occurrence probability of the feature 2210 is plotted along a y-axis 2224 as a function of distance from the center of the feature 2210 along an x-axis 2222 in the graph 2220. The curve 2226 represents the average shape profile for the feature 2210 and can be used to calculate a mean feature size 2228, a standard deviation of feature size 2230, etc. Distribution of size of the feature 2210 can be used to determine stochastic limits on feature size control and to detect process drift, process limitations, etc.

Based on the image-to-image alignment for a selected layer (such as the image-to-image alignment 2200), a further image-to-image alignment can be determined for features of layers other than the selected layer. Once the images are aligned based on the template matching for the selected layer, the other non-selected layers can also be located by template matching, including using one or more weight map. Based on the matched templates for the non-selected layers, the features of the non-selected layers can be overlaid to determine an average position, intensity, occurrence probability, etc. A second image-to-image alignment 2240 is depicted for which features of the non-selected layer are shown. As the images are not aligned based on the template matching for the non-selected layers, the second image-to-image alignment also contains information about relative shift between the selected layer and the non-selected layers. The second image-to-image alignment can also comprise information about the means, dispersion, stochasticity, of the features on the non-selected layers. An intensity map 2250 depicts average intensities for non-selected features of the second image-to-image alignment 2240. Black areas 2252 correspond to metal vias of the multi-layer structure, while gray areas 2253 correspond to features of the first feature layer of the multi-layer structure. Intensity of the fill represents average intensity or occurrence probability of the features. The average intensity or occurrence probability can be used to measure the stochasticity of the feature and to control lithographic and other processes. The intensity or occurrence probability of the feature of the black areas 2252 is plotted along a y-axis 2282 as a function of distance from the center of the feature of the first feature layer along an x-axis 2280 in the graph 2272. The curve 2294 represents the average shape profile for the feature of the first feature layer and can be used to calculate a mean feature size 2296, a standard deviation of feature size 2298, etc. Distribution of size of the feature of the first feature layer can be used to determine stochastic limits on feature size control and to detect process drift, process limitations, etc. for the first feature layer. The intensity or occurrence probability of the feature of the gray area 2253 is plotted along a y-axis 2283 as a function of distance from the center of the feature of the metal via along an x-axis 2280 in the graph 2273. The curve 2288 represents the average shape profile for the feature of the metal via and can be used to calculate a mean feature size 2290, a standard deviation of feature size 2292, etc. Distribution of size of the feature of the first feature layer can be used to determine stochastic limits on feature size control and to detect process drift, process limitations, etc. for the first feature layer.

Figure 23:
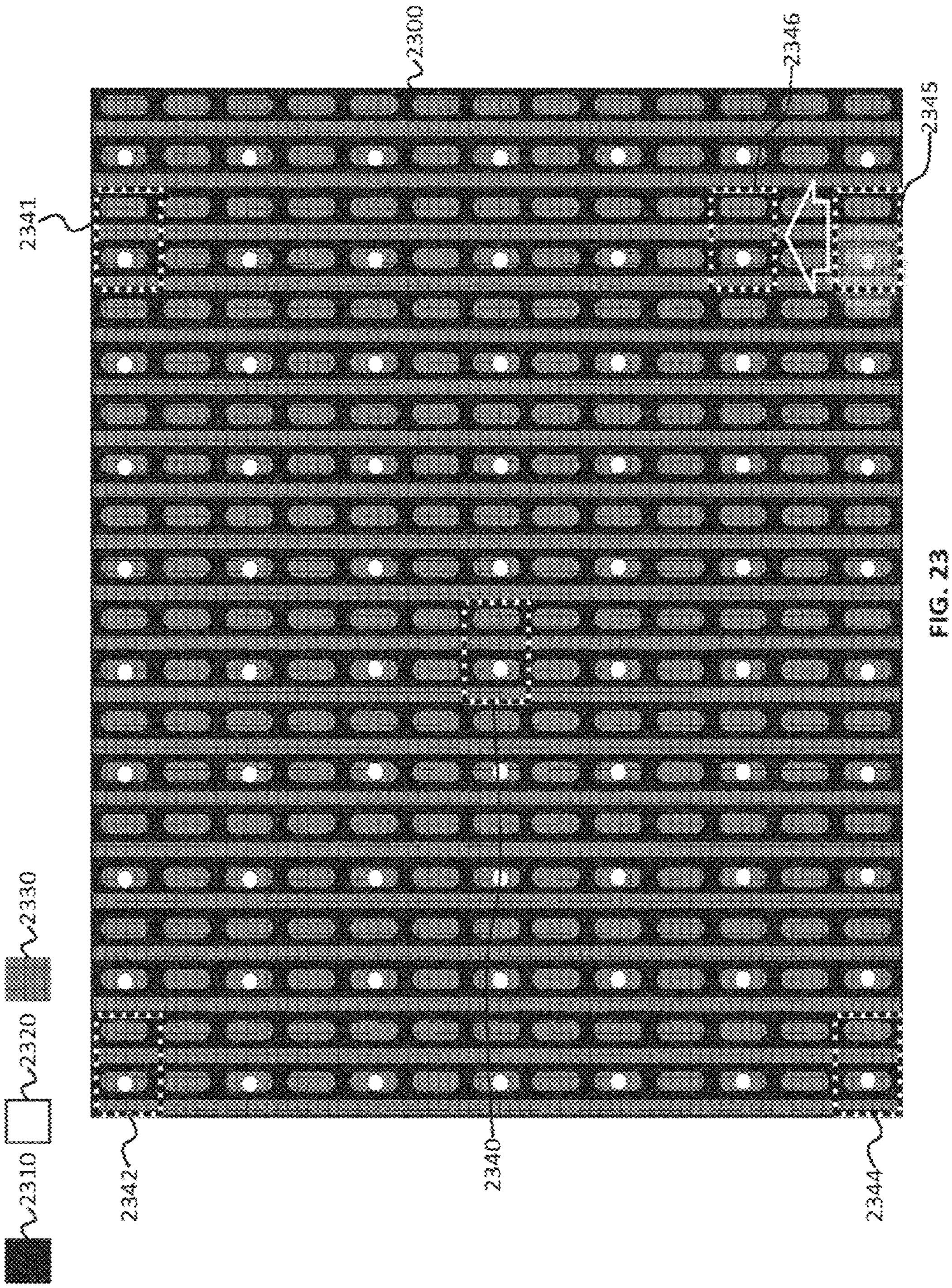
FIG. 23 depicts a schematic representation of template matching based on unit cells, according to an embodiment.

FIG. 23 depicts a schematic representation of template matching based on unit cells. FIG. 23 depicts an obtained image 2300 for a periodic multi-layer structure. For ease of description, the periodic multi-layer structure of the obtained image 2300 can be considered as a repeating pattern of the obtained image 1870 of FIG. 18D. The obtained image 2300 shows black areas 2310 corresponding to un-patterned areas of the structure, white areas 2320 corresponding to metal vias of the structure, and gray areas 2330 corresponding to other features of patterned areas of the structure. The gray areas 2330 can represent features from multiple feature layers. Template matching can be performed on the obtained image 2300. Template matching can be performed based on a composite template which is comprised of multiple templates. For example, template matching can be performed for any of the layers of the multi-layer structure based on templates corresponding to the features and layers of the areas 2341-2345. For example, templates 1880, 1884, and 1888 of FIGS. 18E-18G can be used to locate features of the corresponding layers at each of the areas 2341-2345. The templates used need not be of the same size or contain the same number of features for each of the layers. Further, the composite template can comprise information about the relative positions of each of the templates. For example, for a periodic structure, the composite template can comprise information about repeat dimensions and expected variations in repeat size. For template matching, a first template can be matched to a first location, such as the area 2341, and then additional templates which comprise the composite template can be matched to additional areas, such as the areas 2342-2345, which are located based on repeat size. For example, the area 2341 can be located based on moving four pattern repeats to the right of the area 2340 and moving three pattern repeats up from the area 2340. The areas 2340-2345 can be disperse across the obtained image 2300. For example, a central area can be chosen (such as the area 2340) and areas closer to the edges of the obtained image 2300 can be chosen (such as the areas 2341-2345). In some embodiments, areas can be chosen based on a set number of repeats, but if a chosen area is insufficiently clear for template matching or contains any other type of defect (such as is shown for the area 2345), then another area can be chosen to comprise the composite template. For example, an area 2346 which is adjacent to the area 2345 can be chosen instead of the area 2345. The composite template need not be symmetrical. Using multiple templates which comprise a composite template can improve template matching accuracy while reducing computational need which would be present if the template comprised many or substantially all features of an image.

Figure 24:
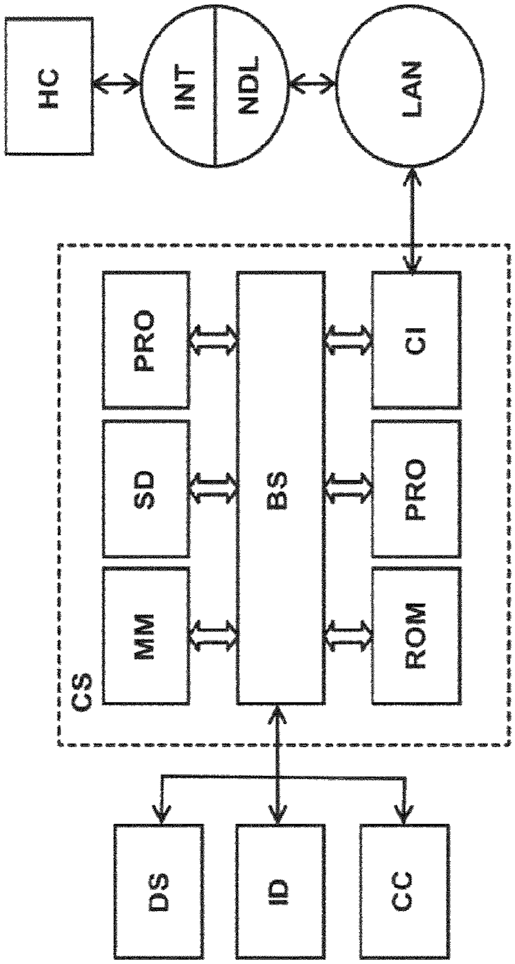
FIG. 24 is a block diagram of an example computer system, according to an embodiment of the present disclosure.

FIG. 24 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random-access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term “computer-readable medium” and/or “machine readable medium” as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic, or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the “Internet” INT. Local network LAN (Internet) may use electrical, electromagnetic, or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

As described above at least with reference to FIGS. 7-11, template matching may be used in determining an overlay between features of different layers. For example, a first location of a feature in a first layer of the image and a second location of a second feature in a second layer of the image are determined using the template matching. An overlay (e.g., overlay 740) between the first feature and the second feature may be measured based on a first offset associated with the first feature (e.g., offset 720—a shift in the determined location of the first feature from a reference location of the first feature) and a second offset associated with the second feature (e.g., offset 730—a shift in the determined location of the second feature from a reference location of the second feature).

In conventional template matching, fixed size templates may be used. There may be some drawbacks associated with using fixed size templates. In some embodiments, due to the CD variation (e.g., global CD variation (die to die) and local CD variation (within a die)) resulting from the patterning process, template matching results (e.g., locations of features) may be biased depending on the difference between the template size and the real size of the feature. The difference in the measured location vs. the actual location of the feature may be translated to the overlay measurement error. For example, a smaller size template (e.g., template size lesser than the actual size of the feature) may result in an overestimated overlay, and a larger size template (e.g., template size greater than the actual size of the feature) may result in an underestimated overlay. These and other drawbacks exist.

Disclosed are embodiments for selecting an optimal size template to minimize an error in determining a parameter of interest (e.g., overlay) using template matching. In some embodiments, templates of varying sizes are generated for a feature in an image (e.g., a feature of a via layer in a SEM image). Template matching may be performed for each of the template sizes, and a performance indicator associated with the template matching for the corresponding template size is determined. A specific template size may then be selected based on the performance indicator values. The selected template size may be used in template matching to determine a position of the feature in the image, which may further be used in various applications, including determining a measure of overlay with other features. In some embodiments, the performance indicator may include a similarity indicator (e.g., described above) that is indicative of a similarity between the feature in the image and the template. For example, the similarity indicator may include a normalized square difference between the template and the image. By dynamically selecting a template size for template matching, the difference between the measured location and the actual location of the feature is minimized, which minimizes any error in determining the position of the feature in an image using template matching, thereby improving the accuracy in determination of a parameter of interest (e.g., overlay).

The following paragraphs describe selecting a template of a specific size for template matching at least with reference to FIGS. 25A-25C and FIG. 26.

Figure 25A:
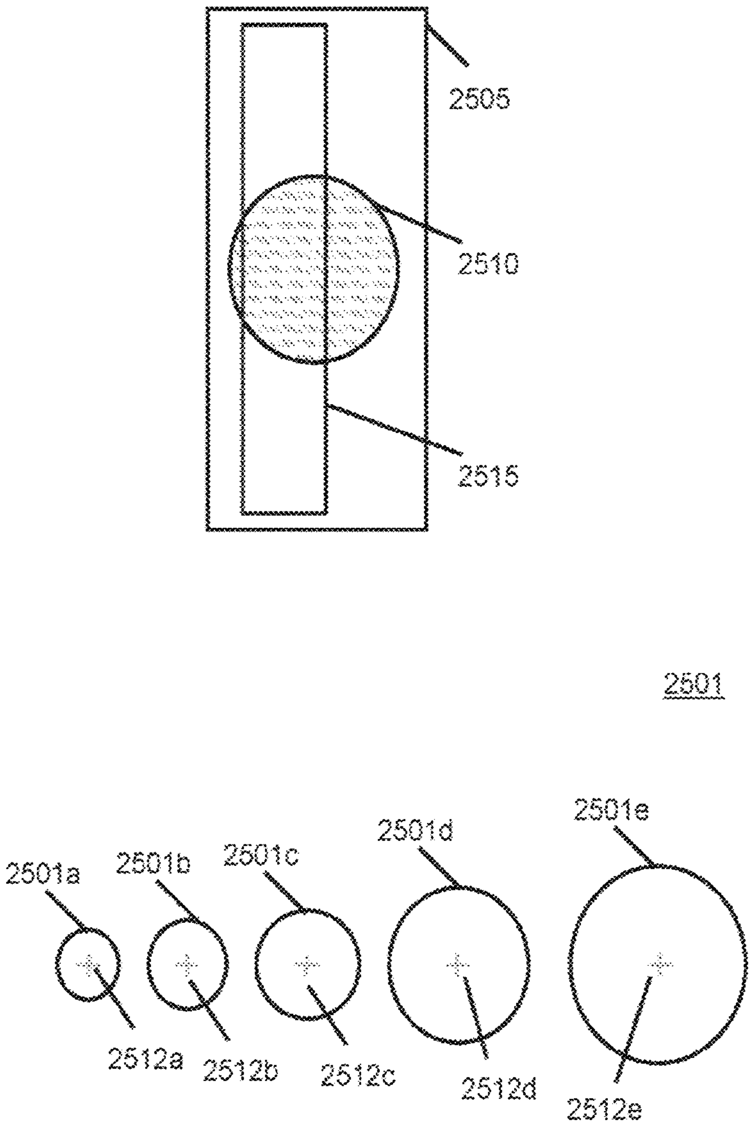
FIGS. 25A and 25B show block diagrams for selecting a template size from a library of template sizes for template matching, consistent with various embodiments.
Figure 25B:
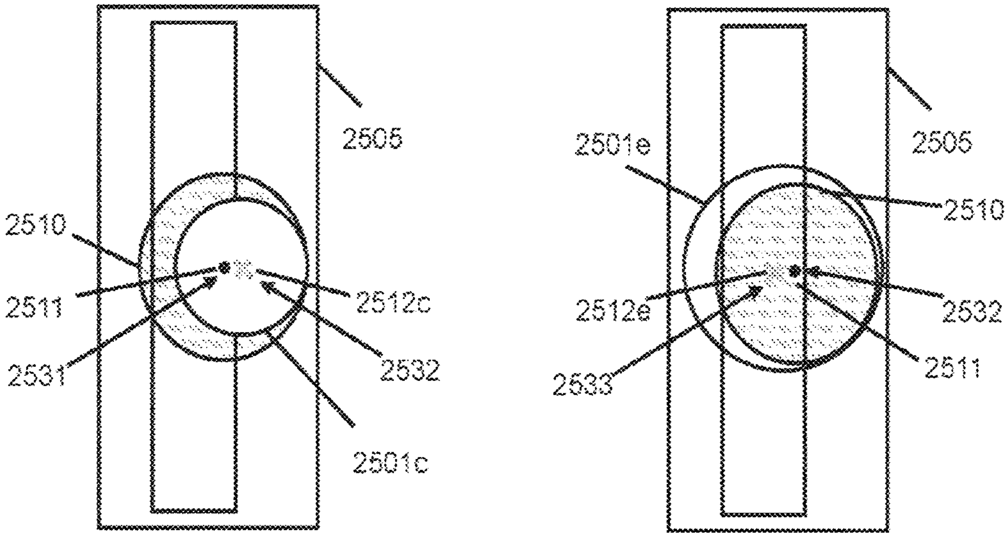
Figure 25C:
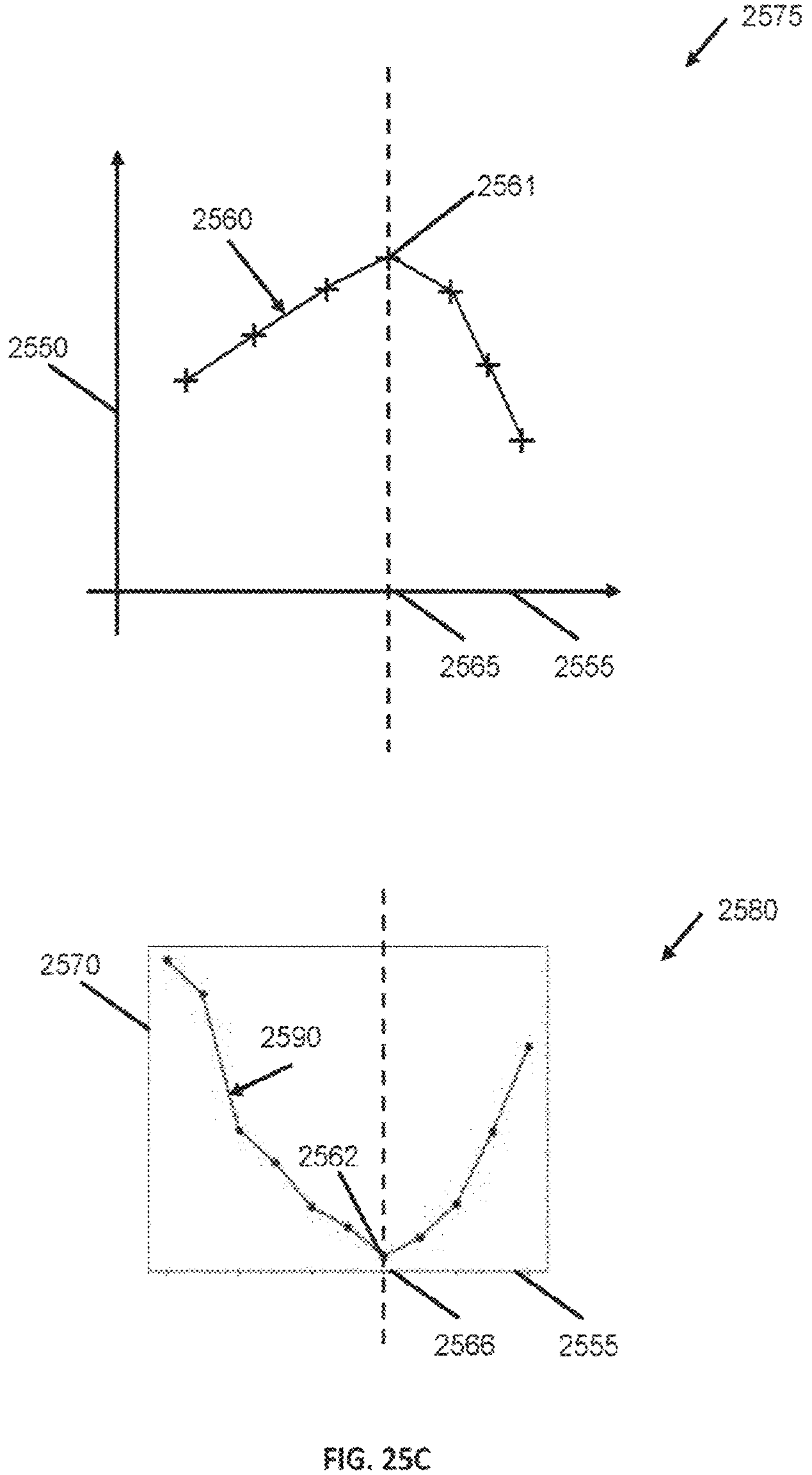
FIG. 25C shows graphs of performance indicator values for various template sizes in template matching, consistent with various embodiments.
Figure 26:
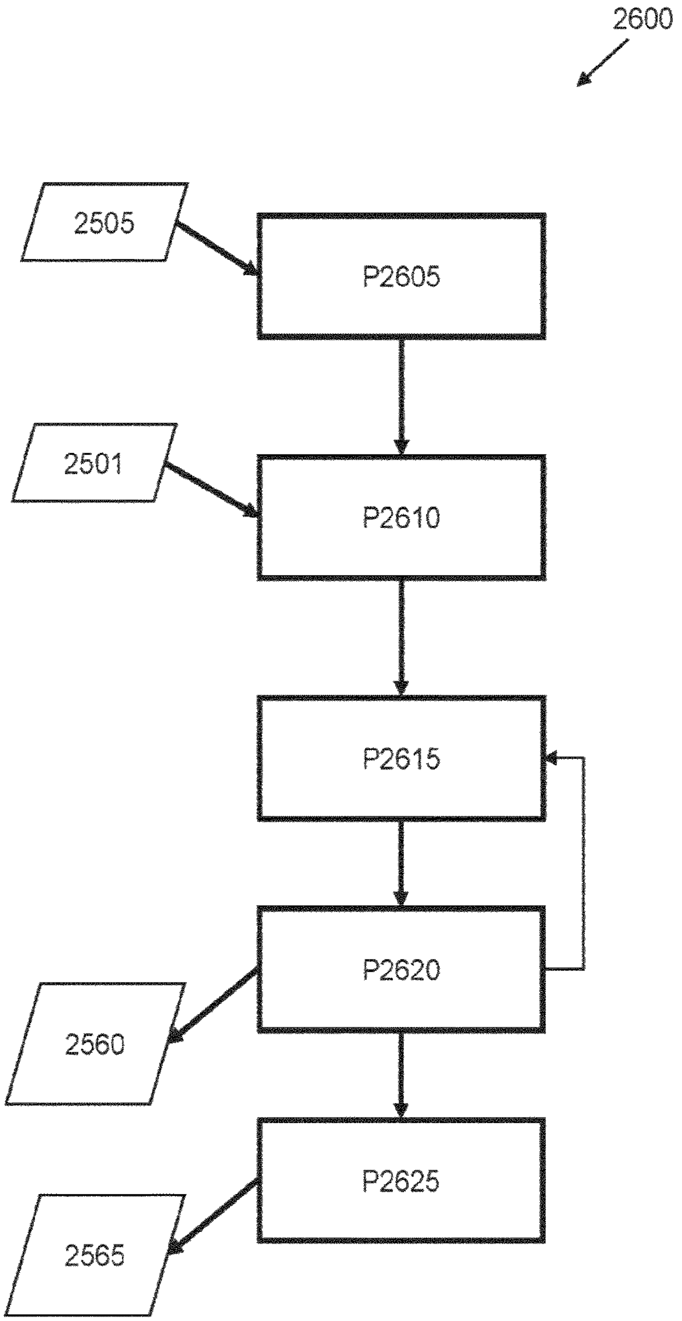
FIG. 26 is a flow diagram of a method for selecting a template size from a library of template sizes for template matching, consistent with various embodiments.

FIGS. 25A and 25B show block diagrams for selecting a template size from a library of template sizes for template matching, consistent with various embodiments. FIG. 25C shows graphs of performance indicator values for various template sizes, consistent with various embodiments. FIG. 26 is a flow diagram of a method 2600 for selecting a template size from a library of template sizes for template matching, consistent with various embodiments.

At process P2605, an image 2505 is obtained. The image 2505 may include information regarding features of a pattern. The image 2505 can be a test image and can be acquired via optical or other electromagnetic imaging or though SEM, or can be obtained from other software or data storage. The image 2505 includes features such as a first feature 2510 and a second feature 2515. As described above, the features may be from the same layer or different layers of multiple process layers of fabrication. For example, the first feature 2510 may be on a first layer and the second feature 2515 may be on a second layer. In some embodiments, the first feature 2510 may be a feature on a via layer.

At process P2610, a library of templates 2501 having templates of varying sizes corresponding to a feature is obtained. For example, templates 2501*a*-2501*e* of varying sizes corresponding to the first feature 2510 are obtained. In some embodiments, if the first feature 2510 is of a shape of circle, then the templates 2501*a*-2501*e* may be of different radii. The templates 2501*a*-2501*e* may be generated using any of a number of methods described above. In some embodiments, a template may be associated with a "hot spot" or a reference point 2512, which may be used in determining an offset relative to other templates, patterns, or features of the image (e.g., using template matching as described above at least with reference to FIGS. 7-11 above). The reference point 2512 may be determined in any number of ways. In some embodiments, the reference point 2512 may be located at a user-defined position in the template. In some embodiments, the reference point 2512 may be a centroid of a shape of the template 2501. For example, if the first template 2501*a* is generated for the first feature 2510, which is of a shape of a circle, then the reference point 2512*a* of the first template 2501*a* is the centroid of the circle, that is, a center of the circle. Similarly, the other templates 2501*b*-2501*e* may also be associated with reference points 2512*b*-2512*e*, respectively. In some embodiments, the reference point of the features in the image 2505 may also be determined in a similar way. Note that neither the shape of the feature is limited to a circle, nor the reference location is limited to a centroid of the shape.

In some embodiments, a template size has a bearing on the accuracy of the determination of a position of a feature in the image 2505. For example, when the template size used in determining the position of the first feature 2510 in the image 2505 is lesser than the size of the first feature 2510 (e.g., template 2501*c*), the template matching may determine a reference point 2511 of the first feature 2510 being located at a measured location 2532, when in fact the reference point 2511 is located at an actual location 2531 in the image 2505. The measured location 2532 may be determined based on the location of the reference point 2512*c* in the template 2501*c*. The difference between the measured location 2532 and the actual location 2531 may result in an overestimated overlay measurement. Similarly, when the template size used in determining the position of the first feature 2510 in the image 2505 is greater than the size of the first feature 2510 (e.g., template 2501*e*), the template matching may determine the reference point 2511 of the first feature 2510 as being located at a measured location 2533, when in fact the reference point 2511 is located at the actual location 2531 in the image 2505. The measured location 2533 may be determined based on the location of the reference point 2512*e* in the template 2501*e*. The difference between the measured location 2533 and the actual location 2531 may result in an underestimated overlay measurement. In some embodiments, the method 2600 may determine a template size such that the difference between the measured location and the actual location of the feature (e.g., the difference between the measured location and the actual location of the reference point associated with feature) is zero, or minimized. Such a template size may minimize any error in determining the position of the feature in an image using template matching, thereby improving the accuracy in determination of a parameter of interest (e.g., overlay).

At process P2615, a template of a particular size from the library of templates 2501 is selected and compared with an image using template matching to determine a position of a feature in the image. For example, template matching may be performed to determine a position of the first feature 2510 in the image 2505 using a first template 2501*a* from the library of templates 2501. In some embodiments, the template matching method described above at least with reference to FIGS. 7-11 may be used. The template matching may determine a position of the first feature 2510 in the image 2505 and a similarity indicator that is indicative of a degree of match between the first template 2501*a* and the first feature 2510.

At process P2620, a value of a performance indicator associated with the template matching is determined. The performance indicator may be any attribute that is indicative or descriptive of a degree of match between the feature in the image and the template. In some embodiments, the performance indicator may include a similarity indicator (e.g., described above) that is indicative of a similarity between the feature in the image and the template. For example, the similarity indicator may be a normalized square difference between the template and the image.

The processes P2615 and P2620 may be repeated for all or a number of template sizes in the library of templates 2501 and the performance indicator values 2560 may be obtained for various template sizes. The graph 2575 in FIG. 25C illustrates values 2560 of an example performance indicator (represented by y-axis 2550) for various template sizes (represented by x-axis 2555). The graph 2580 illustrates values 2590 of a performance indicator, such as a similarity indicator, (represented by y-axis 2570) for various template sizes (represented by x-axis 2555).

At process P2625, a template size is selected based on the performance indicator satisfying a specified criterion. In some embodiments, the specified criterion may indicate that a template size associated with the highest performance indicator value may be selected. For example, as shown in the graph 2575, the performance indicator value 2561 may be determined as the highest value among the values 2560, and therefore, a template size 2565 associated with the performance indicator value 2561 is selected. In some embodiments, the specified criterion may indicate that a template size associated with the lowest performance indicator value may be selected. For example, as shown in the graph 2580, the similarity indicator value 2562 may be determined as the lowest value among the values 2590, and therefore, a template size 2566 associated with the similarity indicator value 2562 is selected.

After the template size is selected, the selected template size may be used in template matching for determining various parameters of interest. For example, a parameter of interest may include one or more of a CD, a CD uniformity, a measure of overlay, a measure of overlay uniformity, a measure of overlay error, a measure of stochasticity, a measure of EPE, a measure of EPE uniformity, a measure of EPE stochasticity, or a defect measurement.

Further embodiments according to the invention are described in below numbered clauses:

1. A method comprising: accessing an image comprising information from multiple process layers; accessing an image template for the multiple process layers; accessing a weight map for the image template; and matching the image template to a position on the image based, at least in part, on the weight map.
2. The method of clause 1, wherein the image template comprises an image template for a first layer of the multiple process layers.
3. The method of clause 1, wherein matching the image template further comprises: comparing the image template to multiple positions on the image, wherein the comparing comprises adapting the weight map for a given position and comparing the image template to the given position based, at least in part, on the adapted weight map for the given position; and matching the image template to a position based on the comparisons.
4. The method of clause 3, wherein adapting the weight map for a given position further comprises: updating the weight map for the given position based on at least one of pixel values of the image, a blocking structure on the image, a previously identified structure located on the image, a location of the image template, a relative position of the image template with respect to the image, or a combination thereof.
5. The method of clause 3, wherein adapting the weight map comprises adapting the weight map based on a relative position between the image template and the image.
6. The method of clause 3, further comprising: accessing a weight map for the image template; and accessing a weight map for the image, wherein adapting the weight map for a given position comprises adapting the weight map for the given position based on a multiplication of the weight map for the image template and the weight map for the image.
7. The method of clause 3, wherein adapting the weight map comprises changing a value of the weight map based on the image at the given position.
8. The method of clause 3, wherein the weight map is based on a shape of the image template.
9. The method of clause 3, wherein comparing the image template to multiple positions further comprises: determining a similarity indicator for the image template at the multiple positions on the image, wherein the similarity indicator is determined based, at least in part, on the adapted weight map for the given position; and matching the image template to the position on the image based at least in part on the similarity indicators of the multiple positions.
10. The method of clause 9, wherein determining the similarity indicator comprises: for a given position of the image template on the image, determining a measure of matching between pixel values of the image template and pixel values of the image, wherein the measure of matching for a given pixel is based, at least in part, on a value of the adapted weight map at the given pixel; and determining the similarity indicator based, at least in part, on a sum of the measure of matching for pixels encompassed by the image template.
11. The method of clause 9, wherein the similarity indicator is at least one of a normalized cross-correlation, a cross-correlation, a normalized correlation coefficient, a correlation coefficient, a normalized difference, a difference, a normalized sum of a difference, a sum of a difference, a correlation, a normalized correlation, a normalized square of a difference, a square of a difference, or a combination thereof.
12. The method of clause 9, wherein the similarity indicator is user defined.
13. The method of clause 9, wherein the similarity indicator varies for different regions of the image template or image.
14. The method of clause 1, further comprising determining a measure of offset based at least in part on a relationship between a given point on the image and an additional point on the image template, where the image template is matched to a position on the image.
15. The method of clause 14, wherein the measure of offset is an overlay value.
16. The method of clause 14, wherein the measure of offset is a shift from reference position and wherein the given point on the image and the additional point on the image template have an expected separation.
17. The method of clause 1, further comprising matching a second occurrence of the image template to a position on the image based, at least in part, on the weight map, wherein the weight map is adapted independently for the matching of the image template and the matching of the second occurrence of the image template.
18. The method of clause 1, further comprising: accessing an additional image template; accessing an additional weight map for the additional image template; and matching the additional image template to an additional position on the image based, at least in part, on the additional weight map.
19. The method of clause 18, wherein the additional image template is substantially similar to the image template.

20. The method of clause 18, wherein the additional image template and the image template are different.
21. The method of clause 18, wherein the image template and the additional image template comprise image templates for a first layer of the multiple process layers.
22. The method of clause 18, wherein the image template comprises an image template for a first layer of the multiple process layers and wherein the additional image template comprises an image template for a second layer of the multiple process layers.
23. The method of clause 18, wherein matching the additional image template further comprises: comparing the additional image template to multiple positions on the image, wherein the comparing comprises adapting the additional weight map for a given position and comparing the additional image template to the given position based, at least in part, on the adapted additional weight map for the given position; and matching the additional image template to a position based on the comparisons.
24. The method of clause 18, further comprising determining a measure of offset based at least in part on a relationship between a given point on the image template, where the image template is matched to a position on the image, and an additional point on the additional image template, where the additional image template is matched to an additional position on the image.
25. The method of clause 18, further comprising determining multiple measures of offset between multiple image templates matched to positions on the image, wherein the multiple image templates are matched based, at least in part, on their corresponding weight map.
26. The method of clause 1, wherein the image comprises at least a blocked area and an unblocked area, and wherein the weight map is weighted less in the blocked area than in the unblocked area.
27. The method of clause 26, wherein the image further comprises at least a partially blocked area, wherein the weight map is weighted less in the partially blocked area than in the unblocked area and wherein the weight map is weighted less in the blocked area than in the partially blocked area.
28. The method of clause 1, wherein matching the image template further comprises matching at least one of a scale of a first dimension of the image template, a scale of a second dimension of the image template, an angle of rotation of the image template, or a combination thereof to the image based, at least in part, on the weight map.
29. The method of clause 28, wherein matching the image template further comprises: updating the weight map based on at least one of the scale of the first dimension of the image template, the scale of the second dimension of the image template, the angle of rotation of the image template, or a combination thereof; and matching the image template to a position on the image based, at least in part, on the updated weight map.
30. The method of clause 1, wherein matching the image template further comprises matching a polarity of the image template to the image.
31. The method of clause 30, wherein matching the image template further comprises: updating the weight map based on the polarity of the image template; and matching the image template to a position on the image based, at least in part, on the updated weight map.
32. The method of clause 1, wherein accessing a weight map comprises determining the weight map for an image of a measurement structure based at least in part on pixel values of the image of the measurement structure.
33. The method of clause 1, further comprising: accessing an image weight map for the image, wherein matching the image template comprises matching the image template based, at least in part, on a multiplication of the image weight map and the weight map for the image template.
34. The method of clause 1, wherein the image comprises multiple pixels with pixel values, wherein the image template comprises multiple pixels with pixel values, which may be the same or different than the multiple pixels of the image, and wherein the weight map comprises weight values corresponding to pixels of either the image or the image template.
35. The method of clause 34, wherein the weight values of the weight map are defined based on pixel location.
36. The method of clause 34, wherein weight values of the weight map are defined based on a distance from a feature in the image template.
37. The method of clause 34, wherein weights in the weight map are user defined.
38. A method comprising: accessing an image comprising information from multiple process layers; accessing a composed template for the multiple process layers; accessing a weight map for the composed template, wherein the weight map comprises at least a first area of lower relative priority; and matching the composed template to a position on the image based, at least in part, on the weight map.
39. The method of clause 38, wherein the composed template comprises a composed template for a first layer of the multiple process layers.
40. The method of clause 38, wherein matching the composed template further comprises: comparing the composed template to multiple positions on the image; and matching the composed template to a position based on the comparisons.
41. The method of clause 38, wherein matching the composed template further comprises: comparing the composed template to multiple positions on the image, wherein the comparing comprises adapting the weight map for a given position and comparing the composed template to the given position based, at least in part, on the adapted weight map for the given position; and matching the composed template to a position based on the comparisons.
42. The method of clause 38, further comprising determining a measure of offset based at least in part on a relationship between a given point on the image and an additional point on the composed template, wherein the composed template is matched to a position on the image.
43. The method of clause 42, wherein the additional point on the composed template corresponds to at least the first area of lower relative priority.
44. The method of clause 38, further comprising instruction to: accessing an additional composed template; accessing an additional weight map for the additional composed template, wherein the additional weight map comprises at least a first area of lower relative priority; and matching the additional composed template to an additional position on the image based, at least in part, on the additional weight map, wherein the composed template comprises at least two image templates and a spatial relationship between the at least two image templates.

45. The method of clause 44, further comprising determining a measure of offset based at least in part on a relationship between a given point on the composed template, wherein the composed template is matched to a position on the image, and an additional point on the additional composed template, wherein the additional composed template is matched to an additional position on the image.

46. A method comprising: generating an image template for a multi-layer structure based, at least in part, on a synthetic image of the multi-layer structure; and matching the image template to a position on a test image of the multi-layer structure.

47. The method of clause 46, wherein generating the image template further comprises: selecting a first artifact of the synthetic image; and generating the image template based at least in part on the first artifact.

48. The method of clause 47, wherein the first artifact corresponds to a physical feature of the multi-layer structure.

49. The method of clause 48, wherein the first artifact corresponds to a physical feature of a first layer of the multi-layer structure.

50. The method of clause 47, wherein the first artifact corresponds to metrology tool-induced artifact.

51. The method of clause 47, wherein the image template is generated based on multiple synthetic images of the first artifact.

52. The method of clause 51, wherein at least one synthetic image is obtained from a scanning electron microscopy model.

53. The method of clause 51, wherein at least one synthetic image is obtained from a lithographic model.

54. The method of clause 51, wherein at least one synthetic image is obtained from an etch model.

55. The method of clause 51, wherein at least one synthetic image is generated from a GDS shape.

56. The method of clause 47, wherein selecting the first artifact of the synthetic image further comprises selecting the first artifact based on at least one of artifact size, artifact contrast, artifact process stability, artifact intensity log slope or a combination thereof.

57. The method of clause 46, wherein the image template is a contour.

58. The method of clause 46, wherein generating the image template further comprises generating a weight map for the image template and wherein matching the image template to a position on the test image of the multi-layer structure further comprises matching the image template to the position on the test image of the multi-layer structure based, at least in part, on the weight map.

59. The method of clause 58, generating the weight map further generating the weight map based on at least one of artifact size, artifact contrast, artifact process stability, artifact intensity log slope or a combination thereof.

60. The method of clause 46, wherein generating the image template further comprises generating a pixel value for the image template and wherein matching the image template to a position on the test image of the multi-layer structure further comprises matching the image template to the position on the test image of the multi-layer structure based, at least in part, on the pixel value.

61. The method of clause 46, further comprising: generating at least a second image template for the multi-layer structure based, at least in part, on a synthetic image of the multi-layer structure; and matching at least the second image template to a position on the test image of the multi-layer structure.

62. The method of clause 61, wherein the second image template corresponds to same layer of the multi-layer structure as the image template.

63. The method of clause 61, wherein the second image template corresponds to a different layer of the multi-layer structure than the image template.

64. The method of clause 61, further comprising determining a measure of offset based at least in part on a location on the image template matched to the test image of the multi-layer structure and a second location on the second image template matched to the test image of the multi-layer structure.

65. The method of clause 64, wherein the measure of offset is an overlay value.

66. The method of clause 61, further comprising determining a measure of edge placement error based, at least in part, on a location on the image template matched to the test image of the multi-layer structure and a second location on the second image template matched to the test image of the multi-layer structure.

67. A method comprising: selecting at least two artifacts of an image of a multi-layer structure; determining a first spatial relationship between the at least two artifacts of the image of the multi-layer structure; generating an image template based at least in part on the at least two artifacts and the first spatial relationship; and matching the image template to a position on a test image of the multi-layer structure.

68. The method of clause 67, wherein selecting the at least two artifacts comprises selecting the at least two artifacts based on at least one of artifact size, artifact contrast, artifact process stability, artifact intensity log slope or a combination thereof.

69. The method of clause 67, wherein selecting the at least two artifacts comprises selecting the at least two artifacts by using a grouping algorithm.

70. The method of clause 67, wherein selecting the at least two artifacts comprises selecting the at least two artifacts based on a lithography model.

71. The method of clause 67, wherein selecting the at least two artifacts comprises selecting the at least two artifacts based on a process model.

72. The method of clause 67, wherein selecting the at least two artifacts comprises selecting the at least two artifacts based on a scanning electron microscopy simulation model.

73. The method of clause 72, selecting the at least two artifacts based on a scanning electron microscopy simulation model comprises selecting the at least two artifacts based on artifact contrast.

74. The method of clause 67, wherein generating the image template further comprises generating one or more synthetic image based on a model of the at least two artifacts and generating the image template based on the one or more synthetic image.

75. The method of clause 67, wherein generating the image template further comprises refining the image template based on scanning electron microscopy images.

76. The method of clause 67, wherein the image template is spatially discontinuous.

77. The method of clause 67, wherein the image template is a composed template.
78. The method of clause 67, wherein the image template further comprises a weight map and wherein the weight map comprises a first emphasized area and a first deemphasized area, wherein the first emphasized area is weighted more than the first deemphasized area, and wherein matching the image template to a position on the test image of the multi-layer structure comprises matching the image template to the position based, at least in part, on the weight map.
79. The method of clause 78, wherein matching the image template to the position based, at least in part, on the weight map, comprises: comparing the image template to multiple positions on the test image of the multi-layer structure, wherein the comparing comprises adapting the weight map for a given position and comparing the image template to the given position based, at least in part, on the adapted weight map for the given position; and matching the image template to a position based on the comparisons.
80. The method of clause 78, wherein the at least two artifacts correspond to emphasized areas.
81. The method of clause 67, further comprising determining a measure of offset based at least in part a relationship between a first location on the test image of the multi-layer structure and second location on the image template matched to the position on the test image of the multi-layer structure.
82. The method of clause 67, further comprising: selecting at least two additional artifacts of an image of a multi-layer structure; determining an at least additional spatial relationship between the at least two additional artifacts of the image of the multi-layer structure; generating an additional image template based at least in part on the at least two additional artifacts and the at least additional spatial relationship; and matching the additional image template to an additional position on a test image of the multi-layer structure.
83. The method of clause 82, further comprising determining a measure of offset based at least in part a relationship between a first location on the image template matched to the position on the test image of the multi-layer structure and an additional location on the additional image template matched to the additional position on the test image of the multi-layer structure.
84. The method of clause 83, wherein the measure of offset is an overlay value.
85. A method comprising: accessing an image comprising information from multiple process layers; accessing a template for a first layer of the multiple process layers; and determining a position of a feature of the first layer on the image based on template matching of the template to the image, wherein the template matching is based on a weight map which indicates blocking of the first layer by layers of the multiple process layers other than the first layer.
86. The method of clause 85, wherein the first layer is a buried layer of the multiple process layers.
87. The method of clause 86, comprising: accessing at least one additional image comprising information from substantially similar multiple process layers; and aligning the image and the at least one additional image based on the position of the feature of the first layer.
88. The method of clause 87, wherein the aligning of the image and the at least one additional image comprises: determining a position of a substantially similar feature of the first layer on the at least one additional image based on template matching of the template to the at least one additional image; and aligning the image and the at least one additional image based on the position of the feature of the first layer on the image and the position of the substantially similar feature of the first layer on the at least one additional image.
89. The method of clause 87, comprising: generating an image-to-image alignment based on the image, the at least one additional image, and the aligning of the image and the at least one additional image; and determining a parameter of interest for the multiple process layers based on the image-to-image alignment.
90. The method of clause 89, wherein the parameter of interest comprises a critical dimension, a critical dimension uniformity, a measure of overlay, a measure of overlay uniformity, a measure of overlay error, a measure of stochasticity, a measure of edge placement error, a measure of edge placement error uniformity, a measure of edge placement error stochasticity, a defect measurement, or a combination thereof.
91. The method of clause 87, wherein the aligning of the image and the at least one additional image comprises matching a rotation, contrast, size, scale, or a combination thereof of the image and the at least one additional image.
92. The method of clause 85, comprising: accessing a pattern design comprising information corresponding to the first layer; and aligning the image and the pattern design based on the position of the feature of the first layer.
93. The method of clause 92, wherein the aligning of the image and the pattern design comprises: determining a position of a substantially similar feature of the first layer on the pattern design; and aligning the image and the pattern design based on the position of the feature of the first layer on the image and the position of the substantially similar feature of the first layer on the pattern design.
94. The method of clause 92, wherein the pattern design is based on a GDS design corresponding to the feature.
95. The method of clause 85, comprising: accessing a second template for a second layer of the multiple process layers; and determining a second position of a second feature of the second layer on the image based on template matching of the second template to the image, wherein the template matching is based on a weight map which indicates blocking of the second layer by layers of the multiple process layers other than the second layer.
96. The method of clause 95, comprising: determining a measure of overlay based on the position of the feature of the first layer on the image and the second position of the second feature of the second layer on the image.
97. The method of clause 85, wherein the image is at least one of a measured SEM image, a simulated SEM image, or a combination thereof.
98. The method of clause 85, wherein the template is generated based on multiple images of the feature of the first layer.
99. The method of clause 85, wherein the template is based at least one of a process model, an imaging model, or a combination thereof.
100. The method of clause 85, wherein the template is a synthetic template generated based on at least one GDS design from at least one of the multiple process layers.

101. The method of clause 85, wherein the template for the first layer comprises multiple templates for the first layer and wherein determining a position of the feature on the first layer further comprises determining positions of multiple features on the image based on template matching of the multiple templates to the image.

102. The method of clause 101, wherein the multiple templates are separated by known distances and wherein determining the positions of the multiple features comprises determining the positions of the multiple features separated by approximately the known distances.

103. The method of clause 102, wherein the multiple templates correspond to unit cells of at least one of the multiple process layers and wherein the known distances are multiples of pitches of at least one of the multiple process layers.

104. The method of clause 101, wherein the multiple templates are substantially similar and wherein the multiple features are substantially similar.

105. The method of clause 101, wherein the multiple templates are different and wherein the multiple features are substantially similar or different or a combination thereof.

106. The method of clause 85, wherein the weight map is an adaptive weight map.

107. The method of clause 106, wherein the weight map is adapted based on pixel values of the image.

108. The method of clause 85, further comprising: segmenting the image based on the position of the template on the image.

109. The method of clause 108, further comprising: accessing a second template for a second layer of the multiple process layers; determining a second position of a second feature of the second layer on the image based on template matching of the second template to the image; and segmenting the image based on the position of the feature of the first layer of the image and the second position of the second feature of the second layer of the image.

110. The method of clause 85, further comprising: locating a region of interest of the image based on the position of the template on the image; and selecting the region of interest from the image.

111. The method of clause 110, further comprising performing image quality enhancement for the region of interest of the image.

112. The method of clause 111, wherein image quality enhancement comprises at least one of contrast adjustment, image denoising, image smoothing, gray level adjustment, or a combination thereof.

113. The method of clause 110, further comprising performing at least one of edge detection, edge extraction, contour detection, contour extraction, shape fitting, segmentation, template matching, or a combination thereof based on the region of interest of the image.

114. The method of clause 110, wherein locating the region of interest comprises locating multiple regions of interest based on the position of the template on the image and wherein selecting the region of interest comprises selecting multiple regions of interest.

115. The method of clause 110, wherein the selecting of the region of interest from the image comprises masking regions of the image not within the region of interest.

116. The method of clause 110, wherein the region of interest at least partially includes the feature of the first layer.

117. The method of clause 110, wherein the region of interest at least partially excludes the feature of the first layer.

118. A method comprising: accessing multiple images comprising information from one or more instance of multiple process layers; accessing a template for a first layer of the multiple process layers; determining positions of a feature of the first layer on the multiple images based on template matching of the template for the first layer to the multiple images; and comparing the multiple images based on the positions of the feature on the multiple images.

119. The method of clause 118, further comprising evaluating at least one of a manufacturing process, a modeling process, or a metrology process based on the comparing.

120. The method of clause 119, wherein the evaluating comprises determining a mean, a measure of dispersion, or both for an evaluation parameter, wherein the evaluation parameter comprises at least one of a critical dimension, a critical dimension mean, a critical dimension uniformity, a contour shape, a contour band, a contour mean, a contour dispersion, a measure of feature uniformity, a measure of stochasticity, or a combination thereof.

121. The method of clause 118, further comprising identifying a non-ideality in at least one of the multiple images based on the comparing of the multiple images, wherein the non-ideality comprises a defect, an overlay offset, a critical dimension deviation, a contour deviation, an edge placement error, an intensity deviation, or a combination thereof.

122. A method comprising: accessing an image comprising information from multiple process layers; accessing a template for a first layer of the multiple process layers; determining a position of a feature of the first layer on the image based on template matching of the template to the image, wherein the template matching is based on a weight map which indicates blocking of the first layer by layers of the multiple process layers other than the first layer; and identifying a region of the image corresponding to the first layer, a region of the image not corresponding to the first layer, or both based on the position of the feature of the first layer.

123. The method of clause 122, comprising: accessing a second template for a second layer of the multiple process layers; determining a second position of a second feature of the second layer on the image based on template matching of the template to the image, wherein the template matching is based on a weight map which indicates blocking of the second layer by layers of the multiple process layers other than the second layer; and identifying at least a second region of the image corresponding to the second layer, a region of the image not corresponding to the second layer, a region of the image not corresponding to the first layer or the second layer, a region of the image corresponding to the first layer and the second layer, or a combination thereof based on the position of the feature of the first layer and the second position of the second feature of the second layer.

124. The method of clause 123, wherein the determining of the second position of the second feature comprises: determining a preliminary position of the second feature of the second layer on the image based on the position of the feature of the first layer on the image and a spatial relationship between the feature and the second feature; and identifying the second position of the second feature of the second layer on the image based on the preliminary position and template matching.

125. The method of clause 122, comprising performing image quality enhancement of either the region of the image corresponding to the first layer or the region of the image not corresponding to the first layer.

126. The method of clause 1, wherein matching the image template includes: accessing a plurality of image templates having varying sizes, and selecting one of the plurality of image templates that is associated with a performance indicator satisfying a specified criterion as the image template.

127. The method of clause 126 further comprising: comparing the image template with the image in a template matching method to determine a position of a feature in the image.

128. The method of clause 127, wherein the feature is on a first layer of the multiple process layers.

129. The method of clause 126, wherein selecting one of the image templates includes:

for each of the plurality of image templates, comparing the image template with the image in a template matching method to determine a position of a feature in the image, and determining a value of the performance indicator associated with the comparison.

130. The method of clause 129 further comprising: selecting one of the image templates that is associated with the performance indicator having a value that satisfies the specified criterion as the image template.

131. The method of clause 126, wherein the performance indicator includes a similarity indicator that is a measure of matching between pixel values of the image template and pixel values of the image.

132. The method of clause 85, wherein accessing the template includes: accessing a plurality of templates having varying sizes, and selecting one of the plurality of templates that is associated with a performance indicator satisfying a specified criterion as the template.

133. The method of clause 132, wherein selecting one of the templates includes: for each of the plurality of templates, comparing the template with the image in the template matching method to determine the position of the feature, and determining a value of the performance indicator associated with the comparison.

134. The method of clause 133 further comprising: selecting one of the templates that is associated with the performance indicator having a value that satisfies the specified criterion as the template.

135. The method of clause 132, wherein the performance indicator includes a similarity indicator that is a measure of matching between pixel values of the template and pixel values of the image.

136. A method of template matching comprising: accessing a plurality of templates corresponding to a feature having varying sizes; accessing an image comprising the feature; and selecting one of the plurality of templates that is associated with a performance indicator satisfying a specified criterion as a template for determining a position of a feature in the image using a template matching method.

137. The method of clause 136, wherein selecting one of the templates includes: for each of the plurality of templates, comparing the template with the image in the template matching method to determine the position of the feature, and determining a value of the performance indicator associated with the comparison.

138. The method of clause 137 further comprising: selecting one of the templates that is associated with the performance indicator having a value that satisfies the specified criterion as the template.

139. The method of clause 136, wherein the performance indicator includes a similarity indicator that is a measure of matching between pixel values of the template and pixel values of the image.

140. The method of clause 136, wherein the image includes information from multiple process layers, and wherein the feature is on a first layer of the multiple process layers.

141. The method of clause 140, wherein the template matching method is based on a weight map which indicates blocking of the first layer by layers of the multiple process layers other than the first layer.

142. The method of clause 141, wherein the weight map is an adaptive weight map.

143. The method of clause 142, wherein the weight map is adapted based on pixel values of the image.

144. The method of clause 140 further comprising: accessing a second template for a second layer of the multiple process layers; and determining a second position of a second feature of the second layer on the image using the second template based on the template matching method, wherein the template matching method is based on a weight map which indicates blocking of the second layer by layers of the multiple process layers other than the second layer.

145. The method of clause 144 further comprising: determining a measure of overlay based on the position of the feature of the first layer on the image and the second position of the second feature of the second layer on the image.

146. The method of clause 136, wherein the image is at least one of a measured SEM image, a simulated SEM image, or a combination thereof.

147. The method of clause 136, wherein the template is generated based on multiple images of the feature of the first layer.

148. The method of clause 136, wherein the template is based on at least one of a process model, an imaging model, or a combination thereof.

149. The method of clause 136, wherein the template is a synthetic template generated based on at least one GDS design from at least one of multiple process layers.

150. One or more non-transitory, machine readable medium having instructions thereon, the instructions when executed by a processor being configured to perform the method of any of clauses 1 to 149.

151. A system comprising: a processor; and one or more non-transitory, machine-readable medium having instructions thereon, the instructions when executed by the processor being configured to perform the method of any of clauses 1 to 149.

While the concepts disclosed herein may be used for manufacturing with a substrate such as a silicon wafer, it shall be understood that the disclosed concepts may be used with any type of manufacturing system (e.g., those used for manufacturing on substrates other than silicon wafers).

In addition, the combination and sub-combinations of disclosed elements may comprise separate embodiments. For example, one or more of the operations described above may be included in separate embodiments, or they may be included together in the same embodiment.

The descriptions above are intended to be illustrative, not limiting. Thus, it will be apparent to one skilled in the art that modifications may be made as described without departing from the scope of the claims set out below.

The invention claimed is:

1. A method comprising:

accessing an image comprising information from multiple process layers of a semiconductor substrate;

accessing an image template for the multiple process layers;

accessing a weight map for the image template, the weight map being adaptable to provide different weight for different relative positions between the image and image template; and comparing, by a hardware computer, the image and the image template by matching the image template to a position on the image based, at least in part, on the weight map according to a template matching process.

2. The method of claim 1, wherein the image template comprises an image template for a first layer of the multiple process layers, and wherein matching the image template further comprises:

comparing the image template with the image at multiple positions, wherein the comparing comprises adapting the weight map for a given position and comparing the image template to the given position based, at least in part, on the adapted weight map for the given position; and matching the image template to a position based on the comparisons.

3. The method of claim 1, wherein the comparing comprises adapting the weight map by updating the weight map for a given position based on at least one selected from: pixel values of the image, a blocking structure on the image, a previously identified structure located on the image, a location of the image template, and/or a relative position of the image template with respect to the image.

4. The method of claim 1, further comprising determining a measure of offset based at least in part on a relationship between a given point on the image and an additional point on the image template, where the image template is matched to a position on the image, wherein the measure of offset indicates an overlay value or a shift from reference position and wherein the given point on the image and the additional point on the image template have an expected separation.

5. The method of claim 1, further comprising determining multiple measures of offset between multiple image templates matched to positions on the image, wherein the multiple image templates are matched based, at least in part, on respective weight maps thereof.

6. Non-transitory, machine readable media having instructions therein, the instructions, when executed by one or more processors, configured to cause the one or more processors to at least:

access an image comprising information from multiple process layers;

access an image template for the multiple process layers;

access a weight map for the image template, the weight map being adaptable to provide different weight for different relative positions between the image and image template; and compare the image and the image template by matching the image template to a position on the image based, at least in part, on the weight map according to a template matching process.

7. The media of claim 6, wherein the image template comprises an image template for a first layer of the multiple process layers, and wherein the instructions configured to cause the one or more processors to match the image template are further configured to cause the one or more processors to:

compare the image template with the image at multiple positions, wherein the comparison comprises adaptation of the weight map for a given position and comparison of the image template to the given position based, at least in part, on the adapted weight map for the given position; and match the image template to a position based on the comparisons.

8. The media of claim 6, wherein the instructions configured to cause the one or more processors to compare the image and the image template are further configured to cause the one or more processors to adapt the weight map by updating of the weight map for a given position based on at least one selected from: pixel values of the image, a blocking structure on the image, a previously identified structure located on the image, a location of the image template, and/or a relative position of the image template with respect to the image.

9. The media of claim 8, wherein the instructions are further configured to cause the one or more processors to:

access the weight map for the image template; and access a weight map for the image, wherein adaptation of the weight map for the given position is based on a multiplication of the weight map for the image template and the weight map for the image.

10. The media of claim 8, wherein the instructions configured to cause the one or more processors to compare the image template to multiple positions are further configured to cause the one or more processors to:

determine a similarity indicator for the image template at the multiple positions on the image, wherein the similarity indicator is determined based, at least in part, on the adapted weight map for the given position; and match the image template to the position on the image based at least in part on the similarity indicators of the multiple positions.

11. The media of claim 6, wherein the instructions are further configured to cause the one or more processors to determine a measure of offset based at least in part on a relationship between a given point on the image and an additional point on the image template, where the image template is matched to a position on the image, wherein the measure of offset indicates an overlay value or a shift from a reference position and wherein the given point on the image and the additional point on the image template have an expected separation.

12. The media of claim 6, wherein the instructions are further configured to cause the one or more processors to determine multiple measures of offset between multiple image templates matched to positions on the image, wherein the multiple image templates are matched based, at least in part, on respective weight maps thereof.

13. The media of claim 6, wherein the image comprises at least a blocked area and an unblocked area, and wherein the weight map indicates lower weight in the blocked area than in the unblocked area.

14. The media of claim 13, wherein the image further comprises at least a partially blocked area, wherein the weight map is weighted less in the partially blocked area than in the unblocked area and wherein the weight map is weighted less in the blocked area than in the partially blocked area.

15. The media of claim 6, wherein the instructions configured to cause the one or more processors to match the image template are further configured to cause the one or more processors to match at least one selected from: a scale of a first dimension of the image template, a scale of a second dimension of the image template, and/or an angle of rotation of the image template, to the image based, at least in part, on the weight map.

16. The media of claim 15, wherein the instructions configured to cause the one or more processors to match the image template are further configured to cause the one or more processors to:

update the weight map based on at least one selected from: the scale of the first dimension of the image template, the scale of the second dimension of the image template, and/or the angle of rotation of the image template; and match the image template to a position on the image based, at least in part, on the updated weight map.

17. The media of claim 6, wherein the instructions configured to cause the one or more processors to match the image template are further configured to cause the one or more processors to:

update the weight map based on a polarity of the image template; and match the image template to a position on the image based, at least in part, on the updated weight map.

18. The media of claim 6, wherein the instructions are further configured to cause the one or more processors to determine the weight map for an image of a measurement structure based at least in part on pixel values of the image of the measurement structure.

19. The media of claim 6, wherein the instructions are further configured to cause the one or more processors to access an image weight map for the image, and wherein the instructions configured to cause the one or more processors to match the image template are further configured to cause the one or more processors to match the image template based, at least in part, on a multiplication of the image weight map and the weight map for the image template.

20. The media of claim 6, wherein:

the image comprises multiple pixels with pixel values, the image template comprises multiple pixels with pixel values that are the same or different than the multiple pixels of the image, the weight map comprises weight values corresponding to pixels of either the image or the image template, and the weight values of the weight map are defined based on pixel location, or a distance from a feature in the image template.

21. Non-transitory, machine readable media having instructions therein, the instructions, when executed by one or more processors, configured to cause the one or more processors to at least:

access an image comprising information from multiple process layers;

access an image template for the multiple process layers;

access a weight map for the image template; and compare the image and the image template by matching the image template to a position on the image based, at least in part, on the weight map according to a template matching process, wherein the matching of the image and the image template are done by matching of at least one selected from: a scale of a first dimension of the image template, a scale of a second dimension of the image template, and/or an angle of rotation of the image template, to the image based, at least in part, on the weight map.

* * * * *